United States Patent [19]

Mori et al.

[11] Patent Number: 5,638,064
[45] Date of Patent: Jun. 10, 1997

[54] DIGITAL MODULATING/DEMODULATING METHOD AND APPARATUS USING SAME

[75] Inventors: Takaro Mori, Chigasaki; Kazunari Matsui; Takumi Hayashiyama, both of Yokosuka, all of Japan

[73] Assignee: Victor Company of Japan, Ltd., Yokohama, Japan

[21] Appl. No.: 500,274

[22] Filed: Jul. 10, 1995

[30] Foreign Application Priority Data

| Jul. 8, 1994 | [JP] | Japan | 6-180825 |
| Nov. 17, 1994 | [JP] | Japan | 6-308317 |
| Mar. 31, 1995 | [JP] | Japan | 7-100012 |

[51] Int. Cl.$^6$ ............................................. H03M 7/00
[52] U.S. Cl. ............................ 341/58; 34/69; 360/41
[58] Field of Search ........................ 341/58, 59, 68, 341/69, 70, 71, 72, 73, 74, 95, 106; 360/40, 41

[56] References Cited

U.S. PATENT DOCUMENTS 4,323,931  4/1982  Jacoby .

FOREIGN PATENT DOCUMENTS

| 0322782 | 7/1989 | European Pat. Off. . |
| 0347934 | 12/1989 | European Pat. Off. . |
| 0535560A2 | 4/1993 | European Pat. Off. . |
| 0555832A2 | 8/1993 | European Pat. Off. . |
| 58-220213 | 12/1983 | Japan . |
| 58-220214 | 12/1983 | Japan . |
| 58-220215 | 12/1983 | Japan . |
| 61-841245 | 4/1986 | Japan . |
| 127510 | 5/1989 | Japan . |
| 519332 | 3/1993 | Japan . |
| 568031 | 9/1993 | Japan . |
| 6197024 | 7/1994 | Japan . |
| 2083322 | 3/1982 | United Kingdom . |

Primary Examiner—Howard L. Williams
Attorney, Agent, or Firm—Lowe, Price, LeBlanc & Becker

[57] ABSTRACT

Digital modulating method and apparatus are provided which converts m-bit data codes, in sequence, into digital modulation codes each consisting of n channel bits (n>m) to form a modulation code sequence using connection codes. Bit patterns of portions of the modulation code sequence and the connection codes are changed or additional bit patterns are inserted into the modulation code sequence so as to meet given conditions of a minimum transition interval, a maximum transition interval, and a Digital Sum Value. Demodulating method and apparatus performing a reverse modulation operation are also described.

58 Claims, 40 Drawing Sheets

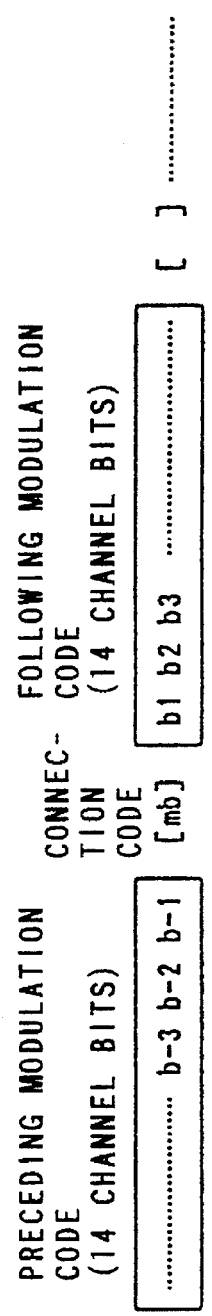

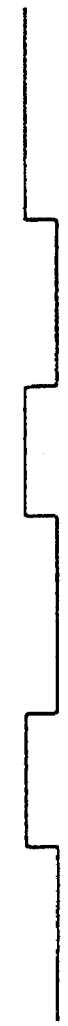

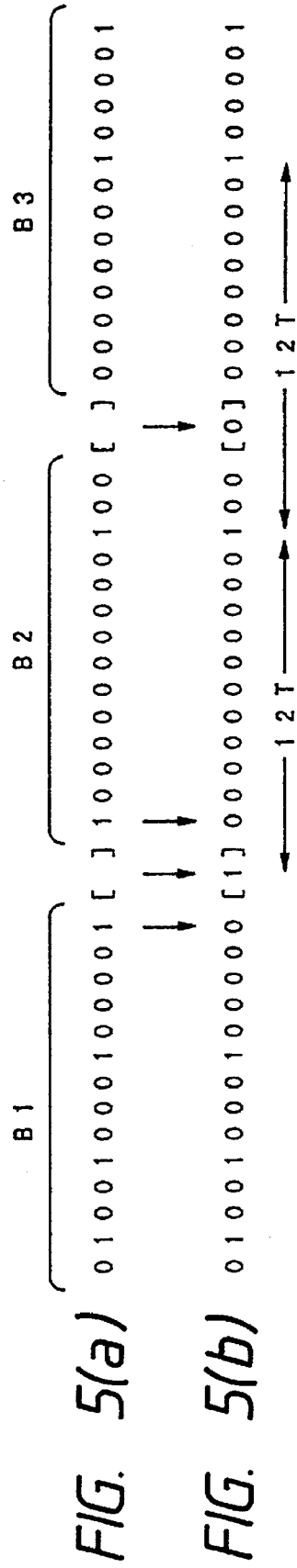

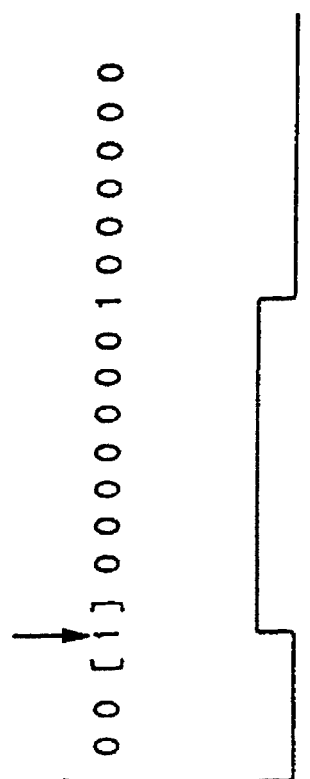
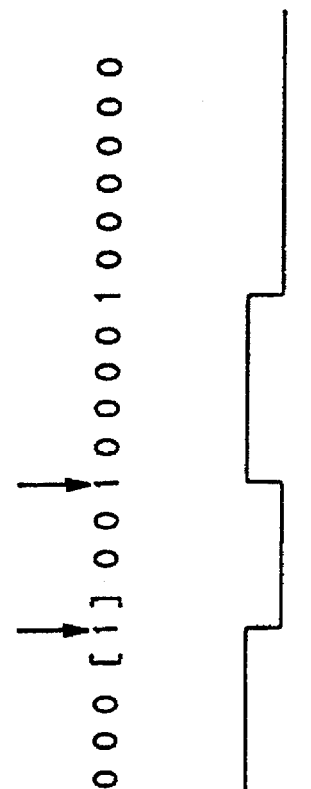
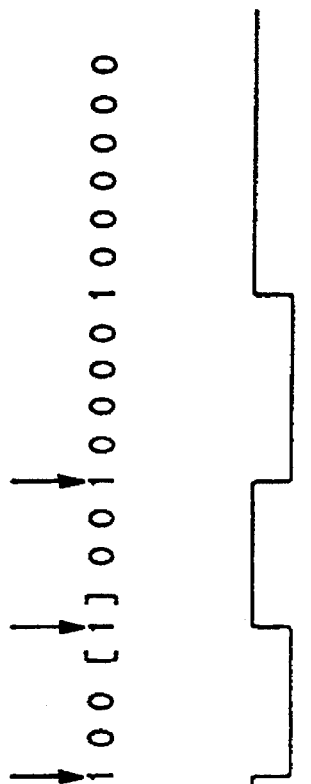
FIG. 6(a)
FIG. 6(b)
FIG. 6(c)
FIG. 6(d)
FIG. 6(e)
FIG. 6(f)
FIG. 6(g)

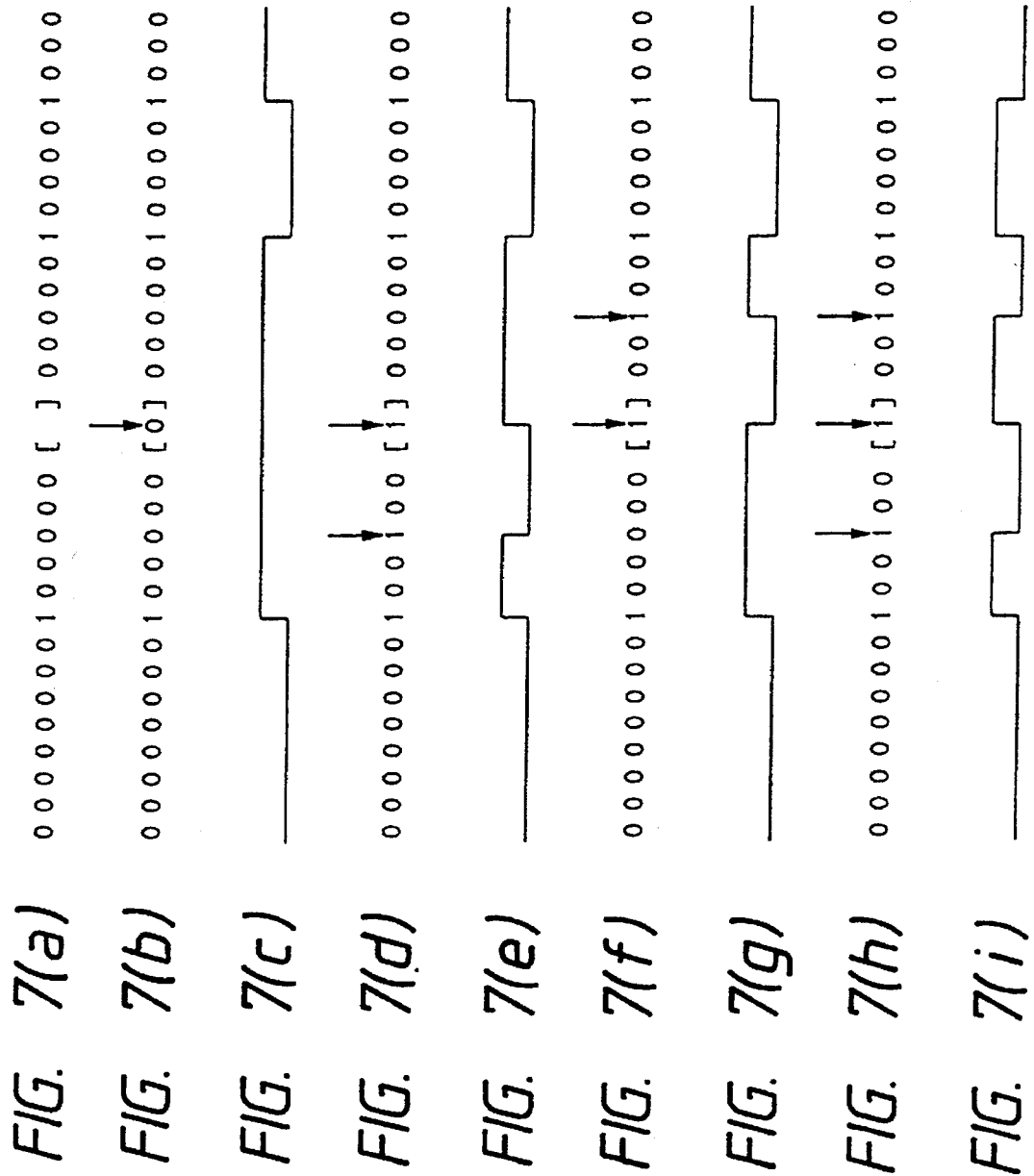

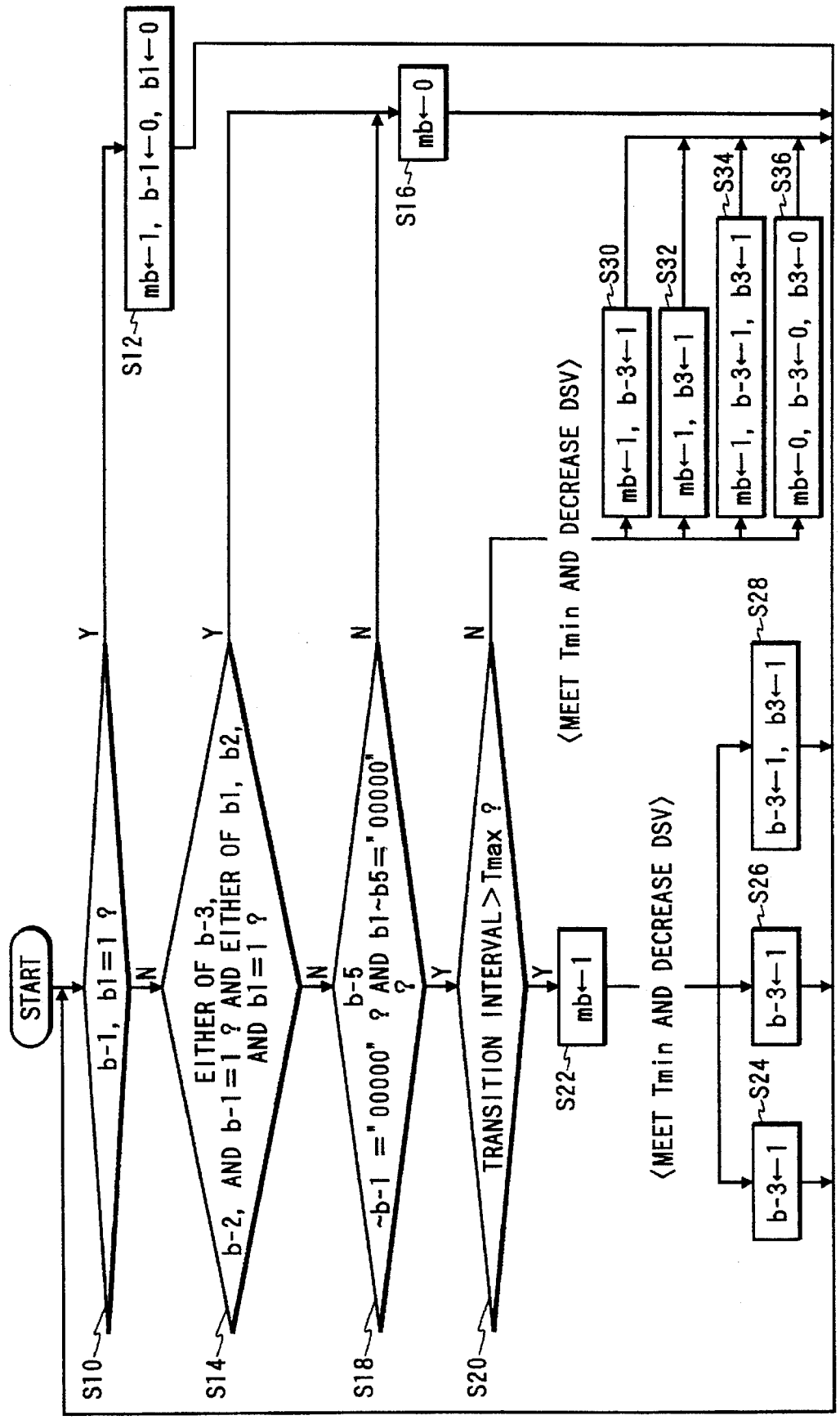

TABLE 1

| 8-BIT DATA | 14-CHANNEL BIT DATA CODES |
|---|---|
| 0 | 0 1 0 0 1 0 0 0 1 0 0 0 0 0 |
| 1 | 1 0 0 0 0 0 1 0 0 0 0 0 0 0 |
| 2 | 1 0 0 1 0 0 0 0 1 0 0 0 0 0 |
| 3 | 1 0 0 0 1 0 0 0 1 0 0 0 0 0 |
| 4 | 0 1 0 0 0 1 0 0 0 0 0 0 0 0 |
| 5 | 0 0 0 0 0 1 0 0 0 1 0 0 0 0 |
| 6 | 0 0 0 1 0 0 0 0 1 0 0 0 0 0 |
| 7 | 0 0 1 0 0 1 0 0 0 0 0 0 0 0 |
| 8 | 0 1 0 0 1 0 0 1 0 0 0 0 0 0 |
| 9 | 1 0 0 0 0 0 0 1 0 0 0 0 0 0 |
| 10 | 1 0 0 1 0 0 0 1 0 0 0 0 0 0 |
| 11 | 1 0 0 0 1 0 0 1 0 0 0 0 0 0 |
| 12 | 0 1 0 0 0 0 0 1 0 0 0 0 0 0 |
| 13 | 0 0 0 0 0 0 0 1 0 0 0 0 0 0 |
| 14 | 0 0 0 1 0 0 0 1 0 0 0 0 0 0 |
| 15 | 0 0 1 0 0 0 0 1 0 0 0 0 0 0 |
| ⋮ | ⋮ |
| 127 | 0 0 1 0 0 0 0 0 0 0 0 0 1 0 |
| 128 | 0 1 0 0 1 0 0 0 1 0 0 0 0 1 |
| ⋮ | ⋮ |
| 255 | 0 0 1 0 0 0 0 0 0 1 0 0 1 0 |

FIG. 11

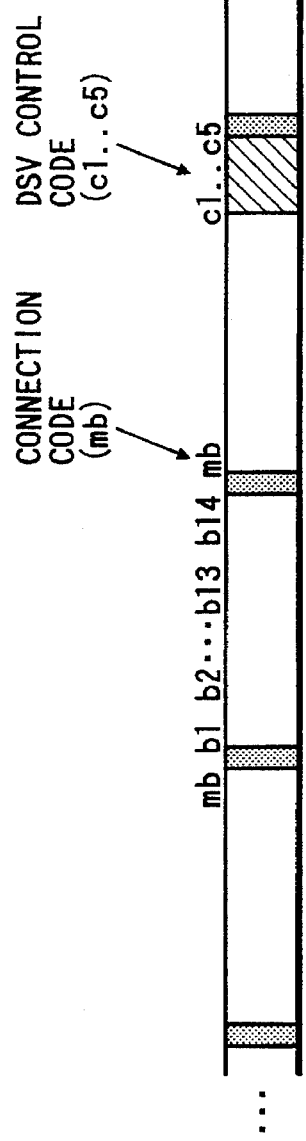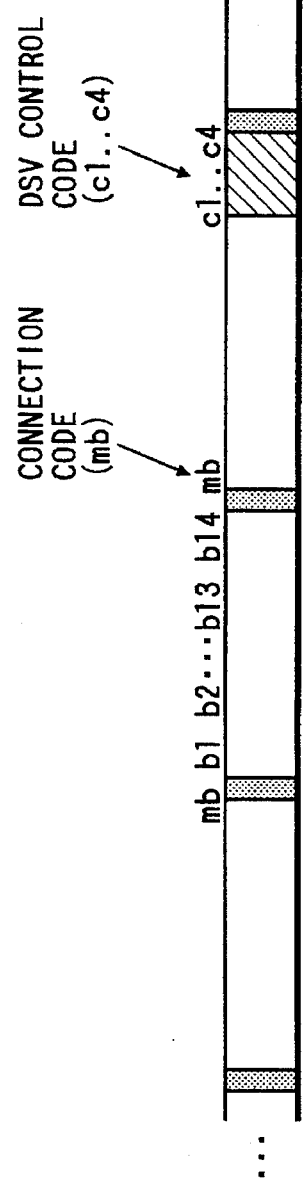

TABLE 2

| TYPE | PRECEDING b13 b14 | DSV CONTROL CODE c1 c2 c3 c4 c5 | mb | FOLLOWING b1 b2 | CONDITIONS |
|---|---|---|---|---|---|
| POLARITY REVERSAL [A] | .. x x <br> .. x x | - - - - - <br> 0 0→1 0 0 | - <br> 0 | x x .. <br> x x .. | NO CONDITION |
| [B] | .. y y <br> .. y y | - - - - - <br> 0 0 0 0 0 | - <br> 0 | y y .. <br> y y .. | EITHER OF LAST TWO BITS OF PRECEDING CODE AND FIRST TWO BITS OF FOLLOWING CODE IS a1 |
| NON-REVERSAL [C] | .. x x <br> .. x x | - - - - - <br> 0 0→1 0 0 | -→1 <br> - | 0 0 .. <br> 0 0 .. | FOLLOWING BLOCK STARTS WITH "00" |
| [D] | .. 0 0 <br> .. 0 0 | -→1 - - - - <br> 1 0 0→1 0 | - <br> 0 | x x .. <br> x x .. | PRECEDING BLOCK ENDS WITH "00" |

FIG. 16

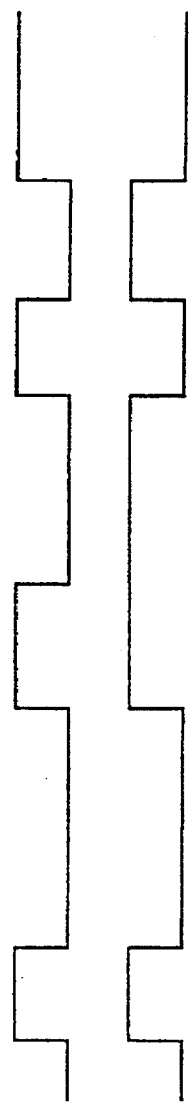

FIG. 18(b) REVERSAL
FIG. 18(c) NON-REVERSAL
FIG. 18(d) REVERSAL
FIG. 18(e) NON-REVERSAL

FIG. 19(b) REVERSAL
FIG. 19(c) NON-REVERSAL
FIG. 19(d) REVERSAL
FIG. 19(e) NON-REVERSAL

TABLE 3

| POLARITY | | PRECEDING b13 b14 | DSV CONTROL CODE c1 c2 c3 c4 c5 | mb | FOLLOWING b1 b2 | CONDITIONS |
|---|---|---|---|---|---|---|
| REVERSAL | [A] | .. x x<br>.. x x | - - - - -<br>0 0 1 0 0 | -<br>0 | x x ..<br>x x .. | NO CONDITION |
| NON-REVERSAL | [B] | .. x 1<br>.. x 1 | - - - - -<br>0 0 0 0 0 | -<br>0 | y y ..<br>y y .. | PRECEDING BLOCK ENDS WITH a1 AND EITHER OF FIRST TWO BITS OF FOLLOWING BLOCK IS a0 |
| | [C] | .. x 1<br>.. x 1 | - - - - -<br>0 0 1 0 0 | -→-<br>-→- | 0 0 ..<br>0 0 .. | PRECEDING BLOCK ENDS WITH a1 AND FIRST TWO BITS OF FOLLOWING BLOCK ARE BOTH 0s |
| | [D] | .. 1 0<br>.. 1 0 | - - - - -<br>0 0 0 0 0 | -<br>0 | 1 x ..<br>1 x .. | PRECEDING BLOCK ENDS WITH "10" AND FOLLOWING BLOCK STARTS WITH a1 |
| | [E] | .. 1 0<br>.. 1 0 | - - - -→-<br>0 1 0 0 1 | -<br>0 | 0 x ..<br>0 x .. | PRECEDING BLOCK ENDS WITH "10" AND FOLLOWING BLOCK STARTS WITH a0 |
| | [F] | .. 0 0<br>.. 0 0 | -→- - - -<br>1 0 0 1 0 | -<br>0 | x x ..<br>x x .. | PRECEDING BLOCK ENDS WITH "00" |

FIG. 20

TABLE 4

| POLARITY | TYPE | PRECEDING .. b10 b11 b12 b13 b14 | DSV CONTROL CODE c1 c2 c3 c4 | mb | FOLLOWING b1 b2 b3 b4 b5 .. | CONDITIONS |
|---|---|---|---|---|---|---|
| REVERSAL | [A] | . . . . . | - - - - | 1 | . . . . . | NO CONDITION |
|  | [B] | . . . 0 0 <br> . . . 0 0 | 0 0 - - <br> 1→1 0 0 | 1→1 <br> 0 | 0 0 . . . <br> 0 0 . . . | b13, b14 OF PRECEDING BLOCK ARE BOTH 0s AND b1, b2 OF FOLLOWING BLOCK ARE BOTH 0s |
|  | [C] | . . . y y <br> . . . y y | - - - - <br> 0 0 0 0 | - <br> 0 | y y y y y <br> y y y y y | EITHER OF b13 AND b14 OF PRECEDING BLOCK IS a1 AND ANYONE OF b1~b5 OF FOLLOWING BLOCK IS a1 |
| NON-REVERSAL | [D] | . . y y y <br> . . y y y | - - - - <br> - - - - | - <br> - | y y y . . <br> y y y . . | ANYONE OF b10~b14 OF PRECEDING BLOCK IS a1 AND EITHER OF b1and b2 IS a1 |
|  | [E] | . . (0) y y <br> . . (0) y y | - - - - <br> 0 0 0 0 | - <br> 0 | 0 0 0 0 0 <br> 0 0 0→1 0 0 | EITHER OF b13 AND b14 OF PRECEDING BLOCK IS a1 AND b1~b5 OF FOLLOWING BLOCK ARE ALL 0s |
|  | [F] | 0 0 0→0 0 <br> 0 0 0 0 0 | - - - - <br> 1 0 0 0 | - <br> 0 | y y . (0) . <br> y y . (0) . | b10~b14 OF PRECEDING BLOCK ARE ALL 0s AND EITHER OF b1and b2 OF FOLLOWING BLOCK IS a1 |

FIG. 24

FIG. 25(b) REVERSAL

FIG. 25(c) NON-REVERSAL

FIG. 25(d) REVERSAL

FIG. 25(e) NON-REVERSAL

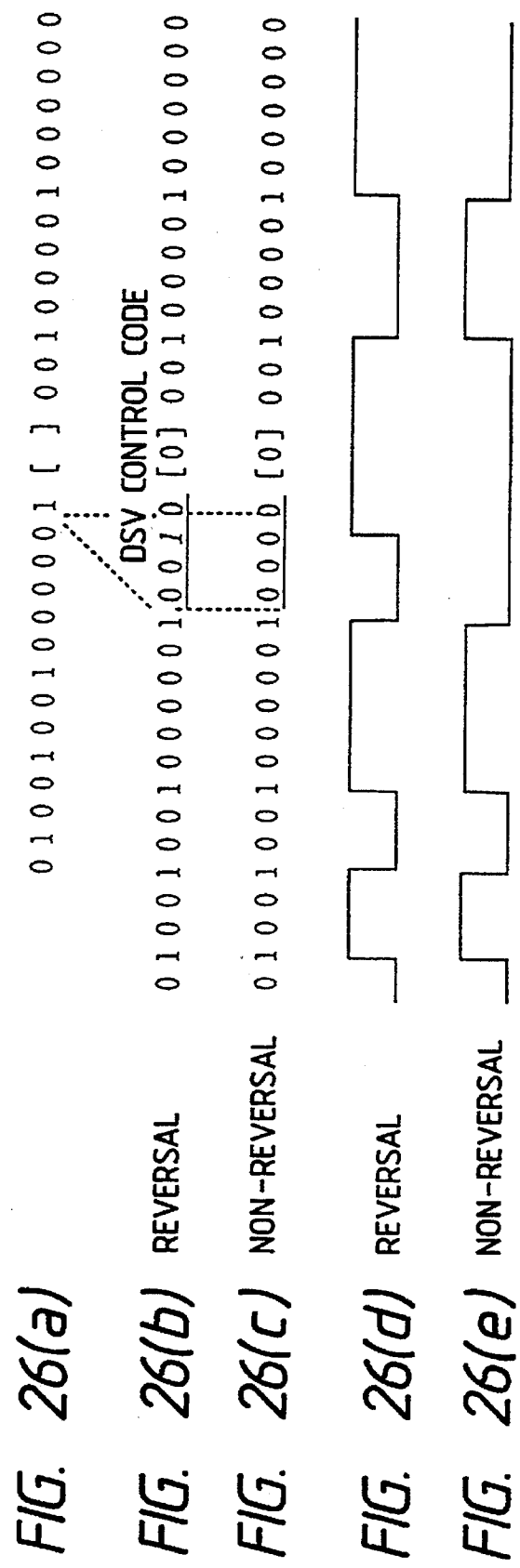

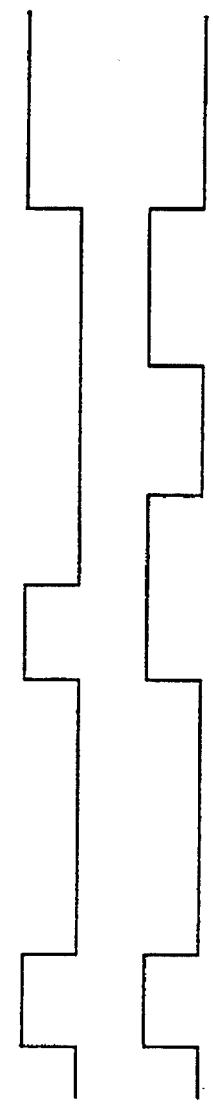
FIG. 27(a)  0100100000000001 [ ] 0000001 0000000
FIG. 27(b) REVERSAL  010010000000000100010 [0] 00000010000000
FIG. 27(c) NON-REVERSAL  010010000000000100000 [1] 00100001 0000000
DSD CONTROL CODE
FIG. 27(d) REVERSAL
FIG. 27(e) NON-REVERSAL

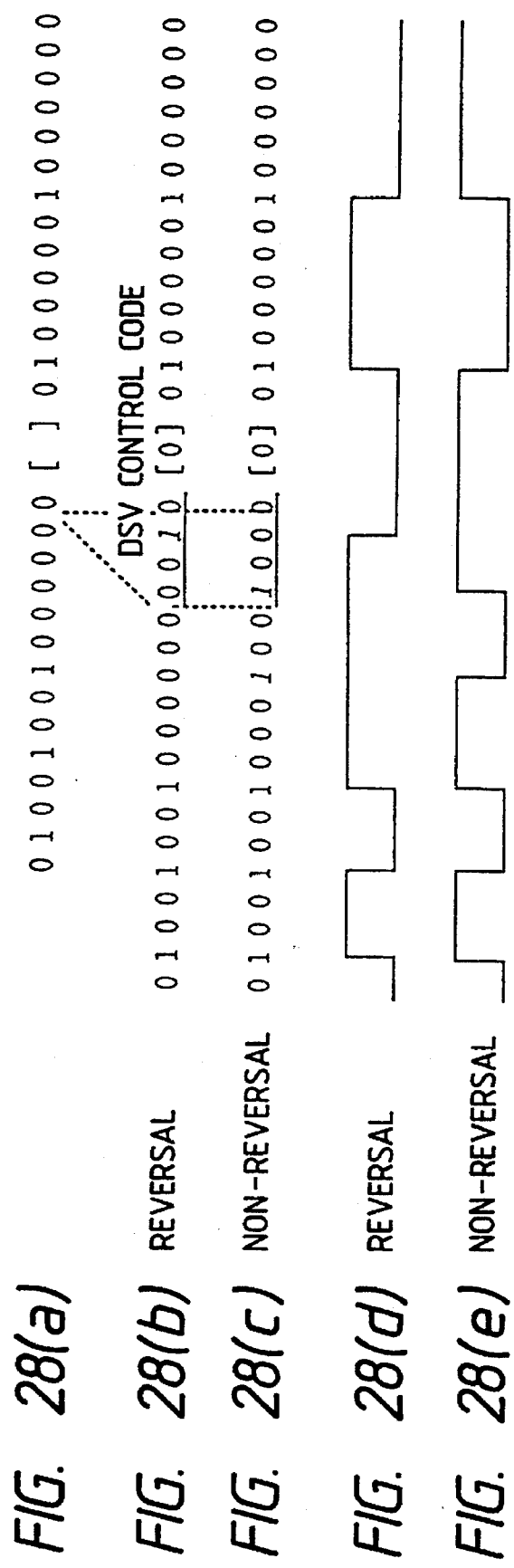

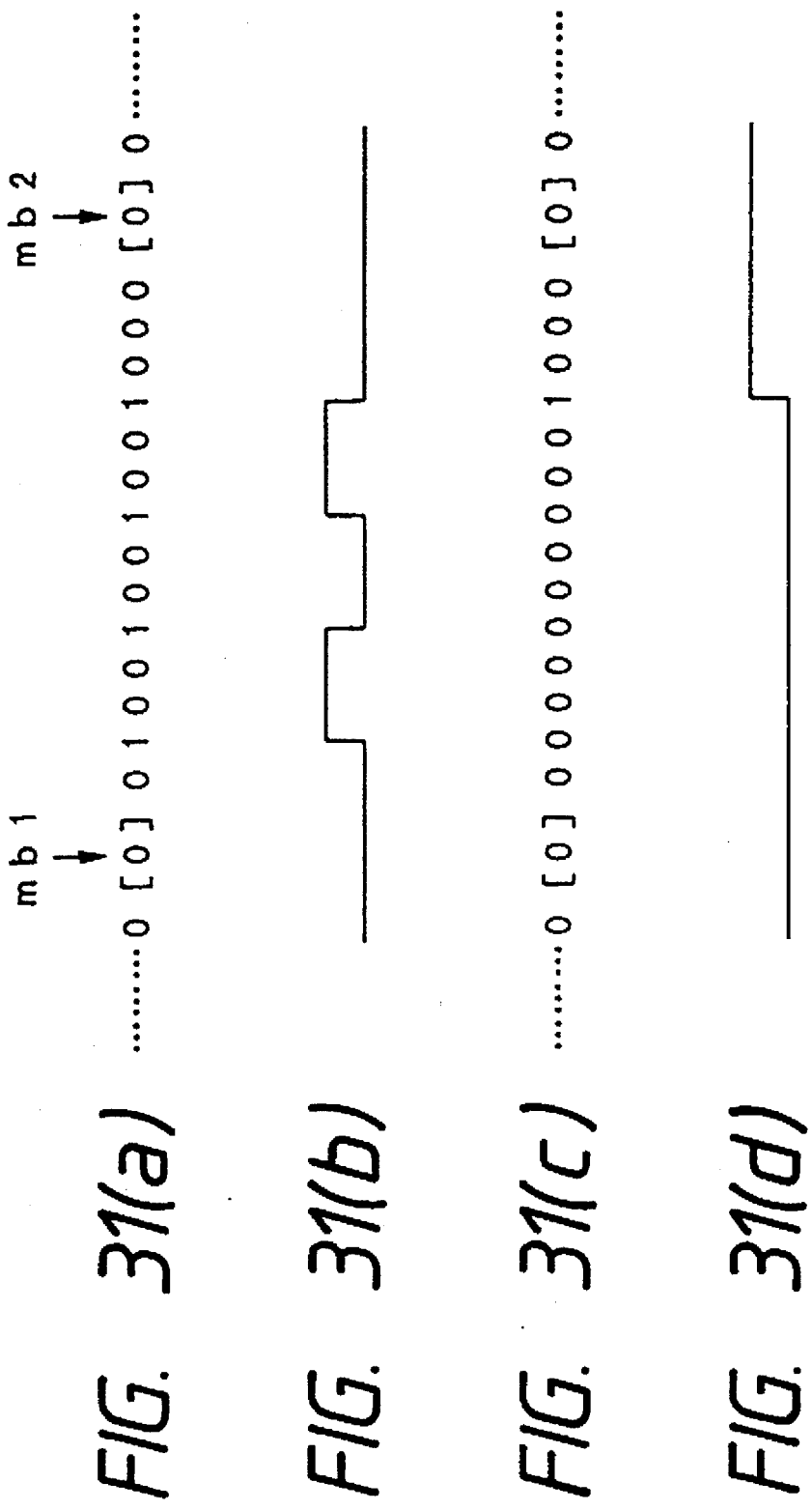

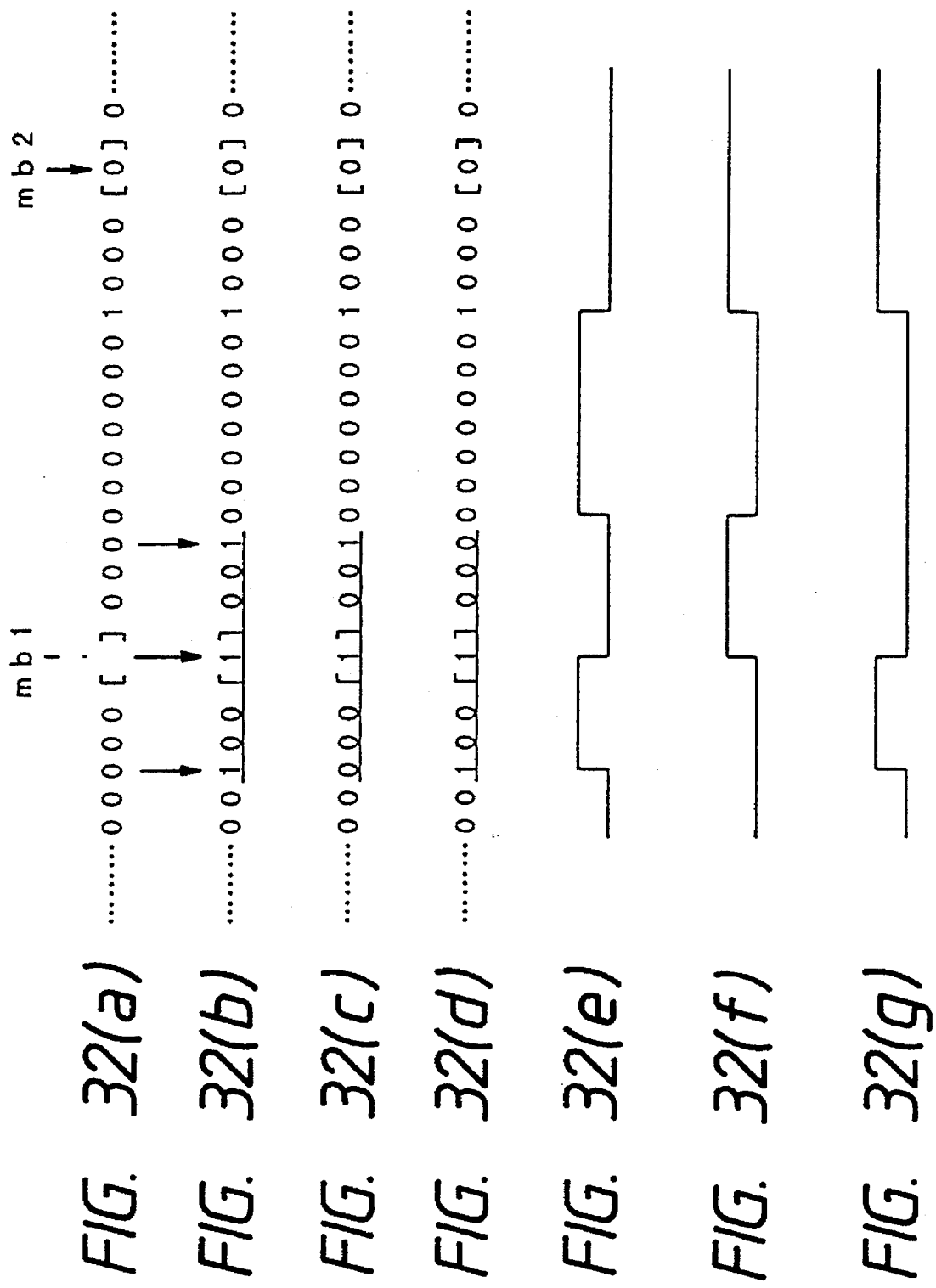

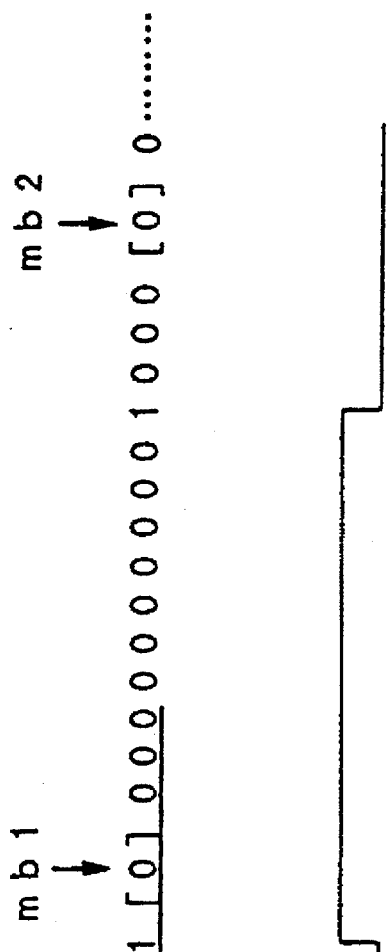
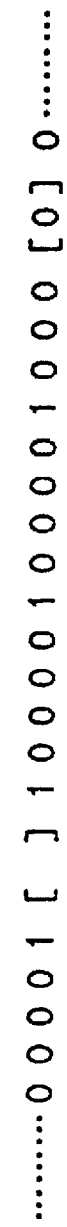
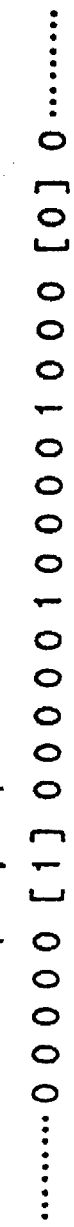
FIG. 33(a)
FIG. 33(b)
FIG. 33(c)
FIG. 33(d)
FIG. 33(e)

TABLE 5

| SUBSTITUTION CONDITIONS<br><br>SUBSTITUTIVE MODULATION CODE / CONVERSION BIT PATTERN | PRECEDING BLOCK ENDS WITH FIVE OR MORE CONSECUTIVE 0s<br><br>1 0 0 [1] 0 0 1 | PRECEDING BLOCK ENDS WITH THREE OR MORE CONSECUTIVE 0s<br><br>0 0 0 [1] 0 0 1 | PRECEDING BLOCK ENDS WITH FIVE OR MORE CONSECUTIVE 0s<br><br>1 0 0 [1] 0 0 0 | PRECEDING BLOCK ENDS WITH a1<br><br>0 0 1 [0] 0 0 0 |
|---|---|---|---|---|
| 0000000010001 | MODULATION CODE INCLUDING EVEN 1s | MODULATION CODE INCLUDING ODD 1s | MODULATION CODE INCLUDING ODD 1s | MODULATION CODE STARTING WITH a1 AND INCLUDING EVEN 1s |
| 0000000010010 | MODULATION CODE INCLUDING EVEN 1s | MODULATION CODE INCLUDING ODD 1s | MODULATION CODE INCLUDING ODD 1s | MODULATION CODE STARTING WITH a1 AND INCLUDING EVEN 1s |
| 0000000010000 | MODULATION CODE INCLUDING ODD 1s | MODULATION CODE INCLUDING EVEN 1s | MODULATION CODE INCLUDING EVEN 1s | MODULATION CODE STARTING WITH a1 AND INCLUDING ODD 1s |
| 0000000001001 | MODULATION CODE INCLUDING EVEN 1s | MODULATION CODE INCLUDING ODD 1s | MODULATION CODE INCLUDING ODD 1s | MODULATION CODE STARTING WITH a1 AND INCLUDING EVEN 1s |
| 0000000001000 | MODULATION CODE INCLUDING ODD 1s | MODULATION CODE INCLUDING EVEN 1s | MODULATION CODE INCLUDING EVEN 1s | MODULATION CODE STARTING WITH a1 AND INCLUDING ODD 1s |
| 0000000000100 | MODULATION CODE INCLUDING ODD 1s | MODULATION CODE INCLUDING EVEN 1s | MODULATION CODE INCLUDING EVEN 1s | |
| 0000000000010 | MODULATION CODE INCLUDING ODD 1s | MODULATION CODE INCLUDING EVEN 1s | | |
| 0000000000001 | MODULATION CODE INCLUDING ODD 1s | MODULATION CODE INCLUDING EVEN 1s | | |

FIG. 34

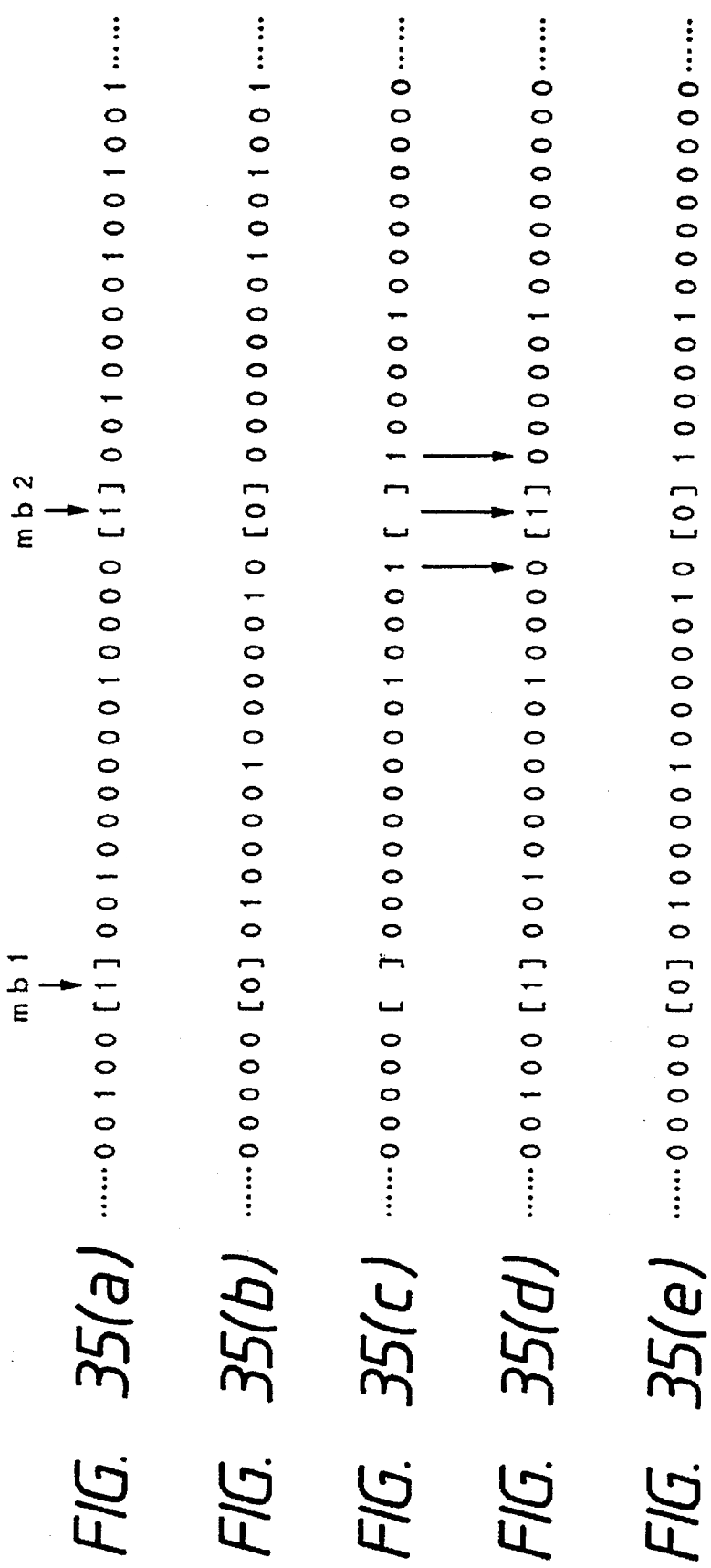

TABLE 6

| SUBSTITUTION CONDITIONS / SUBSTITUTIVE MODULATION CODE | PRECEDING BLOCK ENDS WITH FIVE OR MORE CONSECUTIVE 0s<br>1 0 0 [1] 0 0 1 | PRECEDING BLOCK ENDS WITH THREE OR MORE CONSECUTIVE 0s<br>0 0 0 [1] 0 0 1 | PRECEDING BLOCK ENDS WITH FIVE OR MORE CONSECUTIVE 0s<br>1 0 0 [1] 0 0 0 | PRECEDING BLOCK ENDS WITH a1<br>0 0 1 [0] 0 0 0 |
|---|---|---|---|---|
| 0000000000010001 | (128) 0100100010001 | (137) 1000000100001 | (140) 0100001000001 | (129) 1000010100001 |
| 0000000000010010 | (96) 0100100010010 | (105) 1000000100010 | (108) 0100001000010 | (97) 1000010100010 |
| 0000000000010000 | (24) 0100100010000 | (25) 1000000000010000 | (28) 0100000010000 | (26) 1000010000010000 |
| 0000000000001001 | (130) 1001000100001 | (143) 0010001000001 | (144) 1000000100001 | (131) 1000100100001 |
| 0000000000001000 | (36) 0100001001000 | (40) 0100100001000 | (42) 1001001001000 | (33) 1000010000001000 |
| 0000000000000100 | (73) 1000001000100 | (64) 0100100100 | (65) 1000100100 | |
| 0000000000000010 | (111) 0010001000010 | (98) 1000100100010 | | |
| 0000000000000001 | (145) 1000010000001 | (132) 0100010000001 | | |

FIG. 36

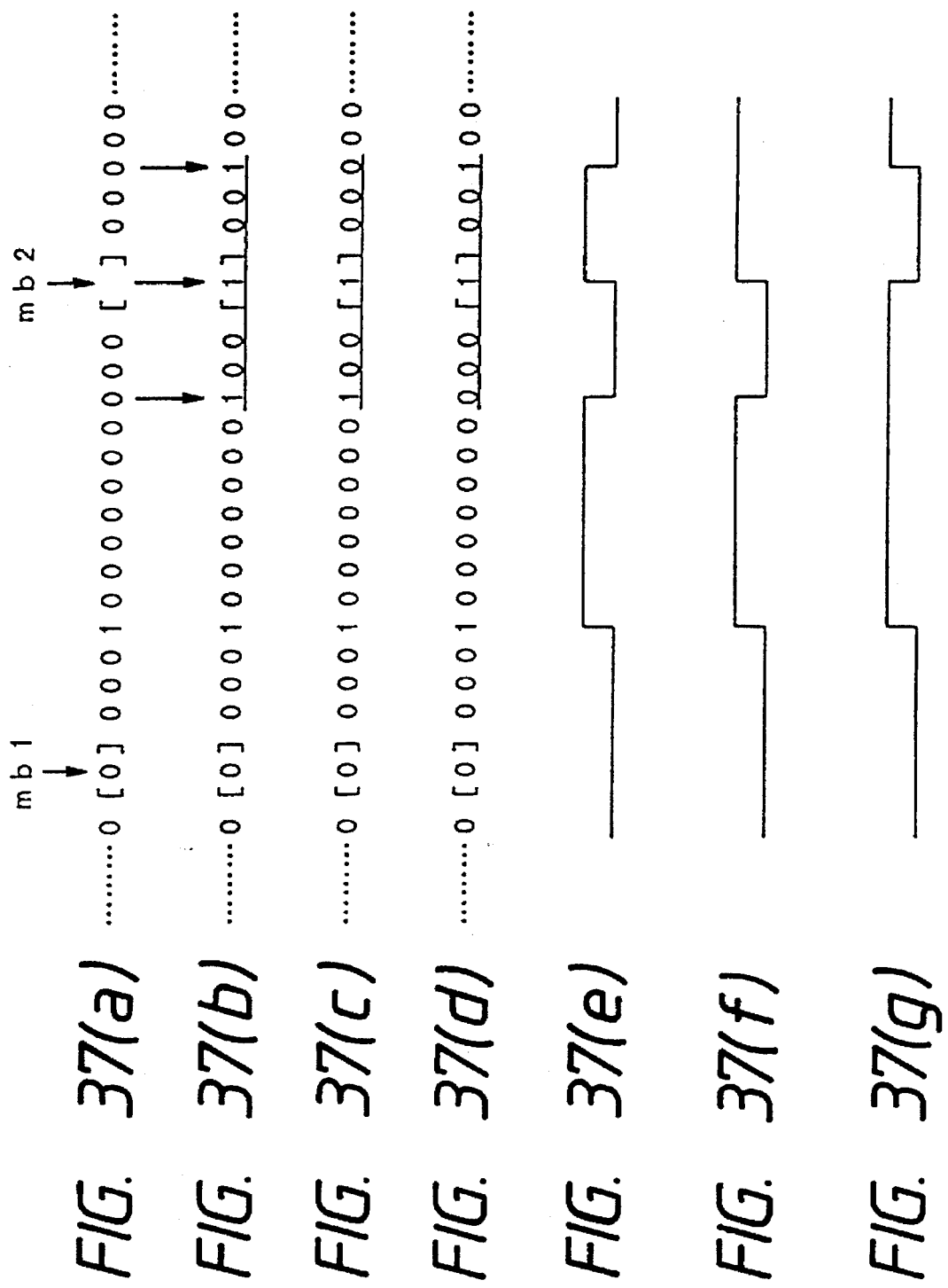

TABLE 7

| SUBSTITUTION CONDITIONS / SUBSTITUTIVE MODULATION CODE | FOLLOWING BLOCK STARTS WITH FIVE OR MORE CONSECUTIVE 0s<br>1 0 0 [1] 0 0 1 | FOLLOWING BLOCK STARTS WITH THREE OR MORE CONSECUTIVE 0s<br>1 0 0 [1] 0 0 0 | FOLLOWING BLOCK STARTS WITH FIVE OR MORE CONSECUTIVE 0s<br>0 0 0 [1] 0 0 1 | FOLLOWING BLOCK STARTS WITH a1<br>0 0 0 [0] 1 0 0 |
|---|---|---|---|---|
| 1000100000000000 | MODULATION CODE INCLUDING EVEN 1s | MODULATION CODE INCLUDING ODD 1s | MODULATION CODE INCLUDING ODD 1s | MODULATION CODE ENDING WITH a1 AND INCLUDING EVEN 1s |
| 0100100000000000 | MODULATION CODE INCLUDING EVEN 1s | MODULATION CODE INCLUDING ODD 1s | MODULATION CODE INCLUDING ODD 1s | MODULATION CODE ENDING WITH a1 AND INCLUDING EVEN 1s |
| 0000100000000000 | MODULATION CODE INCLUDING ODD 1s | MODULATION CODE INCLUDING EVEN 1s | MODULATION CODE INCLUDING EVEN 1s | MODULATION CODE ENDING WITH a1 AND INCLUDING ODD 1s |
| 1001000000000000 | MODULATION CODE INCLUDING ODD 1s | MODULATION CODE INCLUDING ODD 1s | MODULATION CODE INCLUDING ODD 1s | MODULATION CODE ENDING WITH a1 AND INCLUDING EVEN 1s |
| 0001000000000000 | MODULATION CODE INCLUDING EVEN 1s | MODULATION CODE INCLUDING EVEN 1s | MODULATION CODE INCLUDING EVEN 1s | MODULATION CODE ENDING WITH a1 AND INCLUDING ODD 1s |
| 0010000000000000 | MODULATION CODE INCLUDING ODD 1s | MODULATION CODE INCLUDING EVEN 1s | MODULATION CODE INCLUDING EVEN 1s | |
| 0100000000000000 | MODULATION CODE INCLUDING ODD 1s | MODULATION CODE INCLUDING EVEN 1s | | |
| 1000000000000000 | MODULATION CODE INCLUDING ODD 1s | MODULATION CODE INCLUDING EVEN 1s | | |

FIG. 39

TABLE 8

| SUBSTITUTION CONDITIONS / CONVERSION BIT PATTERN<br>SUBSTITUTIVE MODULATION CODE | FOLLOWING BLOCK STARTS WITH FIVE OR MORE CONSECUTIVE 0s<br>1 0 0 [1] 0 0 1 | FOLLOWING BLOCK STARTS WITH THREE OR MORE CONSECUTIVE 0s<br>1 0 0 [1] 0 0 0 | FOLLOWING BLOCK STARTS WITH FIVE OR MORE CONSECUTIVE 0s<br>0 0 0 [1] 0 0 1 | FOLLOWING BLOCK STARTS WITH a1<br>0 0 0 [0] 1 0 0 |
|---|---|---|---|---|
| 100010000000000 | (66) 10010000100100 | (80) 10000000100100 | (81) 10000010000100 | (138) 10010001000001 |
| 010010000000000 | (68) 01000100100100 | (76) 01000001000100 | (84) 01000010000100 | (136) 01010001000001 |
| 000010000000000 | (160) 00001000100100 | (93) 00001000000100 | (125) 00001000000010 | (189) 00001000001001 |
| 100100000000000 | (67) 10010001001000 | (90) 10010000000100 | (91) 10010000000100 | (139) 10010001000001 |
| 000100000000000 | (70) 00010001001000 | (94) 00010000000100 | (126) 00010000000010 | (134) 00010000100001 |
| 001000000000000 | (79) 00100001000100 | (71) 00100100100100 | (95) 00100000000100 | |
| 010000000000000 | (88) 01001000000100 | (72) 01001001000100 | | |
| 100000000000000 | (113) 10000010000010 | (74) 10010001000100 | | |

FIG. 40

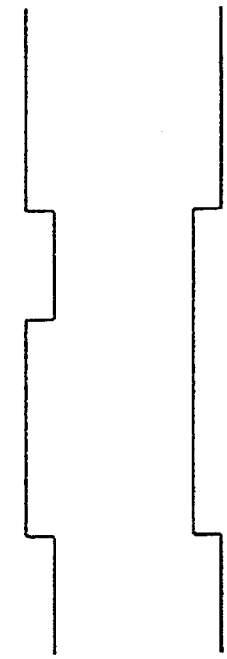

TABLE 9

| BIT PATTERN | | | OPERATIONS OF C.K.T. 28 | OPERATIONS OF C.K.T. 29 | DSV CONTROL FLAG |
|---|---|---|---|---|---|
| RUN LENGTH OF 0s IN SHIFT REGISTERS 20, 26 | mb | RUN LENGTH OF 0s IN SHIFT REGISTERS 18, 24 | | | |
| 0 | | 0 | S12 | S12 | 0 |
| 3 | | ≥8 | S26 | S26 | 0 |
| 4 | | ≥7 | S26 | S26 | 0 |
| 5 | | ≥5 | S36 | S34 | 1 |
| 5 | | ≥6 | S24 OR S26 | S28 | 1 |
| 6 | | ≥5 | S24 OR S26 | S28 | 1 |
| 7 | | 4 | S24 | S24 | 0 |
| 7 | | ≥5 | S24 OR S26 | S28 | 1 |
| 8 | | 4≥L≥3 | S24 | S24 | 0 |
| 8 | | ≥5 | S24 OR S26 | S28 | 1 |

FIG. 44

DIGITAL MODULATING/DEMODULATING METHOD AND APPARATUS USING SAME

BACKGROUND OF THE INVENTION

1. Technical Field

The present invention relates generally to a digital modulating/demodulating method and apparatus for converting m-bit (e.g., 8 bits) data codes into n-bit (e.g., 15 bits) modulation codes, and vice versa. More particularly, the invention relates to an improvement on a digital modulator-demodulator system suitable for high-density data recording and transmission.

2. Background Art

Usually, when digital data is recorded in a recording medium or transmitted through a data transmission channel, a so-called channel coding is effected to match the digital data to characteristics of a data recording system or a data transmission system. Various types of modulating systems for such channel coding are known in the art. For example, Japanese Patent Second Publication Nos. 1-27510 and 5-68031, Japanese Patent First Publication Nos. 58-220213, 58-220214, 58-220215, and 61-84124 disclose conventional modulating systems. A typical one will be discussed below.
EFM (Eight to Fourteen Modulation)

This is well known as a modulating system utilized in a CD system wherein 8-bit data codes are converted into digital modulation codes each consisting of 14 channel bits. In general, these digital modulation codes are so formed as to satisfy the following requirements:

(a) Minimum length between transitions (i.e., a minimum run length) Tmin=3T (d=2) where T is a data bit interval: at least two binary digits 0s (d=2) exist between consecutive binary bits 1s.

(b) Maximum length between transitions (i.e., a maximum run length) Tmax=11T (k=10): a maximum number of binary digits 0s appearing between consecutive binary digits 1s is ten (k=10).

When two sequential blocks of digital modulation codes each containing 14 channel bits are combined to yield a digital modulation code sequence, a connection code of three bits is inserted between the two blocks, so that 8-bit data codes are practically converted into digital modulation codes each containing 17 channel bits.

Logic symbols or binary numbers of the connection code are so determined that a 1 is assigned to any one of the three bits when the condition Tmin=3T is satisfied over the two sequential blocks of the digital modulation codes to restrict the maximum length between transitions Tmax within 11T and decrease a Digital Sum Value (DSV).
FEM (Four to Eight Modulation)

The above listed publication No. 61-84124 teaches a digital modulation technique for converting 4-bit data into an 8-bit digital modulation code meeting Tmin=3T, and aims at reducing low-frequency components of modulated signals. A modulation table includes a plurality of optional bits which may be set to a logic symbol 1 or 0 to convert the digital modulation codes into time-sequential serial signals excluding a series of 1s for restricting Tmax and controlling DSV.

In the sequential conversion of the digital modulation codes into the time-sequential serial signals, if a bit at the second to the last bit position of the preceding digital modulation code represents a logic symbol 1 and a first bit of the following digital modulation code also represents a logic symbol 1, the condition Tmin=3T (d=2) is not met. Accordingly, in order to meet the condition Tmin=3T, a logic symbol 1 is assigned to the last bits of the digital modulation codes and logic symbols 0s are assigned to both the second bit to the last bit of the preceding digital modulation code and the firs bit of the following digital modulation.

This prior art technique has the advantages that data may be converted every 4 bits into digital modulation codes with a small modulation table and compact hardware. Most of conventional digital processing units process signals every byte, while the FEM system converts every 4-bit piece of one byte (=8 bits) data into 8-bit data. Therefore, the FEM system may practically be considered to be equal to a digital modulation system wherein 8-bit byte data is converted into a 16-bit digital modulation code.

In the EFM system of the above mentioned prior art techniques, the minimum length between transitions Tmin in 8-bit data will be 3×8/17=1.41 Tb, so that a DR (Density Ratio) of 1.41 results. In contrast, in the FEM system, the minimum length between transitions Tmin in 4-bit data will be 3×4/8=1.5 Tb, so that a DR of 1.5 results, which is greater than that of the EFM system and effective to produce high-density information. Note that Tb is a data bit interval prior to modulation, and has the relation of T=Tb×m/n where m is the number of bits of original data and n is the number of bits of a modulation code.

In recent years, however, there is an increasing need for recording and transmitting information at a further high density, and thus modulation at a great DR (i.e., a longer Tmin) is being sought.

Moreover, if there are digital modulation codes having the same DR, one having less low-frequency components in its modulation signal is useful in view of influence on a servo system and data detection.

SUMMARY OF THE INVENTION

It is therefore a principal object of the present invention to avoid the disadvantages of the prior art.

It is another object of the present invention to provide a digital modulator-demodulator system which is capable of increasing an information density in recording, reproducing, and transmitting information.

It is a further object of the invention to provide a modulator-demodulator system which enhances the controllability of a DSV to reduce low-frequency components of digital signals.

According to a first aspect of the present invention, there is provided a digital modulating method comprising: (1) a data converting step of converting m-bit data codes, in sequence, into digital modulation codes each consisting of n channel bits (n>m) meeting a given minimum transition Interval condition wherein at least d consecutive logic symbols 0s are placed between logic symbols 1s; (2) a connection code insertion step of inserting a connection code of d−1 bits between two consecutive blocks of the digital modulation codes to form a modulation code sequence, logic symbols of the connection code being determined so as to satisfy the given transition interval condition; (3) a first conversion step of converting two 1-bit pieces preceding and following the connection code in the modulation code sequence into logic symbols 0s, respectively, and setting any one bit of the connection code to a logic symbol 1 if the two 1-bit pieces are both 1; and (4) a second conversion step wherein if d+1 consecutive 0s appear on one of bit strings preceding and following the connection code and 2d+1 consecutive 0s appear on the other bit string, or if 2d+1 consecutive 0s appear on both the bit strings preceding and following the connection code, setting any one bit of the connection code to a logic symbol 1, and converting into a logic symbol 1 a bit placed at a (d+1)th bit position to the connection code in a block of the digital modulation code including the bit string on which the 2d+1 consecutive 0s appear.

According to a second aspect of the invention, there is provided a recording medium recording thereon a signal including a digital modulation code sequence which is formed by the following steps: (1) converting m-bit data codes, in sequence, into digital modulation codes each consisting of n channel bits (n>m) meeting a given minimum transition interval condition wherein at least d consecutive logic symbols 0s are placed between logic symbols 1s; (2) inserting a connection code of d−1 bits between two consecutive blocks of the digital modulation codes to form the modulation code sequence, logic symbols of the connection code being determined so as to satisfy the given transition interval condition; (3) converting two 1-bit pieces preceding and following the connection code in the modulation code sequence into logic symbols 0s, respectively, and setting any one bit of the connection code to a logic symbol 1 if the two 1-bit pieces are both 1; and (4) if d+1 consecutive 0s appear on one of bit strings preceding and following the connection code and 2d+1 consecutive 0s appear on the other bit string, or if 2d+1 consecutive 0s appear on both the bit strings preceding and following the connection code, setting any one bit of the connection code to a logic symbol 1, and converting into a logic symbol 1 a bit placed at a (d+1)th bit position to the connection code in a block of the digital modulation code including the bit string on which the 2d+1 consecutive 0s appear.

According to a third aspect of the invention, there is provided a digital modulating apparatus which comprises (1) a data conversion means for converting m-bit data codes, in sequence, into digital modulation codes each consisting of n channel bits (n>m) meeting a given minimum transition interval condition wherein at least d consecutive logic symbols 0s are placed between logic symbols 1s, (2) a modulation code sequence producing means for producing a modulation code sequence by providing a connection code of d−1 bits between two consecutive blocks of the digital modulation codes, logic symbols of the connection code being determined so as to satisfy the given transition interval condition, (3) a first modulation processing means for converting two 1-bit pieces preceding and following the connection code in the modulation code sequence into logic symbols 0s, respectively, and setting any one bit of the connection code to a logic symbol 1 if the two 1-bit pieces are both 1, and (4) a second modulation processing means for setting any one bit of the connection code to a logic symbol 1, and converting into a logic symbol 1 a bit placed at a (d+1)th bit position to the connection code in a block of the digital modulation code Including the bit string on which the 2d+1 consecutive 0s appear if d+1 consecutive 0s appear on one of bit strings preceding and following the connection code and 2d+1 consecutive 0s appear on the other bit string, or if 2d+1 consecutive 0s appear on both the bit strings preceding and following the connection code.

According to fourth aspect of the invention, there is provided a digital demodulating method which comprises (1) a digital demodulation code producing step of demodulating a digital signal into digital demodulation codes each consisting of n channel bits, the digital signal being derived by a modulation code sequence formed in a modulating operation including (a) a data converting step of converting m-bit data codes, in sequence, into digital modulation codes each consisting of n channel bits (n>m) meeting a given minimum transition interval condition wherein at least d consecutive logic symbols 0s are placed between logic symbols 1s, (b) a connection code insertion step of inserting a connection code of d−1 bits between two consecutive blocks of the digital modulation codes, logic symbols of the connection code being determined so as to satisfy the given transition interval condition, (c) a first conversion step of converting two 1-bit pieces preceding and following the connection code into logic symbols 0s, respectively, and setting any one bit of the connection code to a logic symbol 1 if the two 1-bit pieces are both 1, and (d) a second conversion step wherein if d+1 consecutive 0s appear on one of bit strings preceding and following the connection code and 2d+1 consecutive 0s appear on the other bit string, or if 2d+1 consecutive 0s appear on both the bit strings preceding and following the connection code, setting any one bit of the connection code to a logic symbol 1, and converting into a logic symbol 1 a bit placed at a (d+1)th bit position to the connection code in a block of the digital modulation code including the bit string on which the 2d+1 consecutive 0s appear, the digital demodulation code producing step monitoring logic symbols of the connection code and the bit strings preceding and following the connection code to demodulate the digital signal into a demodulation code sequence including the digital modulation codes each having the n-channel bits, and (2) a data conversion step of converting the demodulation code sequence into the m-bit data codes.

According to a fifth aspect of the invention, there is provided a digital demodulating apparatus which comprises (1) a digital demodulation code producing means for demodulating a digital signal into digital demodulation codes each consisting of n channel bits, the digital signal being derived by a modulation code sequence formed in a modulating operation including (a) a data converting step of converting m-bit data codes, in sequence, into digital modulation codes each consisting of n channel bits (n>m) meeting a given minimum transition interval condition wherein at least d consecutive logic symbols 0s are placed between logic symbols 1s, (b) a connection code insertion step of inserting a connection code of d−1 bits between two consecutive blocks of the digital modulation codes, logic symbols of the connection code being determined so as to satisfy the given transition interval condition, (c) a first conversion step of converting two 1-bit pieces preceding and following the connection code into logic symbols 0s, respectively, and setting any one bit of the connection code to a logic symbol 1 if the two 1-bit pieces are both 1, and (d) a second conversion step wherein if d+1 consecutive 0s appear on one of bit strings preceding and following the connection code and 2d+1 consecutive 0s appear on the other bit string, or if 2d+1 consecutive 0s appear on both the bit strings preceding and following the connection code, setting any one bit of the connection code to a logic symbol 1, and converting into a logic symbol 1 a bit placed at a (d+1)th bit position to the connection code in a block of the digital modulation code including the bit string on which the 2d+1 consecutive 0s appear, the digital demodulation code producing means monitoring logic symbols of the connection code and the bit strings preceding and following the connection code to demodulate the digital signal into a demodulation code sequence including the digital modulation codes each having the n-channel bits, and (2) data conversion means for converting the demodulation code sequence into the m-bit data codes.

According to a sixth aspect of the invention, there is provided a digital modulating method which comprises (1)

a data converting step of converting m-bit data codes, in sequence, into digital modulation codes each consisting of n channel bits (n>m) using a given modulation table, (2) a connection code insertion step of inserting a p-bit connection code between two consecutive blocks of the digital modulation codes to form a modulation code sequence, (3) a bit pattern converting step of converting a bit pattern of a portion of the modulation code sequence into a given bit pattern so as to meet given conditions of a minimum transition interval, a maximum transition interval, and a DSV (Digital Sum Value), and (4) a DSV control code providing step of providing a DSV control code consisting of a given number of bits to the modulation code sequence at a position adjacent the connection code in the modulation code sequence for controlling the DSV.

According to a seventh aspect of the invention, there is provided a digital modulating apparatus which comprises (1) a data converting means for converting m-bit data codes, in sequence, into digital modulation codes each consisting of n channel bits (n>m) using a given modulation table, (2) a connection code insertion means for inserting a p-bit connection code between two consecutive blocks of the digital modulation codes to form a modulation code sequence, (3) a bit pattern converting mesas for converting a bit pattern of a portion of the modulation code sequence into a given bit pattern so as to meet a given minimum transition interval, a given maximum transition interval, and a DSV (Digital Sum Value), and (4) a DSV control code providing means for providing a DSV control code consisting of a given number of bits to the modulation code sequence at a position adjacent the connection code in the modulation code sequence for controlling the DSV.

According to an eighth aspect of the invention, there is provided a digital demodulating method which comprises (1) a digital demodulation code producing step of demodulating a digital signal into digital demodulation codes each consisting of n channel bits, the digital signal being derived by a modulation code sequence formed in a modulating operation including (a) a data converting step of converting m-bit data codes, in sequence, into digital modulation codes each consisting of n channel bits (n>m) using a given modulation table, (b) a connection code insertion step of inserting a p-bit connection code between two consecutive blocks of the digital modulation codes to form a modulation code sequence, (c) a bit pattern converting step of converting a bit pattern of a portion of the modulation code sequence into a given bit pattern so as to meet given conditions of a minimum transition interval, a maximum transition interval, and a DSV (Digital Sum Value), and (d) a DSV control code providing step of providing a DSV control code consisting of a given number of bits to the modulation code sequence at a position adjacent the connection code in the modulation code sequence for controlling the DSV, the digital demodulation code producing step monitoring logic symbols of the connection code and bit strings preceding and following the connection code to demodulate the digital signal into a demodulation code sequence including the digital modulation codes each having the n-channel bits, and (2) a data conversion step of converting the demodulation code sequence into the m-bit data codes.

According to a ninth aspect of the invention, there is provided a digital demodulating apparatus which comprises (1) a digital demodulation code producing means for demodulating a digital signal into digital demodulation codes each consisting of n channel bits, the digital signal being derived by a modulation code sequence formed in a modulating operation including (a) a data converting step of converting m-bit data codes, in sequence, into digital modulation codes each consisting of n channel bits (n>m) using a given modulation table, (b) a connection code insertion step of inserting a p-bit connection code between two consecutive blocks of the digital modulation codes to form a modulation code sequence, (c) a bit pattern converting step of converting a bit pattern of a portion of the modulation code sequence into a given bit pattern so as to meet given conditions of a minimum transition interval, a maximum transition interval, and a DSV (Digital Sum Value), and (d) a DSV control code providing step of providing a DSV control code consisting of a given number of bits to the modulation code sequence at a position adjacent the connection code in the modulation code sequence for controlling the DSV, the digital demodulation code producing step monitoring logic symbols of the connection code and bit strings preceding and following the connection code to demodulate the digital signal into a demodulation code sequence including the digital modulation codes each having the n-channel bits, and (2) a data conversion means for converting the demodulation code sequence into the m-bit data codes.

According to a tenth aspect of the invention, there is provided a digital modulating method which comprises (1) a data converting step of converting m-bit data codes, in sequence, into digital modulation codes each consisting of n channel bits (n>m) using a given modulation table, (2) a connection code insertion step of inserting a p-bit connection code between two consecutive code blocks of the digital modulation codes to form a modulation code sequence, (3) a bit pattern converting step of converting a bit pattern of a portion of the modulation code sequence into a given bit pattern so as to meet given conditions of a minimum transition interval, a maximum transition interval, and a DSV (Digital Sum Value), and (4) a substitutive modulation code providing step of providing as the given bit pattern one of bit patterns unused in the given modulation table.

According to an eleventh aspect of the invention, there is provided a digital modulating apparatus which comprises (1) a data converting means for converting 8-bit data codes, in sequence, into digital modulation codes each consisting of 14 channel bits using a given modulation table, (2) a connection code insertion means for inserting a one-bit connection code between two consecutive code blocks of the digital modulation codes to form a modulation code sequence, (3) a bit pattern converting means for converting a bit pattern of a portion of the modulation code sequence into a given bit pattern so as to meet given conditions of a minimum transition interval, a maximum transition interval, and a DSV (Digital Sum Value), and (4) a substitutive modulation code providing means for providing as the given bit pattern one of bit patterns unused in the given modulation table.

According to a twelfth aspect of the invention, there is prodded a digital demodulating method which comprises (1) a first step of performing a demodulating operation reverse to a modulating operation to demodulate a modulation code sequence based on logic symbols of the modulation code sequence, the modulating operation performing (1) a data converting step of converting data codes, in sequence, into digital modulation codes using a given modulation table, (2) a connection code insertion step of inserting a p-bit connection code between two consecutive code blocks of the digital modulation codes to form the modulation code sequence, (3) a bit pattern converting step of converting a bit pattern of a portion of the modulation code sequence into a given bit pattern so as to meet given conditions of a minimum transition interval, a maximum transition interval, and a DSV (Digital Sum Value), and (4) a substitutive modulation code providing step of providing as the given bit pattern one of bit patterns unused in the given modulation table, (2) a second step of converting the digital modulation codes of the modulation code sequence each consisting of 14 bits into the data code consisting of 8 bits using a first inverse modulation table, and (3) a third step of converting the substitutive modulation code into an original bit pattern using a second inverse modulation table.

According to a thirteenth aspect of the invention, there is provided a digital demodulating apparatus which comprises (1) a first means for performing a demodulating operation reverse to a modulating operation to demodulate a modulation code sequence based on logic symbols of the modulation code sequence, the modulating operation performing (1) a data converting step of converting data codes, in sequence, into digital modulation codes using a given modulation table, (2) a connection code insertion step of inserting a p-bit connection code between two consecutive code blocks of the digital modulation codes to form the modulation code sequence, (3) a bit pattern converting step of converting a bit pattern of a portion of the modulation code sequence into a given bit pattern so as to meet given conditions of a minimum transition interval, a maximum transition interval, and a DSV (Digital Sum Value), and (4) a substitutive modulation code providing step of providing as the given bit pattern one of bit patterns unused in the given modulation table, (2) a second means for converting the digital modulation codes of the modulation code sequence each consisting of 14 bits into the data code consisting of 8 bits using a first inverse modulation table, and (3) a third means for converting the substitutive modulation code into an original bit pattern using a second inverse modulation table.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for explanation and understanding only.

In the drawings:

FIGS. 1(a) to 1(d) are explanatory views of a digital modulating operation according to a first embodiment of the invention;

FIGS. 2(a) to 2(c) are explanatory views of a digital modulating operation according to a first embodiment when bits preceding and following a connection bit are both 1s;

FIGS. 3(a) to 3(d) are explanatory views of a digital modulating operation according to a first embodiment when consecutive 0s more than Tmax appear at bit positions preceding and following a connection bit;

FIGS. 4(a) to 4(c) are explanatory views of a digital modulating operation in an example of a modulation code sequence symbol-converted according to a digital modulating operation of a first embodiment;

FIGS. 5(a) and 5(b) are explanatory views of a digital modulating operation in an example of a modulation code sequence having Tmax=12 according to a first embodiment;

FIGS. 6(a) to 6(g) are explanatory views which show an example of DSV control in a modulation code sequence according to a first embodiment;

FIG. 7(a) to 7(i) are explanatory views which show an example of DSV control in a modulation code sequence according to a first embodiment;

FIGS. 8(a) to 8(e) are explanatory views which show an example of DSV control in a modulation code sequence according to a first embodiment;

FIG. 9(a) is an explanatory view which shows a frame synchronization code according to a first embodiment;

FIGS. 9(b) and 9(c) show signal waveforms when a bit X in a modulation code sequence shown in FIG. 9(a) is a 0 and a 1, respectively;

FIG. 10 is a flowchart of a program or sequence of logical steps of a modulating operation according to a first embodiment;

FIG. 11 is an eight-to-fourteen modulation table used in converting 8-bit data codes into 14-bit channel bit codes;

FIG. 15 is an explanatory view which shows a modulation code sequence formed by a modulating operation according to a second embodiment;

FIG. 16 is a table 2 which provides DSV control codes based on bit arrangements at bit positions preceding and following a connection code according to a first DSV code selection rule;

FIGS. 17(a) to 17(e) are explanatory views which show an example wherein a DSV control code is provided to a modulation code sequence according to a second embodiment;

FIGS. 18(a) to 18(e) are explanatory views which show insertion of a DSV control code into a modulation code sequence when first two bits of a modulation code following a connection code are both 0s;

FIGS. 19(a) to 19(e) are explanatory views which show insertion of a DSV control code into a modulation code sequence when last two bits of a modulation code block preceding a connection code are both 0s;

FIG. 20 is a table 3 which provides DSV control codes based on bit arrangements at bit positions preceding and following a connection code according to a second DSV code selection rule;

FIG. 23 is an explanatory view which shows a modulation code sequence formed by a modulating operation according to a third embodiment;

FIG. 24 is a table 4 which provides DSV control codes to a modulation code sequence at regular intervals according to a third embodiment;

FIGS. 25(a) to 25(e) are explanatory views which show insertion of a DSV control code into a modulation code sequence when last two bits of a modulation code block preceding a connection code are both 0s and first two bits of the following modulation code are both 0s;

FIGS. 26(a) to 26(e) are explanatory views which insertion of a DSV control code into a modulation code sequence when either of last two bits of a modulation code block preceding a connection code is a 1 and any one of first five bits of the following modulation code is a 1;

FIGS. 27(a) to 27(e) are explanatory views which insertion of a DSV control code into a modulation code sequence when either of last two bits of a modulation code block preceding a connection code is a 1 and first five bits of the following modulation code are all 0s;

FIGS. 28(a) to 28(e) are explanatory views which insertion of a DSV control code into a modulation code sequence when last five bits of a modulation code block preceding a connection code are all 0s and either of first two bits of the following modulation code is a 1;

FIGS. 31(a) to 31(d) are explanatory views which show an example wherein a substitutive modulation code is substituted for an original modulation code, according to a fourth embodiment;

FIGS. 32(a) to 32(g) are explanatory views which show assignment of a substitutive modulation code when a preceding modulation code block ends with five consecutive 0s;

FIGS. 33(a) to 33(e) are explanatory views which show assignment of a substitutive modulation code when a bit preceding a connection code ends with a 1;

FIG. 34 is a table 5 which provides substitutive modulation codes according to a fourth embodiment;

FIGS. 35(a) to 35(e) are explanatory views which show modulation code sequences formed with original modulation codes and modulation code sequences replaced with substitutive modulation codes;

FIG. 36 is a table 6 which provides substitutive modulation codes starting with nine consecutive 0s;

FIGS. 37(a) to 37(g) are explanatory views which show formation of a modulation code sequence using substitutive modulation code ending with nine consecutive 0s;

FIGS. 38(a) to 38(e) are explanatory views which show use of substitutive modulation codes when a following modulation code starts with a 1;

FIG. 39 is a table 7 which provides code substituting conditions and bit pattern conditions of original modulation codes to be replaced with substitutive modulation codes;

FIG. 40 is a table 8 which provides substitutive modulation codes ending with nine consecutive 0s;

FIGS. 41(a) to 41(d) are explanatory views which show an example wherein an original modulation code having an odd number of 1s is replaced with a substitutive modulation code;

FIG. 42(a) is an explanatory view which shows a modulation code sequence formed by a substitutive modulation code when a preceding modulation code ends with a 1;

FIG. 42(b) is an explanatory view which shows a modulation code sequence converted by a given bit siring including a connection code for limiting Tmin;

FIG. 44 is a table 9 which provides control conditions of DSVs of modulation code sequences.

DESCRIPTION OF THE PREFERRED EMBODIMENT

Figure 12:
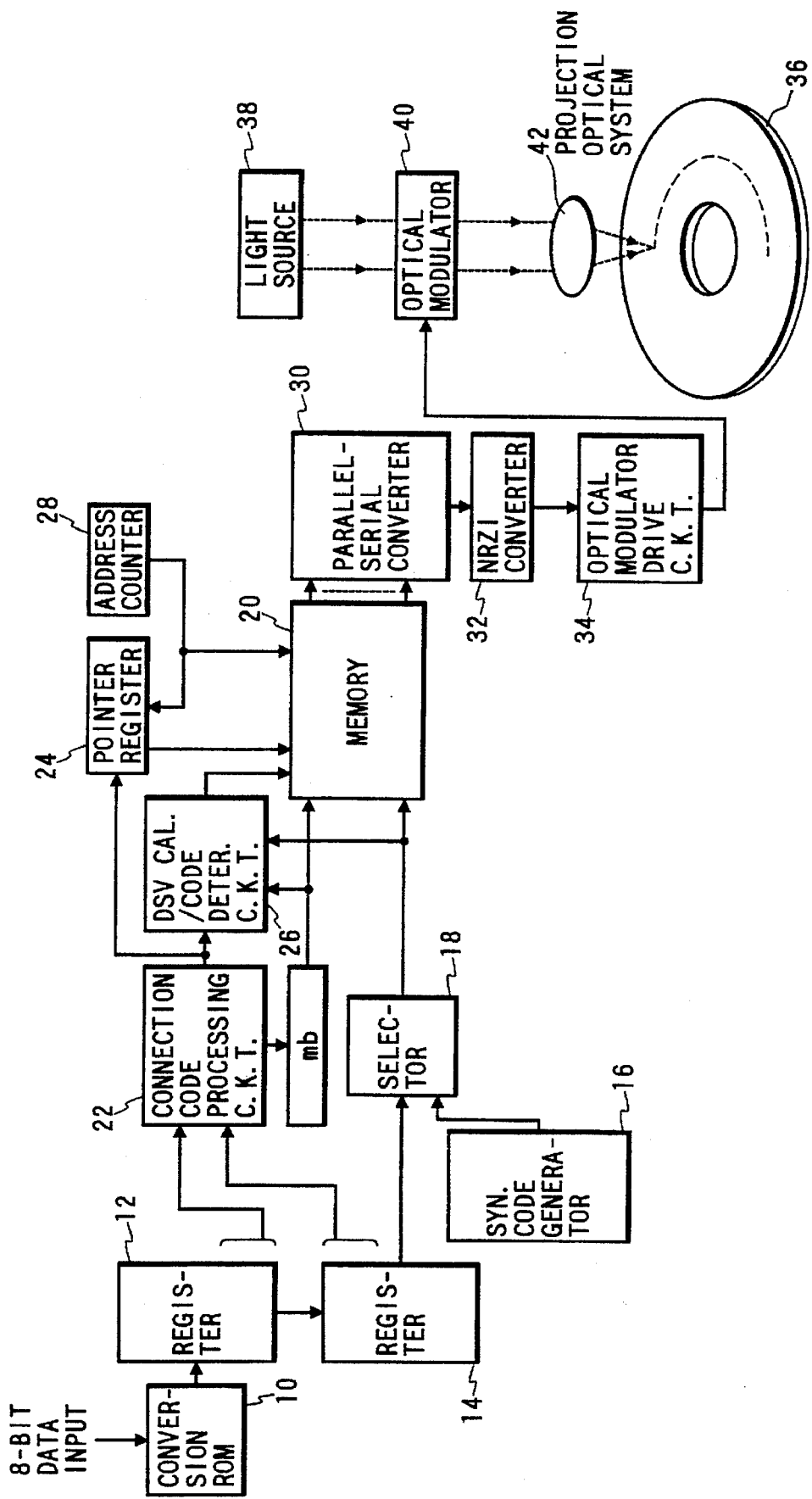
FIG. 12 is a block diagram which shows a modulator and a disc producing device using same according to a first embodiment.

A digital modulator-demodulator system (also called a digital modem system) according to the present invention will be discussed with reference to FIGS. 1 to 11, which is designed to convert 8-bit data into a 14-channel bit code using a modulation table 1, as shown in FIG. 11. This modulation table is commonly used in an EFM (eight-to-fourteen modulation) system, as already mentioned in the introductory part of this application.

In the modulation table 1, 8-bit data are expressed in decimal. For example, the decimal number 2 in the 8-bit data is converted into a modulation code expressed by 14 channel bits 10010000100000. In addition, the decimal number 128 is converted into a modulation code expressed by 14 channel bits 01001000100001. The same is true for other 8-bit data. Blocks of the 14 channel bits are, as shown in FIG. 1(a), combined with each other through a connection code mb consisting of one bit. In the following discussion, it is assumed that bits preceding the connection code mb are represented by "... b–4, b–3, b–2, and b–1" (or ... b11, b12, b13, and b14), bits following the connection code mb are represented by "b1, b2, b3, b4, ...", a minimum length between transitions Tmin is 3T (d=2 where d is the number of binary 0s arranged over the minimum length between transitions), and a maximum length between transitions Tmax is 12T (k=11 where k is the number of binary 0s arranged over the maximum length between transitions). The number of the connection code mb may be determined according to the relation of d–1, for example.

A modulating operation of the digital modem system will be described below with reference to a flowchart shown in FIG. 10.

If a modulation code block preceding the connection code mb is, as shown in FIG. 1(b), formed with a bit sequence 00100000010010 (i.e., 255 in 8-bit data), and the immediately following modulation code block is formed with a bit sequence 00100100000000 (i.e., 7 in 8-bit data), that is, the preceding modulation code block, as illustrated, ends with "... 10", a logic symbol or binary 0 is assigned to the connection code mb for meeting the condition Tmin=3T (step 14 to step 16 in the flowchart in FIG. 10). Thus, an NRZI (nonreturn to zero inverted) signal has a waveform, as shown in FIG. 1(c). For instance, in recording of data on a recording disc in the form of a string of pits or lands according to the signal waveform in FIG. 1(c), if an H-level and a L-level of the signal waveform correspond to the pit and the land, respectively, the data takes the form, as illustrated in FIG. 1(d).

If both bits preceding and following the connection code mb are logic symbols 1s, for example, a modulation code block preceding the connection code mb is 01001000100001 (i.e., 128 in 8-bit data) and the following modulation code block is 10000100000000 (i.e., 1 in 8-bit data), the condition Tmin=3T is not satisfied even though a logic symbol 0 is assigned to the connection code mb. Accordingly, if the preceding modulation code block ends with "... 1" and the following modulation code block starts with "1 ...", the logic symbol 1 is, as shown in FIG. 1(b), assigned to the connection code mb and the logic symbol 0 is assigned to both the last bit of the preceding modulation code block and the first bit of the following modulation code block (steps 10 to 12 in FIG. 10). This satisfies the condition Tmin=3T. In this case, an NRZI signal has a waveform, as illustrated in FIG. 1(c).

In the case where logic symbols 0s are arranged sequentially over the maximum length between transitions Tmax=11T across the connection code mb, for example, a modulation code block preceding the connection code mb is, as shown in FIG. 3(a), 00000100010000 (i.e., 5 in 8-bit data) and the following modulation code block is 00000001000000 (i.e., 13 in 8-bit data), meaning that the preceding modulation code block ends with 4 bits 0s and the following modulation code block stats with 7 bits 0s, if a logic symbol 0 is assigned to the connection code mb, it will cause 12 consecutive bits 0s to appear across the connection code mb, so that the length between transitions exceeds 12T (k=11).

As long as 2-bit pieces preceding and following the connection code mb are both 0, the condition Tmin=3T is satisfied if a logic symbol 1 is assigned to the connection code mb. It will be appreciated that the provision of a transition by setting the connection code mb to the 1 produces a string of 0s, thereby restricting a pit length or a lad length from being prolonged (steps 20 to 22 in FIG. 10). This is, however, undesirably viewed as being identical with the example shown in FIG. 2(b) which satisfies the condition Tmin=3T.

The processing shown in FIG. 2(b) is performed to satisfy the condition Tmin=3T only when bits preceding and following the connection code mb both represent 1s. Since the modulation table 1 shown in FIG. 11 is provided so as to meet the condition Tmin=3T, at least two consecutive 0s are always placed adjacent a 1. This means that the preceding modulation code block shown in FIG. 2(a) ends with ". . . 001", while the following modulation code block starts with "100 . . .". In other words, both bits at the third bit positions preceding and following the connection code mb represent 0s necessarily.

Accordingly, if there are at least five consecutive 0s (i.e., a bit sequence 00000) either preceding or following the connection code mb, the connection code mb is set to 1, and either of the bits at the third bit positions preceding and following the connection code mb is changed to 1 (steps 24 and 26 in FIG. 10). In the example shown in FIG. 3(a), there are more than five consecutive 0s following the connection code mb. Thus, the third bit of the modulation code block following the connection code mb is changed to 1. This makes it possible to discriminate the example shown in FIG. 3(b) from that shown in FIG. 2(b), and the condition Tmin=3T is satisfied as a whole. Note that in this example, if a bit at the third bit position (shown by an arrow of a broken line) preceding the connection code mb is changed to a 1, the condition Tmin=3T is not satisfied. FIG. 3(c) shows a signal waveform of the modulation code sequence of FIG. 3(b).

The bit change to the 1 for indicating that the length between transitions has been restricted for meeting the condition Tmax=11T may be made either at the third bit position preceding or following the connection code mb unless the bit at the third bit position shows 1. Therefore, conditions for restricting the length between transitions to satisfy Tmax=11T are as follows:

(a) at least five consecutive bits either preceding or following the connection code mb are all 0s, and (b) a modulation code block in which a 1 is not assigned to the third bit to the connection code mb has at least three consecutive 0s at bit positions adjacent the connection code mb.

Maximum Length Between Transitions Tmax

The maximum length between transitions Tmax in a modulation code sequence including the connection code mb after having been subjected to the above mentioned bit change (transition) at bit positions preceding or following the connection code mb will be discussed below.

If, for example, a modulation code of 14 channel bits shown in the modulation table 1 has ten consecutive 0s and less than eight consecutive 0s at lower and higher order positions, the maximum length between transitions Tmax in a modulation code sequence including the connection code mb will be 12T.

FIGS. 5(a) and 5(b) show an example of a modulation code sequence having Tmax=12T, which includes three modulation code blocks B1, B2, and B3. The last bit of the modulation code block B1 and the first bit of the modulation code block B2 are both 1s and thus subjected to the bit changes shown in FIG. 2(b), while the connection code mb between the modulation code blocks B2 and B3 is set to 0 since it does not meet the above mentioned bit change conditions. Thus, the modulation code blocks B1 to B3 shown in FIG. 5(a) are combined into a modulation code sequence shown in FIG. 5(b) which establishes Tmax=12T.

DSV Control

FIG. 6(a) shows an example where a modulation code block preceding the connection code mb includes a bit sequence 01001000100000 (i.e., 0 in 8-bit data) and the following modulation code block includes a bit sequence 00000001000000 (i.e., 13 in 8-bit data). As apparent from the drawing, the preceding modulation code block ends with five sequential 0s, while the following modulation code block starts with seven sequential 0s. In this case, if the connection code mb is set to 0, a sequence of bits including the connection code mb will contain thirteen consecutive 0s which exceed Tmax=12T. Accordingly, a transition is given to the modulation code sequence by setting the connection code mb to 1 for restricting a pit length or a land length from being prolonged (see FIGS. 6(b), 6(d), and 6(f).

In the above example, since bit sequences preceding and following the connection code mb both contain five consecutive 0s, bit at the third bit position either preceding or following the connection code mb may be set to 1. FIG. 6(b) shows an example where the third bit to the connection code mb in the preceding modulation code block is set to 1 (step 4 in FIG. 10). FIG. 6(d) shows an example where the third bit of the following modulation code block is set to 1 (step 26). FIG. 6(f) shows an example where the third bits to the connection code mb in the preceding and following modulation code blocks are both set to 1 (step 28).

Waveforms of NRZI signals are shown in FIGS. 6(c), 6(e), and 6(g), respectively. Comparing FIG. 6(c) with FIG. 6(g), it is found that levels or polarities at bit positions after the third bit position in the following modulation code block are reversed. It is thus possible to control the DSV following the third bit to the connection code mb. Specifically, it is possible to reserve a determination temporarily as to which of the bit transitions shown in FIGS. 6(b) and 6(f) is to be performed to calculate variations in DSV over given ranges following the third bit positions both when the bit transition shown in FIG. 6(b) is performed and when the bit transition shown in FIG. 6(f) is performed, for selecting the smaller of the DSVs.

Similarly, comparing FIG. 6(e) with FIG. 6(g), it is found that the polarities at bit positions following the third bit position preceding the connection code mb are reversed. Additionally, comparing FIG. 6(c) with FIG. 6(e), it is also found that the polarities between the third bit positions preceding and following the connection code mb are reversed. Therefore, in these cases, it is also possible to reserve the determination of the bit transition temporarily to calculate variations in DSV over given rages following the third bit position to the connection code mb in the preceding modulation code block for selecting the smaller of the DSVs.

A modulation code sequence shown in FIG. 7(a) includes eleven consecutive 0s between the last bit 1 in the preceding modulation code block and the first bit 1 in the following modulation code block if the connection code mb is 0, so that the sequence of 0s does not exceed Tmax=12T. Therefore, in this case, it is not always necessary to reverse the connection code mb, as shown in FIG. 7(b). However, it may alternatively be effective to set the connection code mb, as shown in FIGS. 7(d), 7(f), and 7(h), to 1 and change either or both of bits at the third bit positions preceding and following the connection code mb to 1.

Therefore, in the above cases, all possible bit patterns contain four different types (steps 30, 32, 34, and 36 in FIG. 10). Waveforms of NRZI signals are shown in FIGS. 7(c), 7(e), 7(g), and 7(i), respectively. It is advisable to select one from among the four different bit patterns for decreasing the DSV.

Additionally, in a modulation code sequence shown in FIG. 8(a), Tmax does not exceed 11T if the connection code mb is a 0. It is thus possible to select either of two patterns depending on whether the connection code mb is set to 0, as shown in FIG. 8(b), or 1, as shown in FIG. 8(d) (step 36 or 32). Note that if a bit at the third bit position preceding the connection code mb is set to 1, the condition Tmin=3T is not satisfied, therefore, this format cannot be selected. Signal waveforms according to the modulation code sequences shown in FIGS. 8(b) and 8(d) are illustrated in FIGS. 8(c) and 8(e), respectively. It is advisable to select one of them which has a smaller DSV.

With the above bit changes, both the transition interval and the DSV can be controlled selectively and flexibly.

Frame Synchronization Pattern

The examples discussed thus far, as apparent from the above, use the EFM table 1 which meets Tmax=12T. Thus, a bit pattern including twelve consecutive 0s at 13T will not appear. For this reason, a frame synchronization code may be formed with a bit sequence having 13T (i.e., 12 consecutive 0s) shown in FIG. 9(a).

A logic symbol or bit X in the frame synchronization code shown in FIG. 9(a) can be either a 0 or a 1, which is provided for decreasing the DSV. A determination of whether the bit X should be set to the 0 or the 1 is reserved temporarily until a subsequent frame terminates or the connection code mb, as referred to in the above explanation of the DSV control, which may optionally be changed so as to decrease the DSV, appears. Variations in DSV produced so far are calculated to determine whether the bit X is set to the 0 or the 1 for decreasing the DSV. This improves the controllability of the DSV as compared with the above mentioned DSV control only by setting the connection code mb, resulting in decreased flow-frequency components of signals. FIGS. 9(b) and 9(c) show waveforms of NRZI signals when the bit X is the 0 and the 1, respectively.

Modulator and Disc Recording Apparatus

Referring to FIG. 12, there are shown a modulator and a disc recording apparatus using the same.

8-bit data codes are inputted, in sequence, to a conversion ROM 10. The conversion ROM 10 has the modulation table 1 shown in FIG. 11 to convert the inputted 8-bit data codes into modulation codes each consisting of 14 channel bits. The modulation codes are transferred, in sequence, to registers 12 and 14, and two consecutive blocks of the modulation codes are separately stored in the registers 12 and 14. The preceding modulation code block stored in the register 14 is supplied together with a frame synchronization code outputted from a synchronization code generator 16 to a selector 18 wherein they are subjected to a given selection and supplied to a memory 20.

Several bits at higher order bit positions of the following modulation code block stored in the register 12 and several bits at lower order bit positions of the preceding modulation code block stored in the register 14 are supplied to a connection code processing circuit 22 to monitor a bit arrangement in the bit sequence for determining a logic symbol of the connection code mb temporarily. If the bit arrangement represents a bit pattern allowing the DSV control, addresses of bit positions at which logic symbols may be changed for the DSV control are determined in the connection code processing circuit 22, which are, in turn, stored in a pointer register 24 and also supplied to a DSV calculation/symbol determination circuit 26.

To the DSV calculation/symbol determination circuit 26, data of the following modulation code block is also supplied from the selector 18 in addition to the temporarily determined connection code mb and the addresses determined by the connection code processing circuit 22. Based on these data, variations in DSV produced at bit positions of logic symbol changeable address are calculated to select the optimum address for decreasing the DSV. This establishes logic symbols of the following modulation code block and the connection code mb. Note that when it is required to change the temporarily determined connection code mb, it is changed to the above determined logic symbol. If there is no need for changing the temporarily determined connection code mb, it is maintained as is. These modulating operations are performed according to the program sequence shown in FIG. 10.

The logic symbol changeable addresses are, as stated above, stored in the pointer register 24, and specified when an address counter 28 takes an address count. Logic symbols of the specified address are determined based on outputs from the DSV calculation/symbol determination circuit 26, and the ultimately fixed address is then stored in the memory 20.

14-channel bit data of the following modulation code block and the connection code mb stored in the memory 20 are outputted in parallel to a parallel-to-serial conversion circuit 30 wherein they are converted into serial data bits and then supplied to an NRZI conversion circuit 32. In the NRZI conversion circuit 32, logical symbols 1s are inverted, while logical symbols 0s are maintained as they are to produce an NRZI modulation signal, which is, in turn, supplied to an optical modulator drive circuit 34.

A light source 38 emits a beam to an optical modulator 40. The optical modulator 40 then modulates the beam from the light source 38 to output it onto a recording medium or disc 36 through a projection optical system 42. The optical modulator drive circuit 34 is responsive to the NRZI modulation signal to drive the optical modulator 40. The beam emitted from the light source 38 and modulated in the optical modulator 40 are projected onto the disc 36 to form pits and lands.

Demodulation

Figure 13:
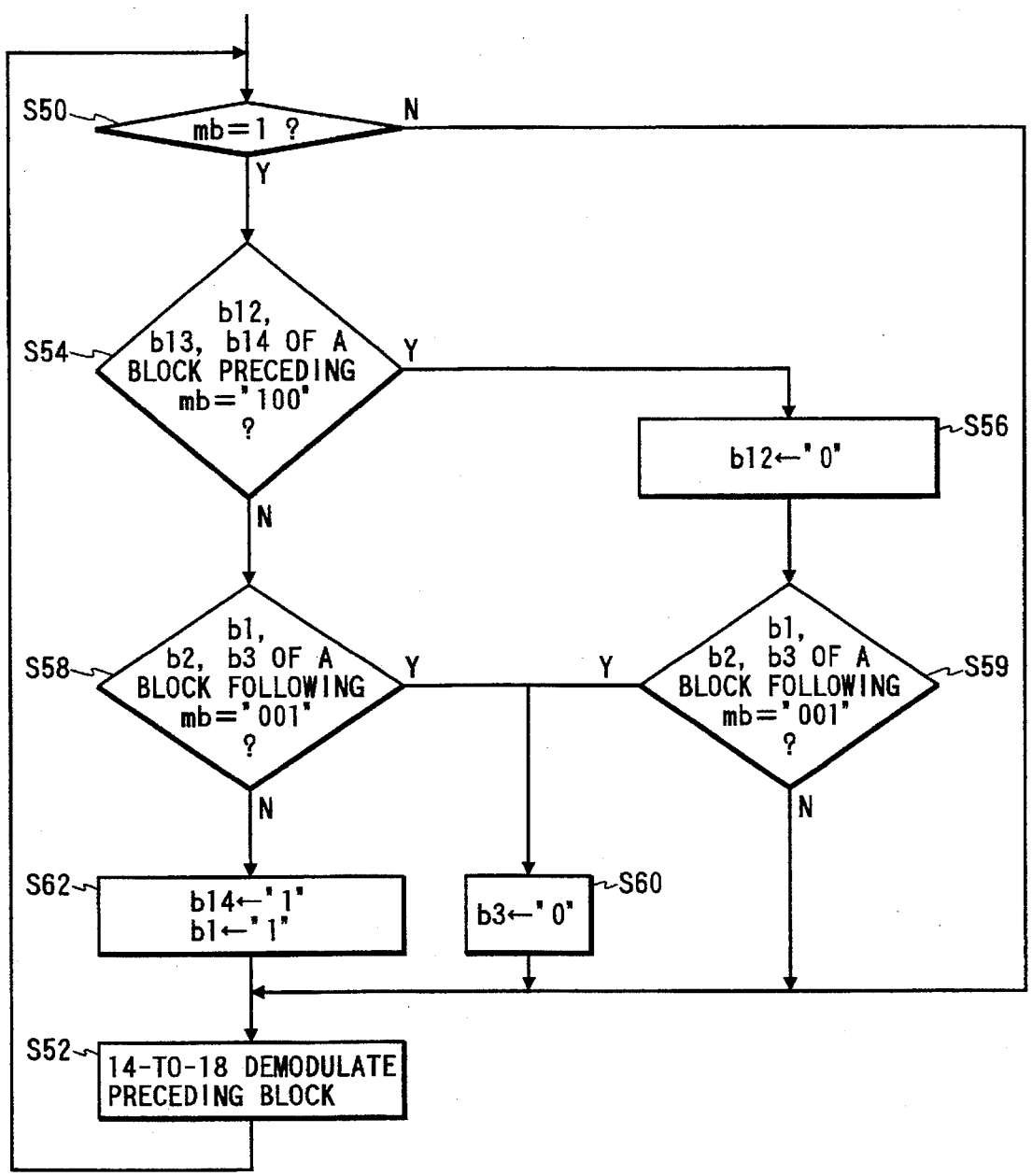
FIG. 13 is a flowchart of a demodulating operation according to a first embodiment.

FIG. 13 shows a demodulating operation which is basically performed in a reverse sequence of logical steps to the modulating operation as already discussed.

A signal sequence reproduced from a recording medium or transmitted through a channel usually contains frame synchronization codes such as that discussed above. The monitoring of the frame synchronization codes permits modulation code blocks and connection codes to be identified.

After entering the program, the routine proceeds to step 50 wherein it is determined whether the connection code mb is a logic symbol 1 or not. If a No answer is obtained, that is, the connection code mb represents a logic symbol 0 meaning that the modulation, as shown in FIG. 1(b), 7(b), or 8(b), has been performed, the routine proceeds directly to step 52 wherein a modulation code block preceding the connection code mb is demodulated in a manner wherein an inverse modulation or 14-to-8 modulation is performed according to the modulation table 1.

Alternatively, if a YES answer is obtained in step 50, then the routine proceeds to step 54 wherein it is determined whether three consecutive bits preceding the connection code mb represent a bit sequence 100 or not. If a YES answer is obtained meaning that the modulation, as shown in FIG. 6(b), 7(d), or 7(h), has been performed, then the routine proceeds to step 56 wherein the bit at the third bit position preceding the connection code mb is changed to 0. If a NO answer is obtained in step 54, then the routine proceeds to step 58 wherein it is determined whether three consecutive bits of a modulation code block following the connection code mb represent a bit sequence 001 or not. If a YES answer is obtained meaning that the modulation, as shown in FIG. 3(b), 6(d), 7(f), or 8(d), has been performed, then the routine proceeds to step 60 wherein the bit at the third bit position following the connection code mb is changed to 0. After step 56, the routine proceeds to step 59 wherein the same determination as in step 58 is made. If a YES answer is obtained meaning that the modulation, as shown in FIG. 6(f) or 7(h), has been performed, then the routine proceeds to step 53 through step 60.

If a NO answer is obtained in step 58 meaning that the modulation shown in FIG. 2(b) has been performed so that the connection code mb represents a 1 and two bits across the connection code mb (i.e., the least significant bit of the preceding modulation code block and the most significant bit of the following modulation code block) both represent 0s, then the routine proceeds to step 62 wherein those two bits across the connection code mb are both changed to 1. The routine then proceeds to step 52 wherein the 14-to-8 modulation is performed.

Demodulator

Figure 14:
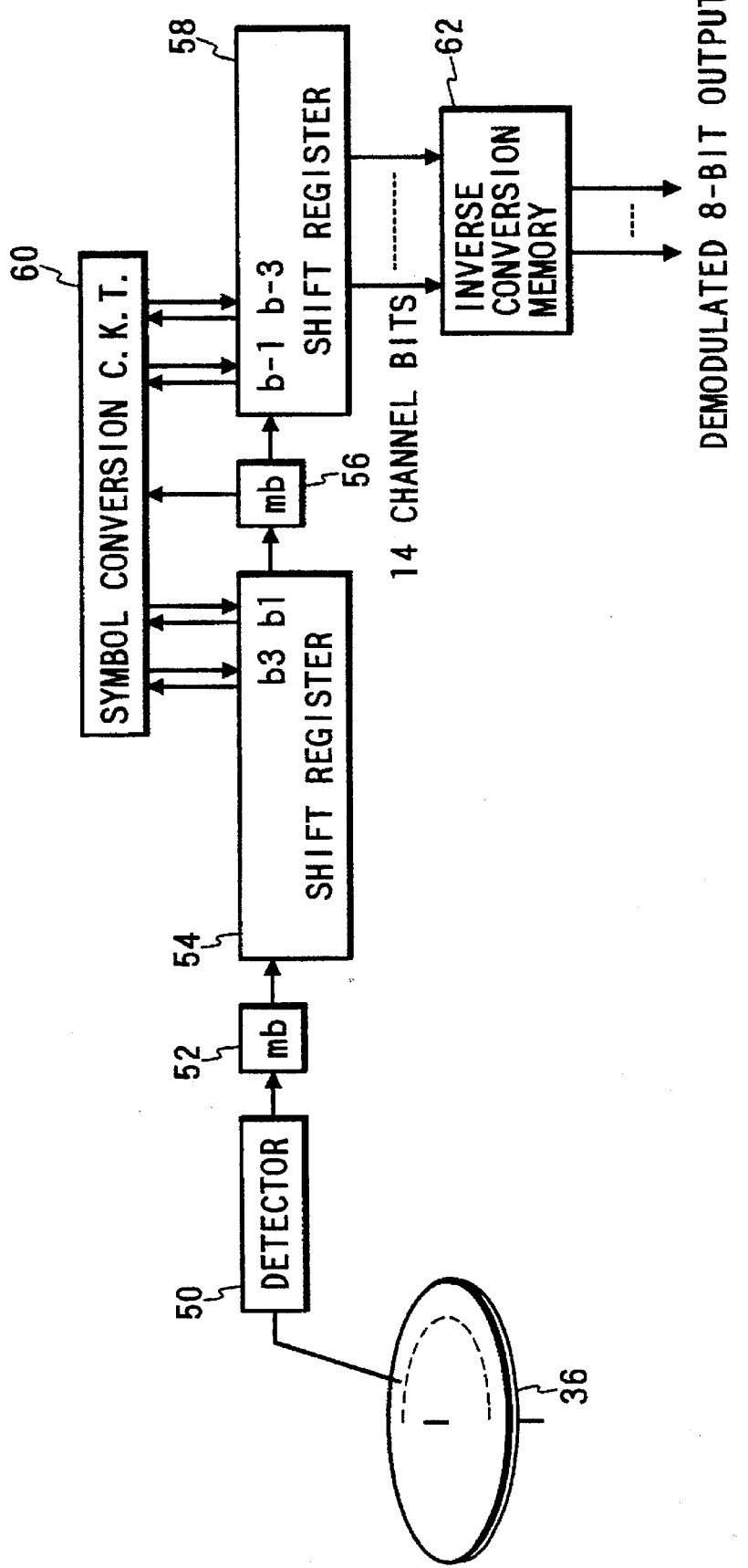
FIG. 14 is a block diagram which shows a demodulator according to a first embodiment.

FIG. 14 shows a demodulator of the invention which is used with a disc reproducing apparatus designed to reproduce signals recorded on the disc 36 through the disc recording apparatus shown in FIG. 12.

Signals read out of the disc 36 are supplied to a detector 50 wherein modulation code blocks and connection codes mb are detected by monitoring frame synchronization codes, which are stored in a connection code memory 52, a shift register 54, a connection code memory 56, and a shift register 58 in a sequential order. A symbol conversion circuit 60 looks up the connection code mb stored in the connection code memory 56, and two 3-bit pieces across the connection code mb stored in the shift registers 54 and 58.

The symbol conversion circuit 60 performs the demodulation operation shown in FIG. 13 to change logic symbols of given bits stored in the shift registers 54 and 58. Afterwards, the 14-channel bit data stored in the shift register 58 is transferred to an inverse conversion memory 62 wherein it is demodulated into 8-bit data according to the table 1 of FIG. 11.

The digital modem system of the above embodiment, as apparent from the above discussion, provides one connection code between two consecutive modulation code blocks each consisting of 14 channel bits to combine them into a sequence of digital modulation codes, and modulates it so as to decrease a DSV thereof as well as to meet given conditions of the above mentioned minimum length between transitions Tmin and the maximum length between transitions Tmax. Thus, 8-bit data is practically converted into a digital modulation code formed with 15 bits. It will be appreciated that Tmin in 8-bit data will be 3×8/15=1.6T so that a digital modulation code having a DR=1.6 can be produced. This means that the digital modem system of the invention accomplishes higher density recording than those in the EFM system explained in the introductory part of this application and a conventional eight to sixteen modulation system.

In the above first embodiment, the minimum length between transitions Tmin and the maximum length between transitions Tmax are 3T and 12T, respectively. They, however, may alternatively be changed as necessary. For example, the following combinations are useful.

(a) the number of 0s (d)=3, the number of bits of digital data (m)=8, the number of channel bits (n)=17, the number of connection codes=2(d−1), a modulation rate=8/19, Tmin= 4T, a DR=1.68 Tb, and Tmax=13T;

(b) d=4, m=8, n=19, the number of connection codes=3 (d−1), a modulation rate=8/22, Tmin=5T, a DR=1.82 Tb (T=Tb×m/n), and Tmax=17T.

Since data is usually processed for each byte, m is set to 8, however, it may alternatively be more or less than 8. Additionally, n may be set to 18, and Tmax may also be set to 14T or 15T.

According to the above modifications, d−1 connection code is provided in conversion of digital data of m bits into a digital modulation code of n bits (n>m) with Tmax=k+1. This is substantially the same as conversion of m-bit digital data into a digital modulation code of (n+d−1) bits. Additionally, in place of the NRZI used in the above embodiment, any other known signal processing techniques may alternatively be used. Moreover, the digital modem system of the invention may be used with a data recording/reproducing apparatus using a magnetic tape and a data transmission apparatus, for example.

A digital modem system according to a second embodiment will be discussed below.

The digital modem system of the first embodiment provides, in the 8-to-14 modulation, the 1-bit connection code mb between two consecutive digital modulation code blocks each consisting of 14 channel bits to combine them into a sequence of digital modulation codes, and modulates it so as to decrease a DSV thereof as well as to meet given conditions of Tmin and Tmax. This realizes a digital modulation system which practically converts 8-bit data into a digital modulation code of 15 bits. Thus, the minimum length between transitions Tmin will be 3×8/15=1.6T and a DR of the digital modulation code will also be 1.6.

In the above first embodiment, if data appears which has a pattern formed with five or more consecutive 0s at either or both of bit positions preceding and following the connection code, the DSV control can be effected by changing bit patterns at either or both of the bit positions preceding and following the connection code. The degree of occurrence of such a bit pattern is, however, not so high.

Generally, if there are modulation codes having the same DR, the smaller one in flow-frequency component of a modulation signal is preferable in view of influence on a servo system and detection of data. For this reason, the second embodiment provides a DSV control code consisting of a bit string having the shortest possible length to a digital modulation code which is, as discussed in the first embodiment, converted at an 8-to-15 conversion rate so as to have a DR of 1.6, for enhancing the controllability of the DSV to decrease low-frequency components of a modulation signal.

In the second embodiment, a DSV control code consisting of five bits is provided to a digital modulation code sequence at given intervals, for example, every 10 bytes. The selection of a bit pattern of the DSV control code cb in a manner, as will be described blow, permits reversal and non-reversal (including two-time reversals) of the polarity following the DSV control code cb to be controlled for decreasing a DSV.

The discussion below will refer to an example using the 8-to-15 modulation in the first embodiment. The DSV control code cb is inserted into a digital modulation code sequence so as to meet d=2 and k=11 as conditions of a run length in the 8-to-15 modulation.

DSV control Bit Pattern Selection Rule 1

FIG. 15 shows bit patterns of the DSV control code cb and the connection code mb according to the second embodiment. The above first embodiment inserts the connection code mb into a modulation code sequence at every 14-bit interval so that data of one block consists of 14 bits b1 to b14 plus the connection code mb. This second embodiment inserts the DSV control code cb into a modulation code sequence at given intervals. The reversal or non-reversal of polarity of a signal waveform following the DSV control code cb is accomplished by selecting a bit pattern (c1 to c5) of the DSV control code cb to decrease a DSV.

A table 2 in FIG. 16 shows bit patterns of the DSV control code cb each including five bits c1 to c5 to be provided to a modulation code preceding the connection code mb, and bit pattern selection conditions.

(1) Reversal of Polarity Using the DSV Control Code

When the polarity of a signal waveform is, as shown in [A] of the table 2, reversed, the DSV control code cb 00100 (c3=1) is inserted into a modulation code sequence. The immediately following connection code mb is maintained to be a 0. Alternatively, a bit pattern 00010 (c4=1) may be used as the DSV control code cb.

The use of the bit pattern 00100 or 00010 as the DSV control code cb, as can be seen from the bit pattern selection conditions of the table 2, does not depend on bit patterns X of the preceding and following modulation code blocks to the connection code mb, so that the polarity can always be reversed by the use of those bit patterns.

A study of the minimum length between transitions Tmin (d=2) will be made below. It is assumed that the DSV control code cb is formed with a bit sequence 00100 and the last channel bit b14 of a preceding modulation code block and the first channel bit b1 of the following modulation mode block are both 1s. The preceding modulation code block meets d=2 since two bits c1 and c2 at the higher order bit positions of the DSV control bit cb are both 0s. Similarly, the following modulation code block also meets d=2 since two bits c4 and c5 at the lower order bit positions of the DSV control bit cb are both 0s.

Alternatively, when the bit sequence 00010 is used as the DSV control bit cb, the preceding modulation code block meets d=2 since three bits c1, c2, and c3 at the higher order bit positions of the DSV control bit cb are all 0s. Similarly, the following modulation code block also meets d=2 since a bit c5 at the least significant bit position of the DSV control bit cb and the connection code mb are both 0s.

Next, a study of the maximum length between transition Tmax (k=11) will be made below. When the bit pattern 00100 is used as the DSV control bit cb and the EFM table is used as an m-to-n modulation table where m=8 and n=14, the maximum number of consecutive 0s of preceding and following modulation code blocks is eight (8). Thus, since two bits at the higher order bit positions of the DSV control bit cb are both 0s, the number of consecutive 0s of the preceding modulation code block is 8+2=10, which satisfies k=11.

Alternatively, when the bit sequence 00010 is used as the DSV control bit cb, the number of consecutive 0s of the following modulation code block is 8+3=11, which meets k=11. Likewise, the number of consecutive 0s of a bit sequence of the following modulation code block and the connection code mb of 0 is 1+1+8=10, which also meets k=10.

The use of the bit pattern containing the five bits 00100 or 00010 as the DSV control code cb permits the polarity of a signal waveform to be reversed under the conditions d=2 and k=11.

(2) Non-reversal of Polarity Using the DSV Control Code

When it is, as shown in [B] to [D] of the table 2, required to maintain the polarity as is, all bits of the DSV control code cb are set to 0s under the conditions discussed below. Alternatively, it is also possible to establish non-reversal of the polarity by setting two bits of total 6 bits of the DSV control code cb and the connection code mb to 1s to reverse the polarity two times. The bit pattern of the DSV control code cb and the condition for establishing the non-reversal of the polarity can be of the following three types.

(a) [B] of the table 2: when either of the last two bits y (i.e., b13 and b14) of the following modulation code block is a 1 and either of the first two bits y (i.e., b1 and b2) of the preceding modulation code I$_5$ block is a 1, the DSV control code cb and the immediately following connection code mb are all set to 0. FIGS. 17(a) to 17(e) show an example of such a case. FIG. 17(a) illustrates a bit pattern of a modulation code sequence which meets the condition shown in [B] of the table 2. When the polarity reversal shown in [A] of the table 2 is performed in the modulation code sequence shown in FIG. 17(a), a bit pattern shown in FIG. 17(b) is produced. Additionally, when the polarity reversal shown in [B] of the table 2 is performed in the modulation code sequence shown in FIG. 17(a), a bit pattern shown in FIG. 17(c) is produced. Waveforms of the bit patterns of FIGS. 17(b)) and 17(c) after having been subjected to NRZI are shown in FIGS. 17(d) and 17(e).

Figure 18A:
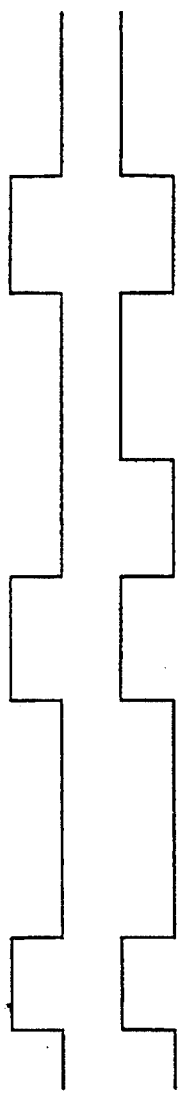

(b) [C] of the table 2: when both two bits b1 and b12 at the higher order bit positions of the preceding modulation code block are 0s, the DSV control code cb is formed by a bit sequence 00100 and the immediately following connection code mb is set to a 1. In this case, the bit pattern of the preceding modulation code block is not given a specified condition. 18(a) to 18(e) show an example of such a case. FIG. 18(a) illustrates a bit pattern of a modulation code sequence which meets the condition shown in [C] of the table 2. When the polarity reversal shown in [A] of the table 2 is performed in the modulation code sequence shown in FIG. 18(a), a bit pattern shown in FIG. 18(b) is produced. Additionally, when the polarity reversal shown in [C] of the table 2 is performed in the modulation code sequence shown in FIG. 18(a), a bit pattern shown in FIG. 18(c) is produced. Waveforms of the bit patterns of FIGS. 18(b) and 18(c) after having been subjected to NRZI are shown in FIGS. 18(d) and 18(e).

Figure 19A:
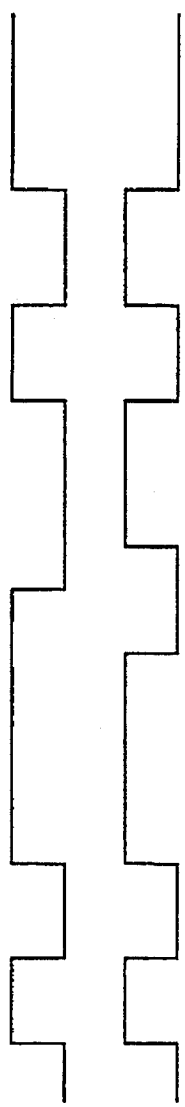

(c) [D] of the table 2: when both two bits b13 and b14 at the lower order bit positions of the preceding modulation code block are 0s, the DSV control code cb is formed with a bit sequence 10010 and the immediately following connection code mb is set to a 0. In this case, the bit pattern of the left modulation code block is not given a specified condition. 19(a) to 19(e) show an example of such a case. FIG. 19(a) illustrates a bit pattern of a modulation code sequence which meets the condition shown in [D] of the table 2. When the polarity reversal shown in [A] of the table 2 is performed in the modulation code sequence shown in FIG. 19(a), a bit pattern shown in FIG. 19(b) is produced. Additionally, when the polarity reversal shown in [D] of the table 2 is performed in the modulation code sequence shown in FIG. 19(a), a bit pattern shown in FIG. 19(c) is produced. Waveforms of the bit patterns of FIGS. 19(b) and 19(c) after having been subjected to NRZI are shown in FIGS. 19(d) and 19(e).

When the last two bits b13 and b14 of the preceding modulation code block are both 0s and the first and second bits b1 and b2 of the following modulation code block are both 0s, the conditions shown in [C] and [D] of the table 2 are both encountered. Thus, the DSV control code cb and the connection code mb may be formed in the bit pattern either shown in [C] or [D].

It will be noted that as long as a modulation code sequence is subjected to a bit change of any of [B], [C], and [D] of the table 2, it meets d=2 and k=11. For example, in [B] of the table 2, the number of consecutive 0s appearing over the DSV control bit cb and the connection code mb is at least 5+1=6, which meets the minimum length between transitions Tmin (d=2). Additionally, the maximum number of consecutive 0s of a bit sequence over the preceding and following modulation code blocks including the DSV control code and the connection code mb is 5+1+2=8, which meets the maximum length between transitions Tmax (k=11). The same is true for [C] and [D] of the table 2.

DSV control Bit Pattern Selection Rule 2

The table 3 in FIG. 20 shows bit patterns used as the DSV control code cb and the connection code mb.

(1) Reversal of Polarity Using DSV Control Code

The rules for the polarity reversal shown in [A] of the table 3 is similar to that in [A] of the table 2 in that the DSV control code cb is formed in a bit pattern 00100 (c3=1) and the immediately following connection code mb is always maintained to be a 0.

(2) Non-reversal of Polarity Using DSV Control Code

When it is required to maintain the polarity as is, all bits of the DSV control code cb are set to 0 under the conditions indicated in the table 3. Alternatively, it is possible to establish non-reversal of the polarity by setting two bits of total 6 bits of the DSV control code cb and the connection code mb to 1 to reverse the polarity two times. The bit pattern of the DSV control code cb and the condition for establishing the non-reversal of the polarity can be of the following five types.

(a) [B] of the table 3: when the preceding modulation code block ends with a 1 and either of two bits b1 and b2 at the higher order bit positions of the preceding modulation code block is a 1, the DSV control code cb and the immediately following connection code mb are all set to 0s.

(b) [C] of the table 3: when the following modulation code block ends with a 1 and both two bits b1 and b2 at the higher order bit positions of the preceding modulation code block represent 0s, the DSV control code cb is formed in a bit pattern 00100 and the immediately following connection code mb is set to a 1.

(c) [D] of the table 3: when two bits b13 and b14 at the lower order bit positions of the preceding modulation code block are "1, 0" and the following modulation code block starts with a 1, the DSV control code cb and the immediately following connection code mb are all set to 0s.

(d) [E] of the table 3: when two bits b13 and b 14 at the lower order bit positions of the preceding modulation code block are "1, 0" and the following modulation code block starts with a 0, the DSV control code cb is formed in a bit pattern 01001 and the immediately following connection code mb 1s set to a 0.

(e) [F] of the table 3: when two bits b13 and b14 at the lower order bit positions of the preceding modulation code block are "0, 0", the DSV control code cb is formed in a bit pattern 10010 and the immediately following connection code mb is set to a 0. In this case, the bit pattern of the following modulation code block is not given a specified condition.

It will be noted that even If a modulation code sequence is subjected to a bit change of any of [B] to [F] in the table 3, d=2 and k=11 are satisfied. For example, in [B] of the table 3, the number of consecutive 0s of the DSV control bit cb and the connection code mb is at least 5+1=6 which meets the minimum length between transitions Tmin (d=2). Additionally, the maximum number of consecutive 0s of a bit sequence over the preceding and following modulation code blocks including the DSV control code and the connection code mb is 5+1+1=7 which meets the maximum length between transitions Tmax (k=11).

Modulator

Figure 21:
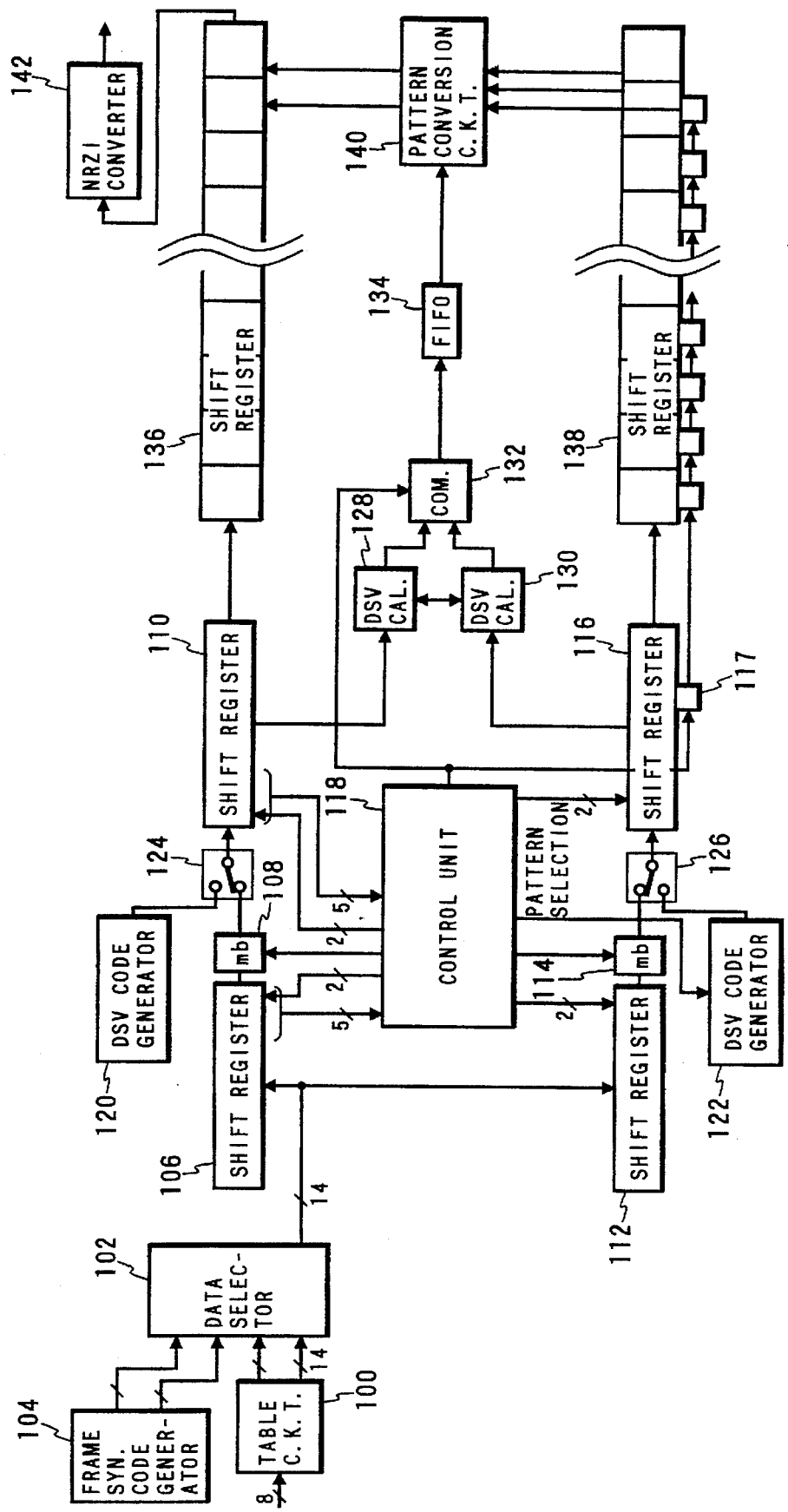
FIG. 21 is a block diagram which shows a modulator according to a second embodiment.

Referring to FIG. 21, there is shown a modulator according to the second embodiment.

8-bit data is converted through a modulation table 100 into 14-channel bit data and then transferred to a data selector 102. The data selector 102 is supplied with a frame synchronization code from a frame synchronization code generator 104, and selects the frame synchronization code when a leading portion of each frame is encountered, while it selects the 14-channel bit data when no leading portion of each frame is encountered.

The 14-channel bit data outputted from the data selector 102 is loaded into a shift register 106 wherein it is subjected to a parallel-to-serial conversion. The converted data is then transferred to a register 106 and a shift register 110. The 14-channel bit data is also transferred to a shift register 112 and then subjected to a parallel-to-serial conversion. The converted data is transferred to a register 112 and a shift register 116. Each of registers 108 and 114 stores the connection code mb.

A control unit 118 is designed to limit the minimum length between transitions Tmin and the maximum length between transitions Tmax and determine a DSV control allowable state and a bit pattern control allowable state. The control unit 118 monitors five bits at lower order bit positions of a modulation code block stored in the shift register 106 and five bits at higher order bit positions of a modulation code block stored in the shift register 110, and changes a bit pattern of a bit sequence of two modulation code blocks preceding and following the connection code mb for limitation of Tmin and Tmax. If five or more consecutive 0s appear across the connection code mb, the control unit 118 concludes that the DSV control is allowable, and outputs a DSV control flag indicative thereof to a shift register 117 and a DSV comparator 132. Additionally, bit patterns of modulation code sequences stored in the shift register 106, the register 108, and the shift register 110 are converted into ". . . 100 [1] 001 . . .", while bit patterns of modulation code sequences stored in the shift register 112, the register 114, and the shift register 116 are converted into ". . . 100 [1] 000 . . ." or ". . . 000 [1] 001 . . .".

DSV control bit generators 120 and 122 produce the DSV control codes cb each having bit patterns according to the table 2 or the table 3. When each of the DSV control codes cb is inserted into a modulation code sequence, switches 124 and 126 are connected to the DSV control bit generators 120 and 122, respectively, with timing determined by a timing circuit (not shown), so that a reversal bit pattern shown in [A] of the table 2 is prodded to the shift register 110, while a non-reversal bit pattern is provided to the shift register 116 according to [B] to [D] of the table 2 or [B] to [F] of the table 3.

A selection of the bit patterns in [B] to [D] of the table 2 or [B] to [F] of the table 3 is made by the control unit 118 according to input bit patterns from the shift register 106, the register 108, and the shift register 110.

Arithmetic circuits 128 and 130 determine DSVs of bit sequences supplied from the shift registers 110 and 116, respectively. When the control unit 118 determines that the DSV control is allowable and when the DSV control code cb is prodded, the DSV control flag indicative of a DSV control allowable condition is supplied to the shift register 116 and then added to its data block. The DSV comparator 132 compares the two DSVs calculated by the arithmetic circuits 128 and 130 to provide a DSV flag indicative of the smaller of the DSVs to an FIFO 134.

The bit sequence stored in the shift register 110 is transferred to a shift register 136. The bits sequence of the shift register 136 is transferred along with the DSV control flag to a shift register 138. When the DSV flag of the FIFO 134 indicates that the bit pattern of the modulation code sequence stored in the shift register 116 which has undergone the non-reversal bit change, has the smaller DSV at the time the DSV control flag indicates the DSV control allowable condition after a time delay during which the DSV control code cb is inserted, a pattern conversion circuit 140 replaces the bit pattern stored in the shift register 136 with the bit pattern stored in the shift register 138. The replaced bit pattern is then transferred to an NRZI conversion circuit 142 wherein it is subjected an NRZI conversion to produce an NRZI signal. The NRZI signal is then recorded on a recording medium such as a disc or outputted through a channel, for example.

Demodulator

Figure 22:
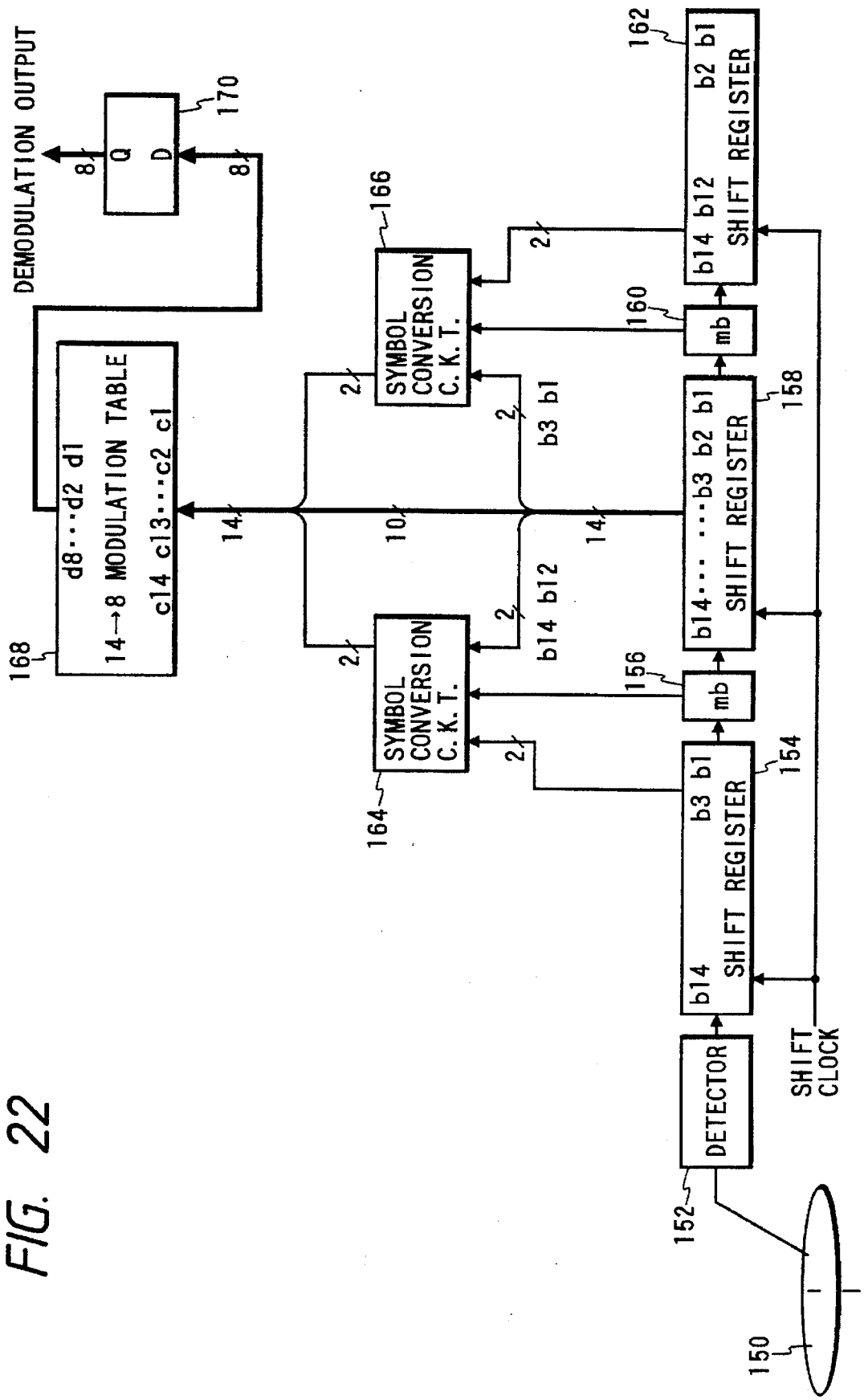
FIG. 22 is a block diagram which shows a demodulator according to a second embodiment.

Referring to FIG. 22, there is shown a demodulator according to the second embodiment which is designed to basically perform a reverse modulating operation to that of the modulator shown in FIG. 21. A signal sequence reproduced from a recording medium or transmitted through a channel usually contains frame synchronization codes such as that discussed above. The monitoring of the frame synchronization codes permits modulation code blocks and connection codes to be found.

Signals recorded by, for example, the modulator shown FIG. 21 onto a disc 150 are detected by a detector 152. The detected signals then stored in a shift register 154, a register 156, a shift register 158, a register 160, and a shift register 162 sequentially while being shifted. The registers 156 and 160 store therein the connection codes mb, respectively. The storing of the signals to the shift registers 154, 158, and 162 is prohibited during a time corresponding to a bit length of the DSV control code cb, so that data bit sequences excluding the DSV control code cb are stored in the shift registers 154, 158, and 162, respectively. This is because the DSV control code cb is provided only for the propose of the DSV control, and its bit pattern is independent of demodulation.

A symbol conversion circuit 164 receives five bits consisting of two bits b1 and b3 at front bit positions (i.e., higher order positions) of a thirdly detected modulation code block stored in the shift register 154, a bit of the connection code mb stored in the register 156, plus two bits b12 and b14 at rear bit positions (i.e., lower order positions) of the central or second detected modulation code block stored in the shift register 158. Similarly, a symbol conversion circuit 166 receives five bits containing two bits b1 and b3 at front bit positions of the second detected modulation code block stored in the shift register 158, a bit of the connection code mb stored in the register 160, plus two bits b12 and b14 at rear bit positions of the first detected modulation code block stored in the shift register 162.

Each of the symbol conversion circuits 164 and 166 monitors the inputted bits to convert the right and left 3-bit pieces to the connection code mb into any one of the following bit patterns, if the connection code mb is a 1.

(1) if "000 [1] 000", then "001 [] 100";
(2) if "100 [1] ...", then "000 [] ..."; and
(3) if "... [1] 001", then "... [] 000".

Of the 14-channel bit data stored in the shift register 158, 10 bits at central bit positions and the first and last 2-bit pieces which have been symbol-converted by the symbol conversion circuits 164 and 166 are supplied to a modulation table 168 so that they are demodulated into an 8-bit data code. The demodulated 8-bit data code is then outputted through a D-flip-flop 170.

While in both the tables 2 and 3, the DSV control code cb is arranged ahead of the connection code mb, it may alternatively be arranged following the connection code mb. This also satisfies d=2 and k=11.

A third embodiment will be discussed below which is designed to insert the DSV control code cb into a modulation code sequence at regular intervals for the DSV control in the same manner as that of the above second embodiment, however, different from the second embodiment in that the DSV control code cb is formed in a 4-bit pattern. Note that the third embodiment performs the same 8–15 modulation as that discussed in the first embodiment.

DSV control Bit Pattern Selection Rule

FIG. 23 shows bit patterns of the DSV control code cb and the connection code mb according to the third embodiment. The above first embodiment inserts the connection code mb into a modulation code sequence at every 14-bit interval so that data of one block consists of 14 bits b1 to b14 plus the connection code mb, while the third embodiment further inserts the DSV control code cb into a modulation code sequence at given intervals. The reversal or non-reversal of polarity of a signal waveform following the DSV control code cb is accomplished by selecting a bit pattern (c1 to c4) of the DSV control code cb to decrease the DSV.

A table 4 in FIG. 24 shows bit patterns for the DSV control code cb each including four bits c1 to c4 for insertion into a modulation code sequence at a bit position preceding the connection code mb, and their bit pattern selection conditions.

(1) Reversal of Polarity Using DSV Control Code

When the polarity of a signal waveform is, as shown in [A] of the table 4, reversed, the DSV control code cb 0010 (c3=1) is inserted into a modulation code sequence. The immediately following connection code mb is always maintained to be a 0.

The polarity reversal using the bit pattern 0010 shown in [A] of the table 4 is independent of the right and left bit patterns to the DSV control code cb and thus the use of the bit pattern 0010 permits the polarity to be reversed at all times.

A study of the minimum length between transitions Tmin (d=2) will be made below. It is assumed that the DSV control code cb having a bit sequence 0010 is inserted into a modulation code sequence and the last channel bit b14 of a preceding modulation code block and the first channel bit b1 of the following modulation mode block both represent 1s. The preceding modulation code block meets d=2 since two bits c1 and c2 at the higher order bit positions of the DSV control bit cb are both 0s. Similarly, the following modulation code block also meets d=2 since the least significant bit c4 of the DSV control bit cb represents a 0.

Next, a study of the maximum length between transition Tmax (k=11) will be made below. When a bit pattern 0010 is used as the DSV control bit cb and the EFM table is used as an m-to-n modulation table where m=8 and n=14, the maximum number of consecutive 0s of preceding and following modulation code blocks is eight (8). Thus, since the first two bits of the DSV control bit cb both represent the 0s, the number of consecutive 0s of the preceding modulation code block is 8+2=10 which satisfies k=11.

It will be appreciated that the use of the bit pattern containing the four bits 0010 as the DSV control code cb permits the polarity of a signal waveform to be reversed under the conditions d=2 and k=11.

(2) Non-Reversal of Polarity Using DSV Control Code

When the polarity is, as shown in [B] to [F] of the table 4, maintained as is, the DSV control code cb may be formed with any of the following three bit patterns:

(a) all bits of the DSV control code cb are set to 0s;

(b) of total five bits of the DSV control code cb and the connection code mb, any two bits are set to 1s; and (c) either of the DSV control code cb and the connection code mb is set to a 1 and a third bit to the least significant bit of a preceding modulation code block or a third bit of the following modulation code block 1s set to a 1.

These logic symbol changes cause the polarity to be reversed two times, thereby resulting in a non-reversal of the polarity of a signal waveform. The conditions for providing the above bit patterns for the DSV control code cb are shown in [B] to [F] of the table 4.

(a) [B] in the Table 4

When the last two bits b13 and b14 of a preceding modulation code block are both 0s and the first two bits b1 and b2 of the following modulation code block are also 0s, the DSV control code cb is formed with a bit pattern 100 and the immediately following connection bit cb is formed with a 1.

Figure 25A:
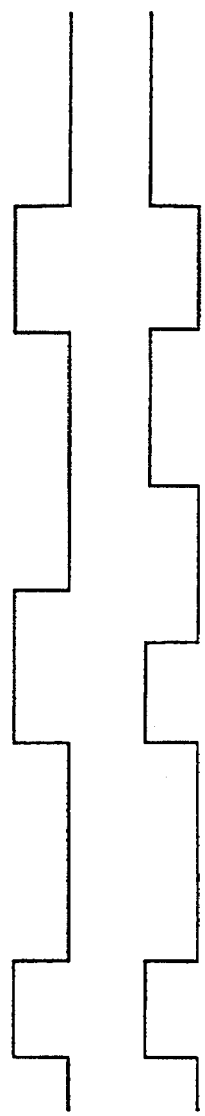

FIGS. 25(a) to 25(e) show an example of the above case. FIG. 25(a) shows a bit pattern corresponding to the condition shown in [B] of the table 4. When this bit pattern undergoes a polarity reversal shown in [A] of the table 4, it results in a bit pattern shown in FIG. 25(b). In addition, when the bit pattern of FIG. 25(a) undergoes a polarity non-reversal shown in [B] of the table 4, it results in a bit pattern shown in FIG. 25(c). Waveforms of NRZI signals according to the bit patterns of FIGS. 25(b) and 25(c) are shown in FIGS. 25(d) and 25(e), respectively.

(b) [C] in the Table 4

When either of the last two bits b13 and b14 of a preceding modulation code block is a 1 and any one of first five bits of the following modulation code block is a 1, all bits of the DSV control code cb and the connection code mb are set to 0s.

FIGS. 26(a) to 26(e) show an example of the above case. FIG. 26(a) shows a bit pattern corresponding to the condition shown in [C] of the table 4. When this bit pattern undergoes the polarity reversal shown in [A] of the table 4, it results in a bit pattern shown in FIG. 26(b). In addition, when the bit pattern of FIG. 26(a) undergoes a polarity non-reversal shown in [C] of the table 4, it results in a bit pattern shown in FIG. 26(c). Waveforms of NRZI signals according to the bit patterns of FIGS. 26(b) and 26(c) are shown in FIGS. 26(d) and 26(e), respectively.

(c) [D] in the Table 4

When any one of last five bits b10 to b14 of a preceding modulation code block is a 1 and either of first two bits b1 and b2 of the following modulation code block is a 1, all bits of the DSV control code cb and the connection code mb are set to 0s.

(d) [E] in the Table 4

When either of last two bits of a preceding modulation code block is a 1 and first five bits b1 to b5 of the following modulation code block all represent 0s, the DSV control code cb is formed by 0000 and the immediately following connection code mb and a third bit of the following modulation code block are both set to 1s.

FIGS. 27(a) to 27(e) show an example of the above case. FIG. 27(a) shows a bit pattern meeting the condition shown in [E] of the table 4. When this bit pattern undergoes the polarity reversal shown in [A] of the table 4, it results in a bit pattern shown in FIG. 27(b). In addition, when the bit pattern of FIG. 27(a) undergoes a polarity non-reversal shown In [E] of the table 4, it results in a bit pattern shown in FIG. 27(c). Waveforms of NRZI signals according to the bit patterns of FIGS. 27(b) and 27(c) are shown in FIGS. 27(d) and 27(e), respectively.

(d) [F] in the Table 4

When last five bits of a preceding modulation code block are all 0s and either of first two bits b1 and b2 of a following modulation code block is a 1, the DSV control code cb is formed by 1000 and the immediately following connection code mb is set to a 0, and a third bit b12 to the least significant bit of a preceding modulation code block is set to a 1.

FIGS. 28(a) to 28(e) show an example of the above case. FIG. 28(a) shows a bit pattern meeting the condition shown in [F] of the table 4. When this bit pattern undergoes the polarity reversal shown in [A] of the table 4, it results in a bit pattern shown in FIG. 28(b). In addition, when the bit pattern of FIG. 28(a) undergoes a polarity non-reversal shown in [F] of the table 4, it results in a bit pattern shown in FIG. 28(c). Waveforms of NRZI signals according to the bit patterns of FIGS. 28(b) and 28(c) are shown in FIGS. 28(d) and 28(e), respectively.

It will be noted that any bit conversions shown in [B] to [F] of the table 4 assure that a modulation code sequence satisfies d=2 and k=11.

Modulator

A modulator according to the third embodiment is substantially the same as the one shown in FIG. 21 of the second embodiment, however, different therefrom in that DSV control code generators 120 and 122 provide the DSV control codes cb according to the table 4.

In operation, when the DSV control code cb is inserted into a modulation code sequence, the timing switches 124 and 126 are switched with timing determined by a timing circuit (not shown) to connect the DSV code generators 120 and 122 with the registers 110 and 116, respectively. The DSV control code generator 120 provides the DSV control code having the polarity-reversing bit pattern shown in [A] of the table 4 to the shift register 110, while the DSV control code generator 122 provides the DSV control code having the polarity non-reversing bit pattern according to [B] to [F] of the table 4 to the shift register 116. A selection of the bit patterns shown in [B] to [F] of the table 4 is made by the control unit 118 based on input bit patterns from the shift register 106, the register 108, and the shift register 110. Other operations are the same as those discussed in the second embodiment, and explanation thereof in detail will be omitted here.

Demodulating Operation

Figure 29:
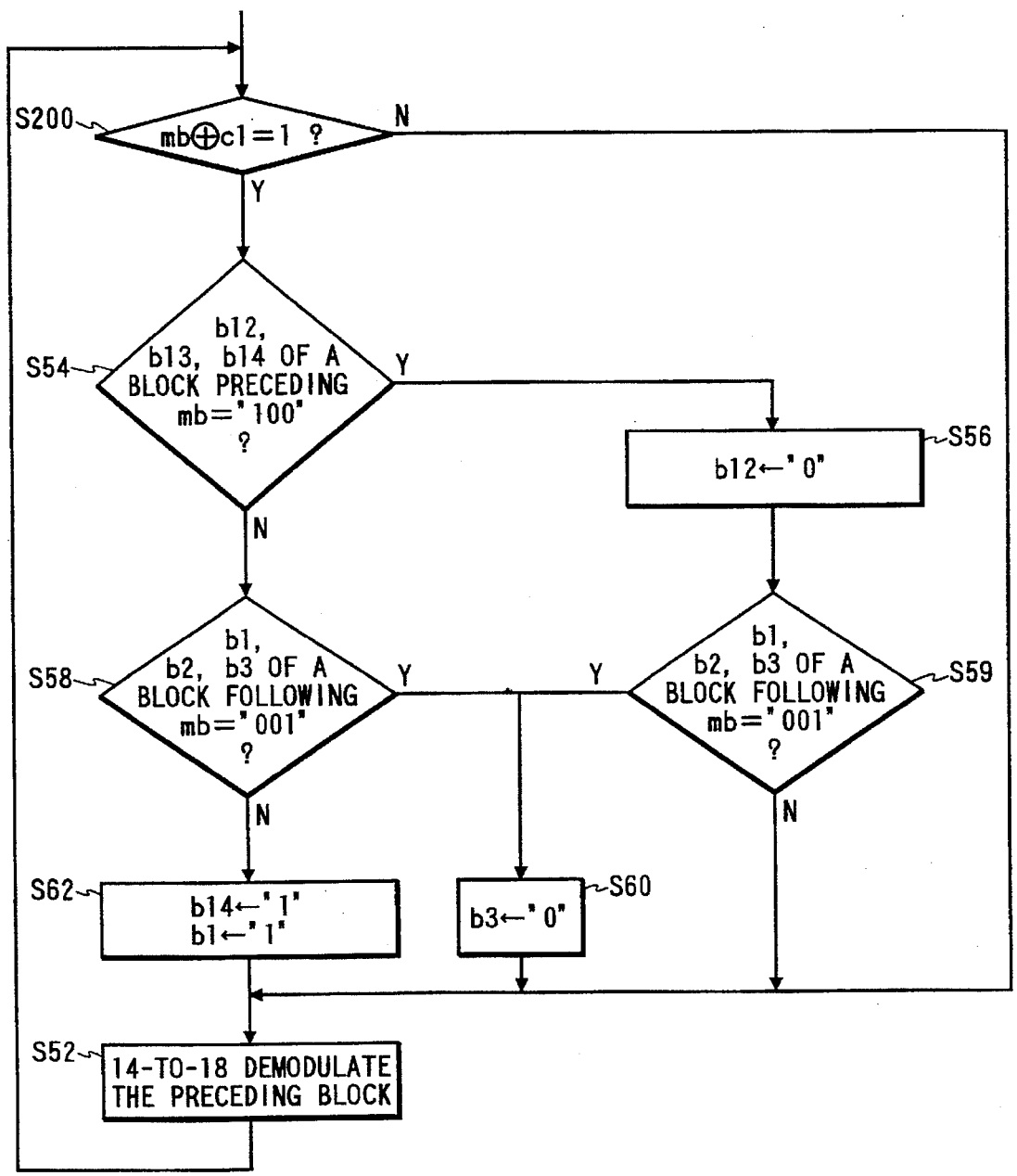
FIG. 29 is a flowchart of a demodulating operation according to a third embodiment.

FIG. 29 shows a demodulating operation which is basically performed in the reverse sequence of logical steps to the modulating operation, as discussed above. Note that the DSV control code is inserted into a modulation code sequence at regular intervals, e.g., every 10 bytes. A modulation code sequence into which the DSV control code is inserted is demodulated according to logical steps shown in FIG. 28, while a modulation code sequence having no DSV control code is demodulated according to the logical steps as discussed with reference to FIG. 13. The flowchart shown in FIG. 29 is different from the one shown in FIG. 13 only in step 200.

In step 200, when the connection code mb is arranged adjacent the DSV control code cb, the exclusive OR is applied to a bit of the connection code mb and the first bit c1 of the DSV control code cb. Based on this result, a demodulating operation is performed. In other words, the bit patterns of the connection code mb and the DSV control code mb shown in the table 4 are so determined as to allow such a demodulating operation to be implemented.

(a) [A], [C], and [D] in the Table 4

The first bit c1 of the DSV control code cb and the connection code mb are both 0 (c1=mb=0), and the exclusive OR applied thereto (c1 and mb) is 0. Thus, a preceding modulation code and the following modulation code are both modulated according to 14-to-8 modulation table ("NO" in step 200 to step 52).

(b) [B] in the Table 4

The first bit c1 of the DSV control code cb and the connection code mb are both 1 (c1=mb=1), and exclusive OR applied thereto is 0. Thus, a preceding modulation code and the following modulation code are both modulated according to 14-to-8 modulation table ("No" in step 200 to step 52).

(c) [E] and [F] in the Table 4

Either of the first bit of the DSV control code c1 and the connection code mb represents a 1. Thus, the exclusive OR applied thereto is 1 ("Yes" in step 200). Specifically, when logic symbols of both of a preceding modulation code block and the following modulation code block are not changed (i.e., [A] to [D] in the table 4), the exclusive OR applied to c1 and mb is 0, while when the logic symbols of either of the preceding modulation code block and the following modulation code are changed (i.e., [E] or [F] in the table 4), the exclusive OR applied to c1 and mb is 1.

In [E] in the table 4, three bits b12, b13, and b14 preceding the connection code mb are not "1,0,0". Therefore, a NO answer is derived in step 54. The routine then proceeds to step 58 wherein it is determined whether three bits b1, b2, and b3 following the connection code mb is 001 or not. If a YES answer is obtained, the routine proceeds to step 60 wherein the bit b3 is changed to a 0, and then the preceding modulation code block is subjected to a 14-to- 8 modulation in step 52. In [F] in the table 4, if the three bits b12, b13, and b14 preceding the connection code mb are "1,0,0", the bit b12 is changed to a 0, and then the preceding modulation code block is subjected the 14-to-8 modulation in step 52.

Note that the flowchart in FIG. 29 does not include step 62 shown in FIG. 13, however, it is to be performed for a modulation code block including no DSV control code cb.

Demodulator

Figure 30:
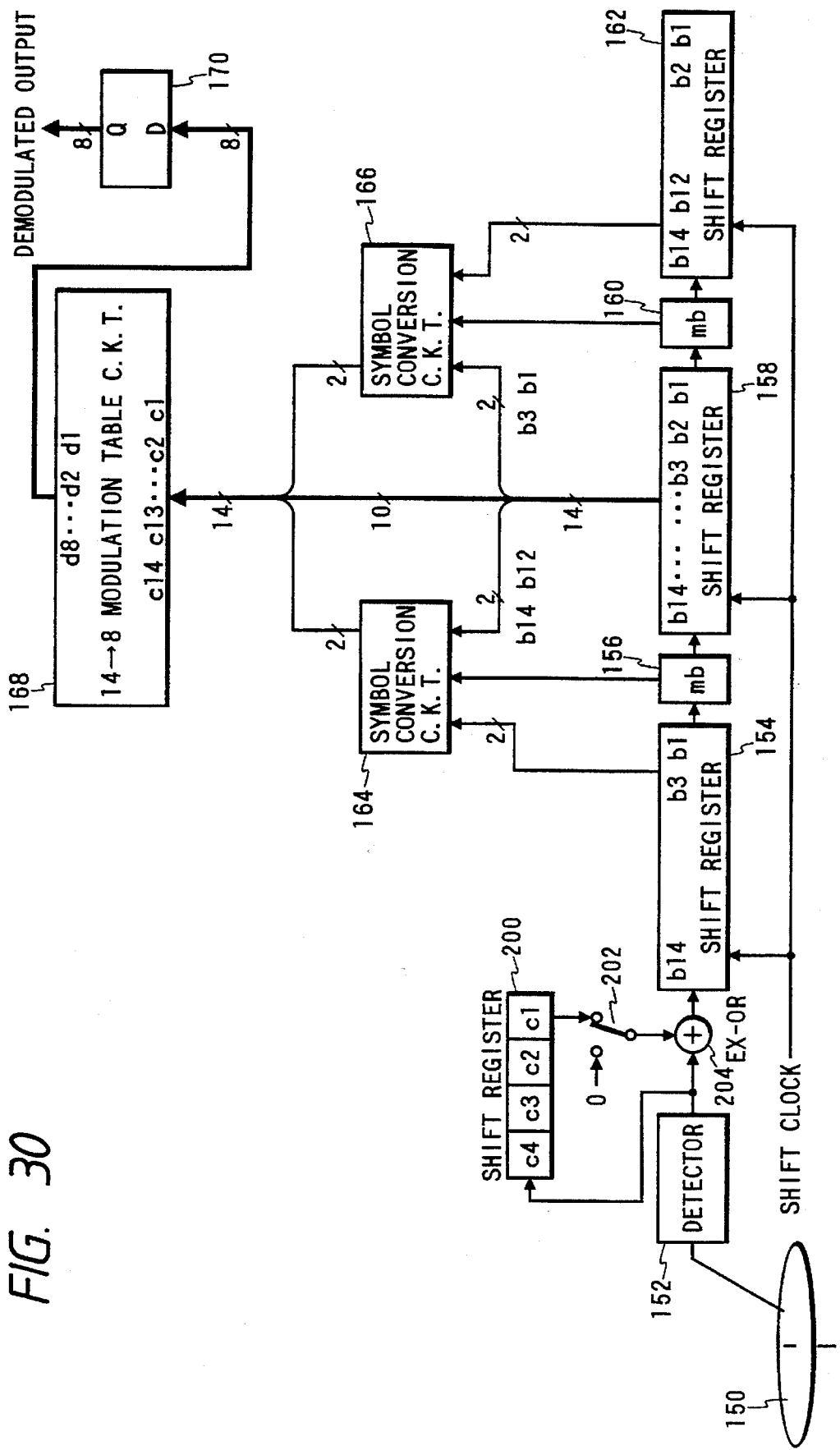
FIG. 30 is a block diagram which shows a demodulator according to a third embodiment.

FIG. 30 shows a demodulator according to the third embodiment which is different from that of the second embodiment shown in FIG. 22 only in that a shifter register 200, a switch 202, and an exclusive OR circuit 204 are further provided.

Data detected by the detector 152 is sequentially stored in the shift register 154, the register 156, the shift register 158, the register 160, and the shift register 162. During a time when the DSV control code cb is inserted into the data, the DSV control code cb is stored in the shift register 200 without being stored in the shift register 154. Thus, the data excluding the DSV control code is stored in the registers 154 to 162.

In order to perform an operation in step 200 shown in FIG. 29, the switch 202 is switched to connect the shift register 200 and the exclusive OR circuit 204 in response to the connection code mb following the DSV control code cb outputted from the detector 152. This causes the connection code mb and the DSV control code cb to be inputted to the exclusive OR circuit 204 wherein an exclusive OR operation is calculated. The result is transferred to the shift register 154. This allows the symbol conversions to be performed in the symbol conversion circuits 164 and 166 based on logic symbols of the Connection codes mb stored in the registers 156 and 160, respectively, regardless of whether they immediately follow the DSV control code cb or not. Specifically, reverse symbol conversions to those shown in [E] and [F] of the table 4 are performed based on a logic symbol of the connection code mb.

While in the table 4, the DSV control code cb is placed ahead of the connection code mb, if the DSV control code cb is placed following the connection code mb, d=2 and k=10 are satisfied.

The degree of freedom for the DSV control under the conditions of the maximum length between transitions Tmax and the minimum length between transitions Tmin becomes great as the number of bits of the DSV control code is increased. Increasing the number of bits of the DSV control code more than required will cause the control redundancy. In the second embodiment, the DSV control code cb is formed with five bits to facilitate easy satisfaction of the requirement of the minimum length between transitions Tmin without need for changing logic symbols of a preceding and the following modulation code blocks. In contrast, the third embodiment needs to change logic symbols of a preceding and the following modulation code blocks for meeting the requirement of Tmin since the DSV control code cb consists of four bits, however, is useful in view of the control redundancy.

A fourth embodiment will be described below.

First, bit patterns unused in the EFM table 1 shown in FIG. 11 will be discussed. A total number of bit patterns of a modulation code consisting of 14 bits which meets the requirement of d=2 is 277. Of these bit patterns, 277−256= 21 bit patterns are unused in the EFM table.

The unused bit patterns may be classified into three types below:

(a) 17 bit patterns stating with nine or more consecutive 0s or ending with nine or more consecutive 0s, e.g., 00000000000000 or 10001000000000;

(b) 3 bit patterns meeting a logic symbol condition of the EFM wherein less than eight consecutive 0s are arranged from the most significant bit position or to the least significant bit position, but having a run length of 0s between two consecutive transitions 1s which is more than 11, e.g., 10000000000010; and (c) one bit pattern meeting a logic symbol condition of the EFM table wherein less than eight consecutive 0s are arranged from the most significant bit position or to the least significant bit position, and a run length of 0s between two consecutive 1s is less than k=10, but unemployed in the EFM table.

Basic Technique for DSV Control Using a Substitutive Modulation Code

The DSV control using the above explained 21 unused bit patterns as a substitutive modulation code will first be discussed below.

When even binary 1s appear in a modulation code of 8-bit data, a modulation code containing odd binary 1s is provided as a substitutive modulation code. This allows the polarity of a signal (i.e., high and low levels, e.g., a pit and a land in a disc) formed in a recording medium by modulation code blocks to be reversed by selecting either of the original modulation code or the substitutive modulation code for the DSV control.

Specifically, any unused bit pattern in the EFM table which has even binary 1s is provided as the substitutive modulation code for an EFM code containing odd binary 1s. Conversely, any unused bit pattern which has odd binary 1s is provided as the substitutive modulation code for an EFM code containing even binary 1s. Accordingly, the use of a conversion table having substitutive modulation codes formed in the unused bit patterns permits the polarity of a modulation code sequence following 8-bit data to which a substitutive modulation code is assigned, to be reversed.

If, for instance, a modulation code placed between connection codes mb1 and mb2 is, as shown in FIG. 31(a), 01001001001000, its NRZI signal has a waveform shown in FIG. 31(b). To this modulation code, a bit pattern starting with nine or more consecutive 0s of the bit patterns unused in EFM table is assigned as the substitutive modulation code. For example, if a substitutive modulation code 00000000001000 shown in FIG. 31(c) is provided, a recorded signal thereof has a waveform shown in FIG. 31(d). Comparing the waveforms shown in FIG. 31(a) and 31(d), it is found that a signal polarity after the substitutive modulation code is used is reversed. The reason for such occurrence of a polarity reversal is that the original modulation code shown in FIG. 31(a) contains even or four logic symbols 1s, while the substitutive modulation code shown in FIG. 31(c) contains odd or one logic symbol 1.

As will be appreciated from the above, the control of the polarity of a waveform is accomplished by assigning to an original modulation code a substitutive modulation code which contains logic symbols 1s bearing the reverse relation in an even or odd number to logic symbols is contained in the original modulation code every time 8-bit data appears which has a bit pattern to which the substitutive modulation code is assigned. This achieves the DSV control.

Hereinbelow, code replacement techniques according to the above classifications of the 21 unused bit patterns will be discussed.

Replacement With an Unused Bit Pattern Starting with Nine or More 0s (1) A First Case Where a Preceding Modulation Code Block Ends With a Sequence of 0s.

The above mentioned simple assignment of any of the unused bit patterns as the substitutive modulation code will cause a modulation code sequence to have a maximum run length greater than k=10 if a preceding modulation code block ends with a sequence of 0s.

For example, assume that the preceding modulation code block, as shown in FIG. 32(a), ends with five more than consecutive 0s. In this case, if the connection code mb is set to a 0, a run length of 0s will be 10+1+5=16 which is greater than k=11 (Tmax=12). Therefore, the need arises for executing a symbol conversion in order to restrict the maximum length between transitions Tmax. In this case, useful symbol conversions may be classified into three bit patterns shown in FIG. 32(b), 32(c), and 32(d) which are demodulated into the same substitutive modulation code during a demodulating operation. The demodulation into the same substitutive modulation code is accomplished by changing bits at the third bit positions preceding and following the connection code mb into logic symbol 0 if the connection code mb is a 1, and the third bits across the connection bit mb are both 1s. Signal waveforms produced by the three bit patterns shown in FIGS. 32(b), 32(c), and 32(d) are shown in FIGS. 32(e), 32(f), and 32(g), respectively.

As stated above, it is possible to perform the symbol conversion using any one of the three bit patterns if a preceding modulation code ends with a sequence of 0s. The fourth embodiment utilizes such a fact to assign modulation codes unused during the EFM operation each containing more than nine consecutive 0s to substitutive modulation codes for modulation codes defined in the EFM table. Note that during a demodulating operation, a determination of which modulation codes the three bit patterns are assigned to as substitutive modulation codes may be made by identifying logic symbols of the connection code mb and the third bits preceding and following the connection code mb.

The assignment of the conversion bit patterns will be explained below. It is assumed that any one of the above mentioned three conversion bit patterns is assigned as a substitutive modulation code for, for example, a modulation code 01001001001000 shown in FIG. 31(a) whose number of 1s is even. The modulation code sequences replaced with the conversion bit patterns shown in FIG. 32(c) and 32(d), as can be seen from FIG. 32(f) and 32(g), both end with the reverse polarities to that of a signal waveform shown in FIG. 31(b), respectively. Conversely, the modulation bit pattern replaced with the conversion bit pattern shown in FIG. 32(b), as can be seen in FIG. 32(e), ends with the same polarity as that of a signal waveform shown in FIG. 31(b).

Therefore, it will be noted that a bit pattern which is to be replaced with the conversion bit pattern . . . 100 [1] 001 . . . shown in FIG. 32(b) be assigned as a substitutive modulation code to an 8-it data code whose modulation code has odd logic symbols 1s, and bit patterns which are to be replaced with the conversion bit patterns . . . 000 [1] 001 . . . and . . . 100 [1] 000 . . . shown in FIGS. 32(c) and 32(d) be assigned as a substitutive modulation code to an 8-bit data code whose modulation code has even logic symbols 1s. This achieves the DSV control.

Next, conditions of the maximum length between transitions Tmax (k=11) will be described. When the symbol conversion shown in FIG. 32(d) is performed, the number of consecutive 0s of the substitutive modulation code is required to be less than k=11. This is because if the number of consecutive 0s of a substitutive modulation code stating with a logic symbol 0 is more than k+1=12, a modulation code sequence does not meet the condition that the number of consecutive 0s is less than k=11 even though the connection bit mb is a 1.

In the symbol conversions shown in FIG. 32(b) and 32(c), the third bit of the substitutive modulation code is changed to a logic symbol 1. Thus, if the number of consecutive 0s of the substitutive modulation code starting with a 0 is k+3=14, the third bit symbol conversion permits a modulation code sequence to meet the condition that the number of consecutive 0s is less than k=11.

The conditions of the minimum length between transitions Tmin (d=2) will be described below. When the symbol conversion shown in FIG. 32(b) or 32(d) is performed, the last three bits of a preceding modulation code block are converted into "1,0,0". Thus, in order to meet d=2, it is necessary for the preceding modulation code block to have a bit pattern . . . 00000 wherein at least five consecutive 0s are placed at lower order bit positions. When the symbol conversion shown in FIG. 32(c) is performed, the last three bits of the preceding modulation code block is converted into "0,0,0". Thus, in order to meet d=2, it is necessary for the preceding modulation code to have a bit pattern . . . 000 where the last at least three bits are 0s. Accordingly, as long as a preceding modulation code meets the above requirements, the condition Tmin (d=2) is satisfied.

(2) A Second Case Where a Preceding Modulation Code Block Ends With a Logic Symbol 1.

In this case, a substitutive modulation code may also be formed with any of the unused bit patterns starting with nine or more consecutive 0s.

FIG. 33(a) shows an example where a modulation code block preceding the connection code mb1 ends with a logic symbol 1. A modulation code block following the connection code mb1 is replaced with a substitutive modulation code 00000000001000. Thus, a signal waveform becomes one shown in FIG. 33(b). In this example, the number of 0s placed between 1s including the connection code mb1 will be 11 which is within k=11.

In order to meet k=11 when a preceding modulation code block ends with a 1, it is necessary for a substitutive modulation code to have first consecutive 0s of a number less than k−1=10. The unused bit patterns meeting such a condition may be employed as a substitutive modulation code on condition that a preceding modulation code block ends with a 1.

For example, it is assumed that a modulation code block contains three (add number) 1s, and starts with a 1. FIG. 33(c) shows, as such an example, a modulation code block 10000100001000. In this case, according to the above discussed symbol conversion shown in FIG. 10, both bits across the connection code mb1 will be logic symbol 1, so that they are converted into 0s, while the connection code mb is converted into a 1, as shown in FIG. 33(d). Its signal waveform is shown in FIG. 33(e).

When the modulation code block 10000100001000 shown in FIG. 33(c) is replaced with the substitutive modulation code 00000000001000 shown in FIG. 33(a), it will cause a signal waveform to be varied, as shown in FIG. 33(b). Comparing this signal waveform with the one shown in FIG. 33(e), it is found that its polarity is reversed. Thus, the polarity control is accomplished by selecting the original modulation code or the substitutive modulation code. Note that in this example, the original modulation code and the substitutive modulation code both have odd logic symbols 1s.

For the above reasons, a substitutive modulation code starting with a 0 is required to have the number of consecutive 0s less than k−1=10 as a condition for controlling the DSV in the case where a preceding modulation code block ends with a 1. Additionally, it is necessary to convert an original modulation mode into a bit pattern starting with a 1, and use a substitutive modulation code having logic symbols 1s of a number which is similar in even or odd number to that of logic symbols 1s of the original modulation code.

The table 5 in FIG. 34 shows the code substituting conditions for providing substitutive modulation codes using bit patterns of the unused bit patterns in the EFM, starting with nine or more consecutive 0s and for converting bits across the connection code into four types of bit patterns, and bit pattern conditions of original modulation codes to be replaced with the substitutive modulation codes.

For example, as shown on the left side of the table 5, when a preceding modulation code ends with five or more consecutive 0s, a conversion bit pattern including the connection code mb is 100 [1] 001. In this case, there are provided eight substitutive modulation codes. The uppermost substitutive modulation code 00000000010001 can be substituted for a modulation code including an even number of 1s. In addition, as shown on the rightmost side, when the preceding modulation code ends with a 1, the conversion bit pattern is 001 [0] 000. In this case, there is provided five substitutive modulation codes. The lowermost substitutive modulation code as one of the five codes 00000000001000 can be substituted for a modulation code stating with a 1 and having an odd number of 1s.

The table 5 provides the substitutive modulation codes for twenty seven 8-bit data codes in total when k=11 is satisfied. If k is set to twelve or more, it is possible to provide the substitutive modulation codes to further increased 8-bit data codes when a bit string including the connection code mb is to be converted into the conversion bit pattern 100 [1] 000 or 001 [0] 000 as shown on the right side of the table 5.

The relation between a substitutive modulation code and an original modulation code taking a bit pattern of the following modulation code into account will be discussed. As an example, it is assumed that a modulation code is 01000010000010 and the immediately following modulation code is 00000001001001. In this case, when the modulation code 01000010000010 is replaced with a bit pattern 00000000010000 unused in the EFM and then converted by the conversion bit pattern 100 [1] 001 shown on the left side of the table 5, a resultant modulation code sequence will be formed in a bit pattern as shown in FIG. 35(a). FIG. 35(b) shows a modulation code sequence including the original modulation code 01000010000010 without use of the substitutive modulation code.

As mentioned above, the immediately following modulation code starts with seven consecutive 0s and the substitutive modulation code ends with four consecutive 0s. Thus, if the connection code mb2 is set to 0, a modulation code sequence has twelve consecutive 0s, which exceeds k=11. It is thus necessary to set the connection code mb2 to 1, as shown in FIG. 35(a) for satisfying Tmax (k=11). On the other hand, since the original modulation code shown in FIG. 35(b) ends with only one logic symbol 1, the connection code mb1 is set to 0. This will cause a modulation code sequence to have a bit string of 0s within Tmax (k=11). Note that if the connection code mb2 is set to 1, d=2 is not satisfied.

As will be appreciated, a logic symbol of the following connection code mb2 is required to be changed between when a substitutive modulation code is used and when not used, according to a bit pattern of the following modulation code. This is quite inconvenience. Thus, it is advisable that a run length of the last 0s of the substitutive modulation code be matched with that of the original modulation code for the simplicity of symbol conversion of the following connection code mb2.

As another example, it is assumed that a modulation code is 0100001000001 ending with a 1, and the immediately following modulation code is 10000100000000 starting with a 1. In this case, when the modulation code 0100001000001 is replaced with a bit pattern 00000000010001 unused in the EFM and then converted by the conversion bit pattern 100 [1] 001, a resultant modulation code sequence will be formed in a bit pattern, as shown in FIG. 35(c), which has two bits 1s preceding and following the connection code mb2, respectively. Thus, a bit string consisting of these two bits and the connection code mb2 are set to one shown in FIG. 35(d) for satisfying d=2.

Additionally, when the original modulation code is, as shown in FIG. 35(e), 01000010000010, both two bits preceding and following the connection code mb2 will not be 1 and thus the connection code mb2 is set to 0. Also, in this case, a logic symbol of the following connection code mb2 is required to be changed between when a substitutive modulation code is used and when not used, according to a bit pattern of the following modulation code. It is thus advisable that a run length of 0s at the last portion of the substitutive modulation code be matched with that of the original modulation code for the simplicity of symbol conversion of the following connection code mb2.

The table 6 in FIG. 36 shows assignment of bit patterns (i.e., substitutive modulation codes) starting with nine or more consecutive 0s unused in the EFM, to modulation codes involved in the EFM table 1 of FIG. 11. In the table 6, a number indicated ahead of each of the modulation codes represents 8-bit data in decimal. For instance, replacement of the modulation code 01001000100001 (128) with the substitutive modulation code 00000000010001 is allowable when a preceding modulation code block ends with five or more consecutive 0s. In this case, a conversion bit pattern is 100 [1] 001.

In the examples shown in the table 6, bit patterns are provided to the substitutive modulation codes and the modulation codes consists so that they may meet the conditions shown in the table 5 and the condition wherein run lengths of 0s at the last portion of the substitutive modulation codes are matched with those of the original modulation codes.

Additionally, as shown in the table 6, the run lengths of 0s at the beginning portions of the modulation codes are all less than 2=k–9. Thus, if a preceding modulation code block ending with 8 consecutive 0s is followed by a modulation code block starting with three or more consecutive 0s, a modulation code sequence will have the number of 0s greater than k=11. This requires that the connection code be set to 1 in order to meet k=11. The run length of 0s at the beginning portion of each of the modulation codes limited to less than 2=k–9. This, however, facilitates replacement of the modulation code with the substitutive modulation code.

Replacement With an Unused Bit Pattern Ending with Nine or More 0s (1) A First Case Where a Preceding Modulation Code Block Ends With a Sequence of 0s.

FIGS. 37(a) to 37(g) correspond to FIGS. 32(a) to 32(g). FIGS. 37(b) to 37(d) show conversion bit patterns provided to a modulation code sequence whose part of bit string is replaced with a bit pattern 0010000000000 ending with nine or more consecutive 0s of bit patterns unused in the EFM. Likewise to FIGS. 32(b) to 32(d), the conversion bit patterns can be of three types, which are different from those shown in FIGS. 32(b) to 32(d) only in that they are substituted for a string of seven bits including the connection code mb2, and explanation thereof in detail will be omitted here.

(2) A Second Case Where a Following Modulation Code Block Starts With a 1.

FIGS. 38(a) to 38(e) correspond to FIGS. 33(a) to 33(e), and show substitutive modulation codes allowed to be used when the following modulation code block starts with a 1. A conversion bit pattern is provided to a string of three bits including the connection code mb2.

The table 7 in FIG. 39 shows the code substituting conditions for providing substitutive modulation codes using bit patterns of unused bit pattern in the EFM, starting with nine or more consecutive 0s and converting a given bit string across the connection code into four types of bit patterns, and bit pattern conditions of original modulation codes to be replaced with the substitutive modulation codes. The table 7 provides the substitutive modulation codes for twenty seven 8-bit data codes in total when k=11 is satisfied.

The table 8 in FIG. 40 shows assignment of bit patterns (i.e., substitutive modulation codes) starting with nine or more consecutive 0s unused in the EFM to modulation codes involved in the EFM table 1 of FIG. 11. In the table 8, a number indicated ahead of each of the modulation codes represents 8-bit data in decimal.

In the examples shown in the table 8, bit patterns are provided to the substitutive modulation codes so that they may meet the conditions shown in the table 7 and the condition wherein run lengths of 0s at the beginning portions of the substitutive modulation codes are matched with those of the original modulation codes. The run length of 0s at the ending portion of each of the original modulation codes is limited to less than 2=k–9.

Replacement with an Unused Bit Pattern Meeting an EFM Table Condition Where the Number of Consecutive 0s at an End Portion is Less than Eight, but Having a Run Length of 0s Between 1s More Than 11

Bit patterns unused in the EFM meeting the above conditions are as follows:

(1) 10000000000010
(2) 01000000000001
(3) 10000000000001

Since each of the above unused bit patterns has an even number of 1s, the use of these bit patterns as substitutive modulation codes for controlling the DSV requires for original modulation codes to contain an odd number of 1s, respectively. Thus, the above unused bit patterns are provided to modulation codes containing an odd number of 1s.

FIGS. 41(a) and 41(b) show an example wherein a substitutive modulation code 10000000000010 (the above unused bit pattern (1)) is substituted for a modulation code 10000000100010 containing an odd number of 1s (corresponding to 122 in decimal). FIG. 41(a) shows a modulation code sequence containing the original modulation code 10000000100010, while FIG. 41(b) shows a modulation code sequence in which the original modulation code is replaced with the substitutive modulation code. FIGS. 41(c) and 40(d) show signal waveforms of the modulation code sequences shown in FIGS. 41(a) and 41(b), respectively. FIGS. 41(a) to 41(d) show that replacement of the modulation code containing an odd number of 1s with the substitutive modulation code meeting the above conditions causes the polarity of a signal to be changed for controlling the DSV.

Substitution Allowable Condition

FIG. 42(a) shows a modulation code sequence containing the same substitutive modulation code 10000000000010 as the one shown in FIG. 41(b). According to the above discussed symbol conversion shown in FIG. 10, the connection code mb1 is, as shown in FIG. 42(b), set to 1 and both bits preceding and following the connection code mb1 are changed from 1 to 0 for limiting Tmin. As a result of this logic changing of the most significant bit of the substitutive modulation code, a modulation code sequence has twelve consecutive 0s. For this reason, a substitution allowable condition when k=11 is that a preceding modulation code ends with a 0. If k is set to more than 12, the substitution allowable condition is met without limitation.

Similarly, the unused bit pattern (2) may be used as a substitutive modulation code for a modulation code, for example, 01000010000001 (147 in decimal) containing an odd number of 1s, while the unused bit pattern (3) 10000000000001 cannot be used as a substitutive modulation code when k is limited to less than 11 since it already contains twelve consecutive 0s. If, however, k is allowed to be more than 12, it becomes possible to use the bit pattern (3) as a substitutive modulation code.

Replacement with an Unused Bit Pattern Meeting an EFM Table Condition Where the Number of Consecutive 0s Placed Between 1s is Less Than 10 and the Number of Consecutive 0s at an End Portion is Less Than Eight, but Excluded From the EFM Table The unused bit pattern meeting the above conditions is, as previously mentioned, 00100000000001. This bit pattern contains two 1s and thus may be used as a substitutive modulation code for a modulation code containing an odd number of 1s, for example, 00100000100001 (147 in decimal) without restriction.

Thus far, the replacement of modulation codes is discussed according to classifications of the unused bit patterns. All of the unused bit patterns and the conversion bit patterns, as stated above, may however be used or only part of them may alternatively be used. It is however advisable that substitutive modulation codes be assigned as much as possible to data in the EFM table for increasing the chances to control the DSV. This is effective to reduce low-frequency components.

Modulator

Figure 43:
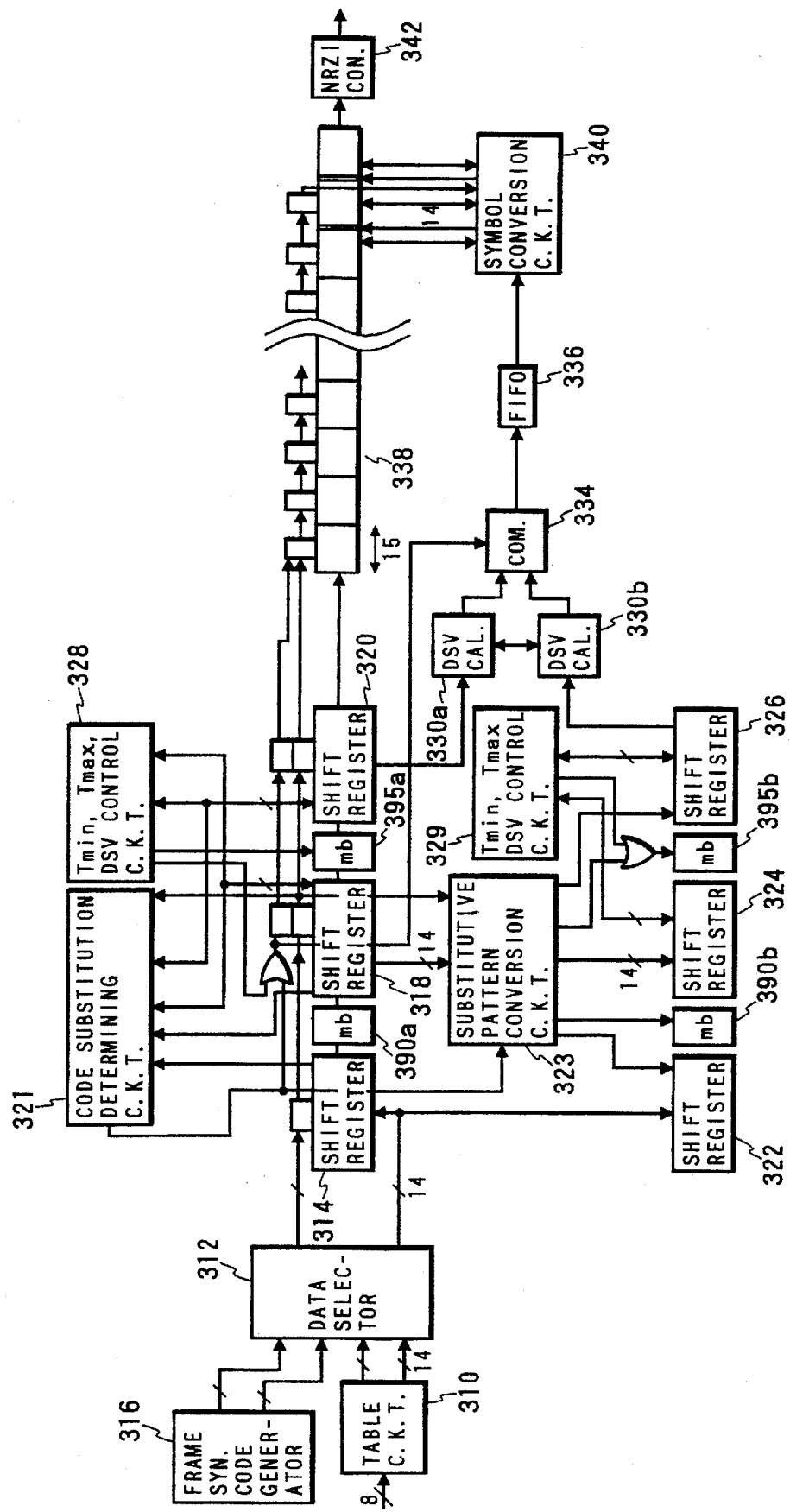
FIG. 43 is a block diagram which shows a modulator according to a fourth embodiment.

Referring to FIG. 43, there is shown a modulator according to the fourth embodiment of the invention.

8-bit data code is inputted into a table circuit 310 wherein it is converted into a modulation code of 14 channel bits. The modulation code is then stored in a shift register 314 through a data selector 312 wherein it is parallel-to-serial converted. The table circuit 310 outputs data type signals indicative of whether bit patterns prodded by the table circuit 310 and a frame synchronization code generator 316 include substitutive modulation codes or not, a type of conversion bit pattern to be placed preceding or following a connection code (i.e., the conversion bit patterns in the table 6 and 7), and the substitution conditions in the tables 6 and 7. A frame synchronization code generator 316 provides a frame synchronization code to a leading portion of a frame of the data. The then data type signal indicates that the frame synchronization code is being outputted.

The data stored in the shift register 314 is transferred, in sequence, to shift registers 318 and 320. The modulation code outputted from the data selector 312 is also stored in a shift register 322. The data stored in the shift register 322 is sequentially transferred to shift registers 324 and 326. Connection code registers 390a, 390b, 395a, and 395b store therein logic symbols of connection codes, respectively.

A code substitution determining circuit 321 determines whether a modulation code block stored in the shift register 318 can be replaced or not based on the data type signals and bit patterns of the preceding and following modulation code blocks stored in the shift registers 314 and 320. If the modulation code can be replaced, a DSV control flag indicative thereof is outputted to a substitutive pattern conversion circuit 323. The substitutive pattern conversion circuit 323 is responsive to the DSV control flag to substitute the modulation code stored in the shift register 324 for a substitutive modulation code, and stores therein a resultant modulation code. Additionally, either of parts of bit strings in the modulation codes stored in the shift registers 322, 324, and 326, including the connection codes stored in the connection code registers 390b and 395b is converted into a bit pattern, as discussed above.

A Tmin, Tmax, DSV control circuit 328 converts bit patterns of two modulation codes stored in the shift registers 318 and 320 appearing across the connection code in the connection code register 395a to restrict Tmin and Tmax, and determines that the DSV control is allowed to be performed when the modulation codes in the shift registers 318 and 320 each have five or more consecutive 0s.

Additionally, a Tmin, Tmax, DSV control circuit 329 converts bit patterns of two modulation codes stored in the shift registers 324 and 326 appearing across the connection code in the connection code register 395b to restrict Tmin and Tmax, and determines that the DSV control is allowed to be performed when the modulation codes in the shift registers 324 and 326 each have five or more consecutive 0s.

The Tmin, Tmax, DSV control circuits 328 and 329 are different from each other in controlled object. The Tmin, Tmax, DSV control circuit 328 determines whether the DSV control can be performed or not based on a bit pattern prior to replacement with a substitutive modulation code, while the Tmin, Tmax, DSV control circuit 329 determines whether the DSV control can be performed or not based on a bit pattern after having been replaced with the substitutive modulation code.

In addition, the Tmin, Tmax, DSV control circuits 328 and 329 are different from each other in DSV control operation. Specifically, if a YES answer is obtained in step 20 of FIG. 10 meaning that the maximum length between transitions Tmax exceeds 12 or more, then the control circuit 328 performs steps 24 and 26, while the control circuit 239 performs step 28 if two 5-bit pieces preceding and following the connection code are both 00000, and step 30 or 32 if they are not 00000.

Alternatively, if a NO answer is obtained in step 20, the control circuit 328 performs step 28, while the control circuit 329 performs step 34 if two 5-bit pieces preceding and following the connection code are both 00000, and step 36 if they are not 00000. Note that in order to facilitate a better understanding, steps 30 and 32 is omitted here.

When a bit pattern of a modulation code sequence is not changed and it is not impossible to control the DSV using the original modulation code, the control circuits 328 and 329 performs the same operations.

The table 9 in FIG. 44 shows the operations of the control circuits 328 and 329 in terms of combinations of run lengths of 0s at trailing portions of the modulation codes stored in the shift registers 318 and 324, and run length of 0s at leading portions of the modulation codes stored in the shift registers 320 and 326. The control circuits 328 and 329 determines run lengths of 0s in 8 bits across a connection code.

As clearly shown in the table 9, if the DSV control flag assumes 1 meaning that the DSV is controllable, the control circuit 328 performs step 24 (100 [1] 000), step 26 (000 [1] 001), and step 36 (000 [1] 000), while the control circuit 329 performs step 28 or 34 (100 [1] 001).

DSV calculation circuits 330a and 330b calculate DSVs of modulation codes supplied from the shift registers 320 and 326, respectively. A comparator 334 receives through an OR gate 332 flags indicative of a code substitution allowable condition provided by the code substitution determining circuit 321, and a DSV control allowable condition provided by the Tmin, Tmax, DSV control circuit 328.

The comparator 334 is responsive to the flags to compare the two DSVs calculated by the DSV calculation circuits 330a and 330b, and provides to an FIFO memory 36 a one-bit flag indicative of the smaller of the DSVs determined by the circuits 330a and 330b.

The modulation code sequence formed in the shift registers 314, 318, and 320 is transferred to a memory 338 together with the data type signals and the DSV control allowable flag. When the DSV control flag indicates that the DSV is controllable, a symbol conversion circuit 340 is based on an output of the FIFO memory 336 after a delay of about one frame to convert the modulation code sequence in the memory 38 with a substitutive modulation code and/or a conversion bit pattern. Specifically, when the control circuit 328 determines that the DSV is controllable, and the result of the comparator 34 indicates that the modulation code sequence should be converted into . . . 100 [1] 001 . . . for decreasing the DSV, the symbol conversion circuit 340 converts the modulation code sequence in the memory 38 into a bit pattern . . . 100 [1] 001 . . . for the DSV control.

After the symbol conversion operation, the modulation code sequence is transferred to an NRZI conversion circuit 343 to produce an NRZI signal. The NRZI signal is recorded on a recording medium (not shown) such as a disc or transmitted through a channel.

Demodulator

Figure 45:
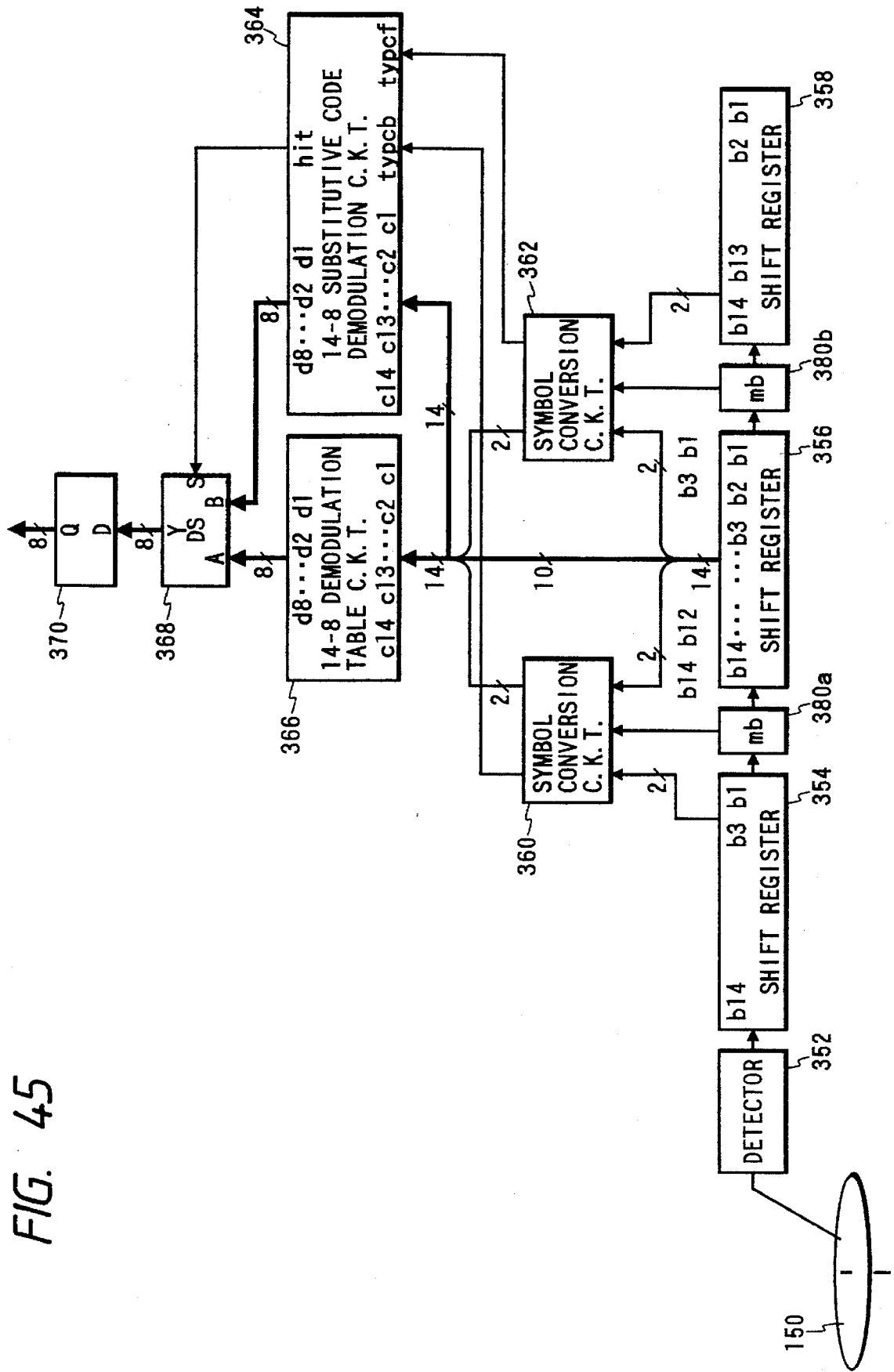
FIG. 45 is a block diagram which shows a demodulator according to a fourth embodiment.

Referring to FIG. 45, there is shown a demodulator according to the fourth embodiment, which is designed to basically perform an inverse modulating operation to that of the modulator, as described above. A signal sequence reproduced from a recording medium or transmitted through a channel, as stated above, contains frame synchronization codes. The monitoring of the frame synchronization codes permits modulation code blocks and connection codes to be identified.

Data signals recorded by, for example, the modulator shown FIG. 43 onto a disc 150 are detected by a detector 352. The detected data signals then sequentially shifted to a shift register 354, a register 356, and a shift register 358 to be stored therein. Connection bit registers 380a and 380b store therein connection codes mb contained in the data signals.

A symbol conversion circuit 360 receives five bits in total including two bits b1 and b3 at front bit positions of the following modulation code block stored in the shift register 354, a bit of the connection code mb stored in the connection code register 380a, plus two bits b12 and b14 at rear bit positions of the central modulation code block stored in the shift register 356. In addition, a symbol conversion circuit 362 receives five bits in total containing two bits b1 and b3 of the central modulation code block stored in the shift register 356, a bit of the connection code mb stored in the connection code register 380b, plus two bits b12 and b14 of the preceding modulation code block stored in the shift register 358.

Each of the symbol conversion circuits 360 and 362 monitors the inputted bits to convert the bits preceding and following the connection code mb to any one of the following bit patterns, if the connection code mb represents logic symbol 1.

(1) if "000 [1] 000", then "001 [] 100";
(2) if "100 [1] . . .", then "000 [] . . ."; and
(3) if ". . . [1] 001", then ". . . [] 000".

Additionally, each of the symbol conversion circuits 360 and 362 uses a bit pattern on the right and left side of the connection code mb to identify a type of conversion bit pattern used in the modulation. As the type of conversion bit pattern used, there are four bit patterns shown below.

(1) "100 [1] 001"
(2) "000 [1] 001"
(3) "100 [1] 000"
(4) "001 [1] 000" or "000 [0] 100"

The symbol conversion circuits 360 and 362 provide conversion bit pattern identification signals typeb and typef to a substitutive code demodulation table circuit 364, respectively.

Of the 14-channel bit data stored in the shift register 356, 10 bits at central bit positions and left and right 2-bit pieces to the central 10 bits which have been symbol-converted by the symbol conversion circuits 360 and 362 are supplied to a demodulation table circuit 366 and the substitutive code demodulation table circuit 364, respectively. If this 14-bit code supplied to the symbol conversion circuits 360 and 362 corresponds to any one of the substitutive modulation codes as discussed above, the substitutive code demodulation table circuit 364 demodulates the 14-bit code inputted thereto based on the conversion bit pattern identification signals typeb and typef. Alternatively, if the 14-bit code is not any of the substitutive modulation codes, the demodulation table circuit 366 demodulates the 14-bit code inputted thereto into an 8-bit data code, which is, in turn, transferred to a D-Flip-flop 70 through a data selector 68.

The above mentioned embodiments use the EFM table, however, the present invention is not limited to the same, and may be used with a system which converts m-bit data codes into n-bit data codes (m<n) using an n-to-m modulation table, combines them through p-bit connection codes to form a modulation code sequence. In addition, the required run lengths d and k may be changed as necessary.

Moreover, the above embodiments are used with a recording/reproducing system such as an optical disc system, however, may be employed with a recording/reproducing system using a magnetic tape, for example, or a data transmission system. In addition, substitutive modulation codes are not also limited to the ones shown in the tables 6 and 8.

Further, all bit patterns unused in the EFM table may not be necessarily used, and only part thereof may be used.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A digital modulating method comprising:

a data converting step of converting m-bit data codes, in sequence, into digital modulation codes each consisting of n channel bits (n>m) meeting a given minimum transition interval condition wherein at least d consecutive logic symbols 0s are placed between logic symbols 1s;

a connection code insertion step of inserting a connection code of d−1 bits between two consecutive blocks of said digital modulation codes to form a modulation code sequence, logic symbols of the connection code being determined so as to satisfy said given transition interval condition;

a first conversion step of converting two 1-bit pieces preceding and following said connection code in said modulation code sequence into logic symbols 0s, respectively, and setting any one bit of said connection code to a logic symbol 1 if said two 1-bit pieces are both 1; and a second conversion step wherein if d+1 consecutive 0s appear on one of bit strings preceding and following said connection code and 2d+1 consecutive 0s appear on the other bit string, or if 2d+1 consecutive 0s appear on both the bit strings preceding and following said connection code, setting any one bit of said connection code to a logic symbol 1, and converting into a logic symbol 1 a bit placed at a (d+1)th bit position to said connection code in a block of the digital modulation code including the bit string on which said 2d+1 consecutive 0s appear.

2. A digital modulating method as set forth in claim 1, wherein if the 2d+1 consecutive 0s appear on both the bit strings preceding and following said connection code, either or both of bits placed at the (d+1)th bit positions to said connection code in blocks of the digital modulation codes preceding and following said connection code are set to 1 for deriving a given DSV (Digital Sum Value).

3. A digital modulating method as set forth in claim 1, further comprising a recording signal producing step of producing a recording signal based on said modulation code sequence, and a recording step of recording the recording signal on a given recording medium.

4. A digital modulating method as set forth in claim 3, wherein said recording signal is formed with an NRZI signal.

5. A recording medium recording thereon a signal including a digital modulation code sequence which is formed by the following steps:

converting m-bit data codes, in sequence, into digital modulation codes each consisting of n channel bits (n>m) meeting a given minimum transition interval condition wherein at least d consecutive logic symbols 0s are placed between logic symbols 1s;

inserting a connection code of d−1 bits between two consecutive blocks of said digital modulation codes to form the modulation code sequence, logic symbols of the connection code being determined so as to satisfy said given transition interval condition;

converting two 1-bit pieces preceding and following said connection code in said modulation code sequence into logic symbols 0s, respectively, and setting any one bit of said connection code to a logic symbol 1 if said two 1-bit pieces are both 1; and if d+1 consecutive 0s appear on one of bit strings preceding and following said connection code and 2d+1 consecutive 0s appear on the other bit string, or if 2d+1 consecutive 0s appear on both the bit strings preceding and following said connection code, setting any one bit of said connection code to a logic symbol 1, and converting into a logic symbol 1 a bit placed at a (d+1)th bit position to said connection code in a block of the digital modulation code including the bit string on which said 2d+1 consecutive 0s appear.

6. A digital modulating apparatus comprising:

data conversion means for converting m-bit data codes, in sequence, into digital modulation codes each consisting of n channel bits (n>m) meeting a given minimum transition interval condition wherein at least d consecutive logic symbols 0s are placed between logic symbols 1s;

modulation code sequence producing means for producing a modulation code sequence by providing a connection code of d−1 bits between two consecutive blocks of said digital modulation codes, logic symbols of the connection code being determined so as to satisfy said given transition interval condition;

first modulation processing means for converting two 1-bit pieces preceding and following said connection code in said modulation code sequence into logic symbols 0s, respectively, and setting any one bit of said connection code to a logic symbol 1 if said two 1-bit pieces are both 1; and second modulation processing means for setting any one bit of said connection code to a logic symbol 1, and converting into a logic symbol 1 a bit placed at a (d+1)th bit position to said connection code in a block of the digital modulation code including the bit string on which said 2d+1 consecutive 0s appear if d+1 consecutive 0s appear on one of bit strings preceding and following said connection code and 2d+1 consecutive 0s appear on the other bit string, or if 2d+1 consecutive 0s appear on both the bit strings preceding and following said connection code.

7. A digital modulating apparatus as set forth in claim 6, wherein if the 2d+1 consecutive 0s appear on both the bit strings preceding and following said connection code, either or both of bits placed at the (d+1)th bit positions to said connection code in blocks of the digital modulation codes preceding and following said connection code are set to 1 for deriving a given DSV (Digital Sum Value).

8. A digital modulating apparatus as set forth in claim 6, wherein m is eight, n is fourteen, d is two, and said data conversion means converts the m-bit data codes into the digital modulation codes based on a modulation table used in eight-to-fourteen modulation.

9. A digital modulating apparatus as set forth in claim 6, further comprising synchronization code providing means for providing a synchronization code to the modulation code sequence, said synchronization code being formed in a logic pattern consisting of logic symbols 1s and consecutive logic symbols 0s of a number exceeding a given maximum transition interval condition wherein at most k consecutive logic symbols 0s are placed between logic symbols 1.

10. A digital modulating apparatus as set forth in claim 9, wherein said synchronization code further includes bits each being set to either 1 or 0.

11. A digital demodulating method comprising:

a digital demodulation code producing step of demodulating a digital signal into digital demodulation codes each consisting of n channel bits, the digital signal being derived by a modulation code sequence formed in a modulating operation including (a) a data converting step of converting m-bit data codes, in sequence, into digital modulation codes each consisting of n channel bits (n>m) meeting a given minimum transition interval condition wherein at least d consecutive logic symbols 0s are placed between logic symbols 1s, (b) a connection code insertion step of inserting a connection code of d−1 bits between two consecutive blocks of said digital modulation codes, logic symbols of the connection code being determined so as to satisfy said given transition interval condition, (c) a first conversion step of converting two 1-bit pieces preceding and following said connection code into logic symbols 0s, respectively, and setting any one bit of said connection code to a logic symbol 1 if said two 1-bit pieces are both 1, and (d) a second conversion step wherein if d+1 consecutive 0s appear on one of bit strings preceding and following said connection code and 2d+1 consecutive 0s appear on the other bit string, or if 2d+1 consecutive 0s appear on both the bit strings preceding and following said connection code, setting any one bit of said connection code to a logic symbol 1, and converting into a logic symbol 1 a bit placed at a (d+1)th bit position to said connection code in a block of the digital modulation code including the bit string on which said 2d+1 consecutive 0s appear, said digital demodulation code producing step monitoring logic symbols of said connection code and said bit strings preceding and following said connection code to demodulate the digital signal into a demodulation code sequence including the digital modulation codes each having the n-channel bits; and a data conversion step of converting said demodulation code sequence into the m-bit data codes.

12. A digital demodulating apparatus comprising:

digital demodulation code producing means for demodulating a digital signal into digital demodulation codes each consisting of n channel bits, the digital signal being derived by a modulation code sequence formed in a modulating operation including (a) a data converting step of converting m-bit data codes, in sequence, into digital modulation codes each consisting of n channel bits (n>m) meeting a given minimum transition interval condition wherein at least d consecutive logic symbols 0s are placed between logic symbols 1s, (b) a connection code insertion step of inserting a connection code of d−1 bits between two consecutive blocks of said digital modulation codes, logic symbols of the connection code being determined so as to satisfy said given transition interval condition, (c) a first conversion step of converting two 1-bit pieces preceding and following said connection code into logic symbols 0s, respectively, and setting any one bit of said connection code to a logic symbol 1 if said two 1-bit pieces are both 1, and (d) a second conversion step wherein if d+1 consecutive 0s appear on one of bit strings preceding and following said connection code and 2d+1 consecutive 0s appear on the other bit string, or if 2d+1 consecutive 0s appear on both the bit strings preceding and following said connection code, setting any one bit of said connection code to a logic symbol 1, and converting into a logic symbol 1 a bit placed at a (d+1)th bit position to said connection code in a block of the digital modulation code including the bit string on which said 2d+1 consecutive 0s appear, said digital demodulation code producing means monitoring logic symbols of said connection code and said bit strings preceding and following said connection code to demodulate the digital signal into a demodulation code sequence including the digital modulation codes each having the n-channel bits; and data conversion means for converting said demodulation code sequence into the m-bit data codes.

13. A digital modulating method comprising:

a data converting step of converting m-bit data codes, in sequence, into digital modulation codes each consisting of n channel bits (n>m) using a given modulation table;

a connection code insertion step of inserting a p-bit connection code between two consecutive blocks of said digital modulation codes to form a modulation code sequence;

a bit pattern converting step of converting a bit pattern of a portion of said modulation code sequence into a given bit pattern so as to meet given conditions of a minimum transition interval, a maximum transition interval, and a DSV (Digital Sum Value); and a DSV control code providing step of providing a DSV control code consisting of a given number of bits to said modulation code sequence at a position adjacent said connection code in said modulation code sequence for controlling the DSV.

14. A digital modulating method as set forth in claim 13, wherein said modulation code sequence is formed by (a) a data converting step of converting m-bit data codes, in sequence, into digital modulation codes each consisting of n channel bits (n>m) meeting a given minimum transition interval condition wherein at least d consecutive logic symbols 0s are placed between logic symbols 1s, (b) the connection code insertion step of inserting the p-bit connection code between the two consecutive blocks of said digital modulation codes, logic symbols of the connection code being determined so as to satisfy said given transition interval condition, (c) a first conversion step of converting two 1-bit pieces preceding and following said connection code in said modulation code sequence into logic symbols 0s, respectively, and setting any one bit of said connection code to a logic symbol 1 if said two 1-bit pieces are both 1, and (d) a second conversion step wherein if d+1 consecutive 0s appear on one of bit strings preceding and following said connection code and 2d+1 consecutive 0s appear on the other bit string, or if 2d+1 consecutive 0s appear on both the bit strings preceding and following said connection code, setting any one bit of said connection code to a logic symbol 1, and converting into a logic symbol 1 a bit placed at a (d+1)th bit position to said connection code in a block of the digital modulation code including the bit string on which said 2d+1 consecutive 0s appear.

15. A digital modulating method as set forth in claim 14, wherein m is eight, n is fourteen, p is one, the minimum transition interval corresponds to d=2, and the DSV control code consists of five bits.

16. A digital modulating method as set forth in claim 15, wherein said DSV control code providing step sets a bit of the DSV control code at a second or third bit position to said connection code to a logic symbol 1 when polarity of a waveform of a signal produced by said modulation code sequence is reversed, while when the polarity is not reversed, bits of said DSV control code and said connection code are all set to 0 or two bits of either of said DSV control code and the connection code are set to 1.

17. A digital modulating method as set forth in claim 16, wherein said DSV control code providing step determines a bit pattern of said DSV control code based on logic symbols of last two bits of one of the two consecutive blocks of said digital modulation codes preceding said connection code and first two bits of the following block.

18. A digital modulating method as set forth in claim 14, wherein m is eight, n is fourteen, p is one, the minimum transition interval corresponds to d=2, and the DSV control code consists of four bits.

19. A digital modulating method as set forth in claim 18, wherein said DSV control code providing step sets a bit of the DSV control code at a second bit position to said connection code to a logic symbol 1 when polarity of a waveform of a signal produced by said modulation code sequence is reversed, while when the polarity is not reversed, bits of said DSV control code and said connection code are all set to 0, each one bit of said DSV control code and the connection code is set to 1, or one bit of either of said DSV control code and the connection code is set to 1 and either of a third bit to the last bit of a preceding block of the two consecutive blocks of said digital modulation codes or a third bit of the following block is set to 1.

20. A digital modulating method as set forth in claim 18, wherein said DSV control code providing step determines a bit pattern of said DSV control code based on logic symbols of last five bits of one of the two consecutive blocks of said digital modulation codes preceding said connection code and first five bits of the following block.

21. A digital modulating apparatus comprising:

data converting means for converting m-bit data codes, in sequence, into digital modulation codes each consisting of n channel bits (n>m) using a given modulation table;

connection code insertion means for inserting a p-bit connection code between two consecutive blocks of said digital modulation codes to form a modulation code sequence;

bit pattern converting means for converting a bit pattern of a portion of said modulation code sequence into a given bit pattern so as to meet a given minimum transition interval, a given maximum transition interval, and a DSV (Digital Sum Value); and DSV control code providing means for providing a DSV control code consisting of a given number of bits to said modulation code sequence at a position adjacent said connection code in said modulation code sequence for controlling the DSV.

22. A digital modulating apparatus as set forth in claim 21, wherein said modulation code sequence is formed by (a) a data converting step of converting m-bit data codes, in sequence, into digital modulation codes each consisting of n channel bits (n>m) meeting a given minimum transition interval condition wherein at least d consecutive logic symbols 0s are placed between logic symbols 1s, (b) the connection code insertion step of inserting the p-bit connection code between the two consecutive blocks of said digital modulation codes, logic symbols of the connection code being determined so as to satisfy said given transition interval condition, (c) a first conversion step of converting two 1-bit pieces preceding and following said connection code in said modulation code sequence into logic symbols 0s, respectively, and setting any one bit of said connection code to a logic symbol 1 if said two 1-bit pieces are both 1, and (d) a second conversion step wherein if d+1 consecutive 0s appear on one of bit strings preceding and following said connection code and 2d+1 consecutive 0s appear on the other bit string, or if 2d+1 consecutive 0s appear on both the bit strings preceding and following said connection code, setting any one bit of said connection code to a logic symbol 1, and converting into a logic symbol 1 a bit placed at a (d+1)th bit position to said connection code in a block of the digital modulation code including the bit string on which said 2d+1 consecutive 0s appear.

23. A digital modulating apparatus as set forth in claim 22, wherein m is eight, n is fourteen, p is one, the minimum transition interval corresponds to d=2, and the DSV control code consists of five bits.

24. A digital modulating apparatus as set forth in claim 23, wherein said DSV control code providing means sets a bit of the DSV control code at a second or third bit position to said connection code to a logic symbol 1 when polarity of a waveform of a signal produced by said modulation code sequence is reversed, while when the polarity is not reversed, bits of said DSV control code and said connection code are all set to 0 or two bits of either of said DSV control code and the connection code are set to 1.

25. A digital modulating apparatus as set forth in claim 24, wherein said DSV control code providing means determines a bit pattern of said DSV control code based on logic symbols of last two bits of one of the two consecutive blocks of said digital modulation codes preceding said connection code and first two bits of the following block.

26. A digital modulating apparatus as set forth in claim 22, wherein m is eight, n is fourteen, p is one, the minimum transition interval corresponds to d=2, and the DSV control code consists of four bits.

27. A digital modulating apparatus as set forth in claim 26, wherein said DSV control code providing means sets a bit of the DSV control code at a second bit position to said connection code to a logic symbol 1 when polarity of a waveform of a signal produced by said modulation code sequence is reversed, while when the polarity is not reversed, bits of said DSV control code and said connection code are all set to 0, each one bit of said DSV control code and the connection code is set to 1, or one bit of either of said DSV control code and the connection code is set to 1 and either of a third bit to the last bit of a preceding block of the two consecutive blocks of said digital modulation codes or a third bit of the following block is set to 1.

28. A digital modulating apparatus as set forth in claim 27, wherein said DSV control code providing means determines a bit pattern of said DSV control code based on logic symbols of last two bits of one of the two consecutive blocks of said digital modulation codes preceding said connection code and first two bits of the following block.

29. A digital demodulating method comprising:

a digital demodulation code producing step of demodulating a digital signal into digital demodulation codes each consisting of n channel bits, the digital signal being derived by a modulation code sequence formed in a modulating operation including (a) a data converting step of converting m-bit data codes, in sequence, into digital modulation codes each consisting of n channel bits (n>m) using a given modulation table, (b) a connection code insertion step of inserting a p-bit connection code between two consecutive blocks of said digital modulation codes to form a modulation code sequence, (c) a bit pattern converting step of converting a bit pattern of a portion of said modulation code sequence into a given bit pattern so as to meet given conditions of a minimum transition interval, a maximum transition interval, and a DSV (Digital Sum Value), and (d) a DSV control code providing step of providing a DSV control code consisting of a given number of bits to said modulation code sequence at a position adjacent said connection code in said modulation code sequence for controlling the DSV, said digital demodulation code producing step monitoring logic symbols of said connection code and bit strings preceding and following said connection code to demodulate the digital signal into a demodulation code sequence including the digital modulation codes each having the n-channel bits; and a data conversion step of converting said demodulation code sequence into the m-bit data codes.

30. A digital demodulating method as set forth in claim 29, wherein said digital modulation code producing step performs a demodulating operation reverse to said modulating operation by monitoring a result of an exclusive OR operation of said DSV control code and said connection code, and logic symbols of the blocks of said digital modulation codes preceding and following said DSV control code and the connection code.

31. A digital demodulating apparatus comprising; digital demodulation code producing means for demodulating a digital signal into digital demodulation codes each consisting of n channel bits, the digital signal being derived by a modulation code sequence formed in a modulating operation including (a) a data converting step of converting m-bit data codes, in sequence, into digital modulation codes each consisting of n channel bits (n>m) using a given modulation table, (b) a connection code insertion step of inserting a p-bit connection code between two consecutive blocks of said digital modulation codes to form a modulation code sequence, (c) a bit pattern converting step of converting a bit pattern of a portion of said modulation code sequence into a given bit pattern so as to meet given conditions of a minimum transition interval, a maximum transition interval, and a DSV (Digital Sum Value), and (d) a DSV control code providing step of providing a DSV control code consisting of a given number of bits to said modulation code sequence at a position adjacent said connection code in said modulation code sequence for controlling the DSV, said digital demodulation code producing step monitoring logic symbols of said connection code and bit strings preceding and following said connection code to demodulate the digital signal into a demodulation code sequence including the digital modulation codes each having the n-channel bits; and data conversion means for converting said demodulation code sequence into the m-bit data codes.

32. A digital demodulating apparatus as set forth in claim 31, wherein said digital modulation code producing means performs a demodulating operation reverse to said modulating operation by monitoring a result of an exclusive OR operation of said DSV control code and said connection code, and logic symbols of the blocks of said digital modulation codes preceding and following said DSV control code and the connection code.

33. A digital modulating method comprising:

a data converting step of converting m-bit data codes, in sequence, into digital modulation codes each consisting of n channel bits (n>m) using a given modulation table;

a connection code insertion step of inserting a p-bit connection code between two consecutive code blocks of said digital modulation codes to form a modulation code sequence;

a bit pattern converting step of converting a bit pattern of a portion of said modulation code sequence into a given bit pattern so as to meet given conditions of a minimum transition interval, a maximum transition interval, and a DSV (Digital Sum Value); and a substitutive modulation code providing step of providing as said given bit pattern one of bit patterns unused in said given modulation table.

34. A digital modulating method as set forth in claim 33, wherein m is eight, n is fourteen, and p is one, and wherein said bit pattern converting step includes a first conversion step in which when two one-bit pieces preceding and following said connection code are both 1s, the connection code is set to a 1 and said two one-bit pieces are set to 0s, and a second conversion step in which when three or more consecutive 0s appear on one of the code blocks of said digital modulation codes preceding and following said connection code and five or more consecutive 0s appear on the other code block, or when five consecutive 0s appear on both the code blocks of said digital modulation codes preceding and following said connection code, said connection code is set to a 1, and a bit(s) of the code block(s) having the five consecutive 0s at a third bit position(s) to said connection code is (are) set to a 1(s).

35. A digital modulating method as set forth in claim 34 wherein said substitutive modulation code providing step replaces an original digital modulation code which is one of said digital modulation codes with a substitutive modulation code selected out of digital modulation codes unused in said given modulation table, consisting of 14 bits having at least two 0s between 1s and starting with nine or more consecutive 0s, and wherein said substitutive modulation code providing step includes the following steps:

(1) when a code block of said digital modulation code preceding the original digital modulation code to be replaced ends with five or more consecutive 0s, providing as the substitutive modulation code one of the digital modulation codes unused in said given modulation table, having logic symbols 1s of a number similar in an even or odd number to that of said original digital modulation code, and converting a bit string consisting of last three bits of the code block preceding said original digital modulation code, a bit of the connection code, and first three bits of said original digital modulation code into a bit pattern 1001001;

(2) when the code block of said digital modulation code preceding the original digital modulation code to be replaced ends with three or more consecutive 0s, providing as the substitutive modulation code one of said digital modulation codes unused in said given modulation table, having logic symbols is of a number reverse in an even or odd number to that of said original digital modulation code, and converting the bit string consisting of the last three bits of the code block preceding said original digital modulation code, the bit of the connection code, and the first three bits of said original digital modulation code into a bit pattern 0001001;

(3) when the code block of said digital modulation code preceding the original digital modulation code to be replaced ends with five or more consecutive 0s, providing as the substitutive modulation code one of the digital modulation codes unused in said given modulation table, having logic symbols is of a number reverse in an even or odd number to that of said original digital modulation code, and converting the bit string consisting of the last three bits of the code block preceding said original digital modulation code, the bit of the connection code, and the first three bits of said original digital modulation code into a bit pattern 1001000; and (4) when said original digital modulation code starts with a 1 and the code block of said digital modulation code preceding the original digital modulation code to be replaced ends with a 1, providing as the substitutive modulation code one of the digital modulation codes unused in said given modulation table, having logic symbols 1s of a number similar in an even or odd number to that of said original digital modulation code, and converting the bit string consisting of the last three bits of the code block preceding said original digital modulation code, the bit of the connection code, and the first three bits of said original digital modulation code into a bit pattern 0010000, wherein the steps 1 to 4 use as the substitutive modulation code one of the unused digital modulation codes starting with (k−1) consecutive 0s where k is a maximum run length of 0s, the steps 1 to 3 use as the substitutive modulation code one of the unused digital modulation codes starting with k consecutive 0s, and the steps 1 and 2 use as the substitutive modulation code one of the unused digital modulation code starting with (k+1) or more consecutive 0s.

36. A digital modulating method as set forth in claim 35, wherein said original digital modulation code has a run length of 0s at beginning bit positions which is less than k−9.

37. A digital modulating method as set forth in claim 35, wherein said substitutive modulation code has at a last portion thereof a run length of 0s equal to that at a last portion of said original digital modulation code.

38. A digital modulating method as set forth in claim 35, wherein one of the digital modulation codes unused in said given modulation table which either starts with a 1 or ends with a 1, and has a run length of 0s which is greater than or equal to 10 and smaller than or equal to k, is used as the substitutive modulation code for the original digital modulation code having an odd number of 1s.

39. A digital modulating method as set forth in claim 35, wherein one of the digital modulation codes unused in said given modulation table which has ten or less consecutive 0s between 1s and eight or less consecutive 0s at both end portions, is used as the substitutive modulation code for the original digital modulation code having logic symbols 1s of a number reverse in an even or odd number to that of the substitutive modulation code.

40. A digital modulating method as set forth in claim 34, wherein said substitutive modulation code providing step replaces an original digital modulation code which is one of said digital modulation codes with a substitutive modulation code selected out of digital modulation codes unused in said given modulation table, consisting of 14 bits having at least two 0s between 1s and starting with nine or more consecutive 0s, and wherein said substitutive modulation code providing step includes the following steps:

(1) when a code block of said digital modulation code following the original digital modulation code to be replaced starts with five or more consecutive 0s, providing as the substitutive modulation code one of the digital modulation codes unused in said given modulation table, having logic symbols 1s of a number similar in an even or odd number to that of said original digital modulation code, and converting a bit string consisting of last three bits of said original digital modulation code, a bit of the connection code, and first three bits of the code block following said original digital modulation code into a bit pattern 1001001;

(2) when the code block of said digital modulation code following the original digital modulation code to be replaced starts with three or more consecutive 0s, providing as the substitutive modulation code one of said digital modulation codes unused in said given modulation table, having logic symbols 1s of a number reverse in an even or odd number to that of said original digital modulation code, and converting the bit string consisting of the last three bits of said original digital modulation code, the bit of the connection code, and the first three bits of the code block following said original digital modulation code into a bit pattern 1001000;

(3) when the code block of said digital modulation code following the original digital modulation code to be replaced starts with five or more consecutive 0s, providing as the substitutive modulation code one of the digital modulation codes unused in said given modulation table, having logic symbols 1s of a number reverse in an even or odd number to that of said original digital modulation code, and converting the bit string consisting of the last three bits of said original digital modulation code, the bit of the connection code, and the first three bits of the code block following said original digital modulation code into a bit pattern 0001001; and (4) when said original digital modulation code ends with a 1 and the code block of said digital modulation code following the original digital modulation code to be replaced stats with a 1, providing as the substitutive modulation code one of the digital modulation codes unused in said given modulation table, having logic symbols 1s of a number similar in an even or odd number to that of said original digital modulation code, and converting the bit string consisting of the last three bits of said original digital modulation code, the bit of the connection code, and the first three bits of the code block following said original digital modulation code into a bit pattern 0000100, wherein the steps 1 to 4 use as the substitutive modulation code one of the unused digital modulation codes ending with (k−1) consecutive 0s where k is a maximum run length of 0s, the steps 1 to 3 use as the substitutive modulation code one of the unused digital modulation codes ending with k consecutive 0s, and the steps 1 and 2 use as the substitutive modulation code one of the unused digital modulation code ending with (k+1) or more consecutive 0s.

41. A digital modulating method as set forth in claim 40, wherein said original digital modulation code has a run length at ending bit positions of 0s which is less than k−9.

42. A digital modulating method as set forth in claim 40, wherein said substitutive modulation code has at a beginning portion thereof a run length of 0s equal to that at a beginning portion of said original digital modulation code.

43. A digital modulating method as set forth in claim 40, wherein one of the digital modulation codes unused in said given modulation table which either starts with a 1 or ends with a 1, and has a run length of 0s which is greater than 10 and smaller than k, is used as the substitutive modulation code for the original digital modulation code having an odd number of 1s.

44. A digital modulating method as set forth in claim 40, wherein one of the digital modulation codes unused in said given modulation table which has ten or less consecutive 0s between 1s and eight or less consecutive 0s at both end portions, is used as the substitutive modulation code for the original digital modulation code having logic symbols 1s of a number reverse in an even or odd number to that of the substitutive modulation code.

45. A digital modulating apparatus comprising:

data converting means for converting 8-bit data codes, in sequence, into digital modulation codes each consisting of 14 channel bits using a given modulation table;

connection code insertion means for inserting a one-bit connection code between two consecutive code blocks of said digital modulation codes to form a modulation code sequence;

bit pattern converting means for converting a bit pattern of a portion of said modulation code sequence into a given bit pattern so as to meet given conditions of a minimum transition interval, a maximum transition interval, and a DSV (Digital Sum Value); and substitutive modulation code providing means for providing as said given bit pattern one of bit patterns unused in said given modulation table.

46. A digital modulating apparatus as set forth in claim 45, wherein said bit pattern converting means performs a first conversion step in which when two one-bit pieces preceding and following said connection code are both 1s, the connection code is set to a 1 and said two one-bit pieces are set to 0s, and a second conversion step in which when three or more consecutive 0s appear on one of the code blocks of digital said modulation codes preceding and following said connection code and five or more consecutive 0s appear on the other code block, or when five consecutive 0s appear on both the code blocks of said digital modulation codes preceding and following said connection code, said connection code is set to a 1, and a bit(s) of the code block(s) having the five consecutive 0s at a third bit position(s) to said connection code is (are) set to a 1(s).

47. A digital modulating apparatus as set forth in claim 46 wherein said substitutive modulation code providing means replaces an original digital modulation code which is one of said digital modulation codes with a substitutive modulation code selected out of digital modulation codes unused in said given modulation table, consisting of 14 bits having at least two 0s between 1s and starting with nine or more consecutive 0s, and wherein said substitutive modulation code providing means performs the following steps:
- (1) when a code block of said digital modulation code preceding the original digital modulation code to be replaced ends with five or more consecutive 0s, providing as the substitutive modulation code one of the digital modulation codes unused in said given modulation table, having logic symbols is of a number similar in an even or odd number to that of said original digital modulation code, and converting a bit string consisting of last three bits of the code block preceding said original digital modulation code, a bit of the connection code, and first three bits of said original digital modulation code into a bit pattern 1001001;
- (2) when the code block of said digital modulation code preceding the original digital modulation code to be replaced ends with three or more consecutive 0s, providing as the substitutive modulation code one of said digital modulation codes unused in said given modulation table, having logic symbols 1s of a number reverse in an even or odd number to that of said original digital modulation code, and converting the bit string consisting of the last three bits of the code block preceding said original digital modulation code, the bit of the connection code, and the first three bits of said original digital modulation code into a bit pattern 0001001;
- (3) when the code block of said digital modulation code preceding the original digital modulation code to be replaced ends with five or more consecutive 0s, providing as the substitutive modulation code one of the digital modulation codes unused in said given modulation table, having logic symbols 1s of a number reverse in an even or odd number to that of said original digital modulation code, and converting the bit string consisting of the last three bits of the code block preceding said original digital modulation code, the bit of the connection code, and the first three bits of said original digital modulation code into a bit pattern 1001000; and
- (4) when said original digital modulation code stats with a 1 and the code block of said digital modulation code preceding the original digital modulation code to be replaced ends with a 1, providing as the substitutive modulation code one of the digital modulation codes unused in said given modulation table, having logic symbols 1s of a number similar in an even or odd number to that of said original digital modulation code, and converting the bit string consisting of the last three bits of the code block preceding said original digital modulation code, the bit of the connection code, and the first three bits of said original digital modulation code into a bit pattern 0010000, wherein the steps 1 to 4 use as the substitutive modulation code one of the unused digital modulation codes starting with (k−1) consecutive 0s where k is a maximum run length of 0s, the steps 1 to 3 use as the substitutive modulation code one of the unused digital modulation codes starting with k consecutive 0s, and the steps 1 and 2 use as the substitutive modulation code one of the unused digital modulation code starting with (k+1) or more consecutive 0s.

48. A digital modulating apparatus as set forth in claim 47, wherein said original digital modulation code has a run length at beginning bit positions of 0s which is less than k−9.

49. A digital modulating apparatus as set forth in claim 47, wherein said substitutive modulation code has at a last portion thereof a run length of 0s equal to that at a last portion of said original digital modulation code.

50. A digital modulating apparatus as set forth in claim 47, wherein one of the digital modulation codes unused in said given modulation table which either starts with a 1 or ends with a 1, and has a run length of 0s which is greater than 10 and smaller than k, is used as the substitutive modulation code for the original digital modulation code having an odd number of 1s.

51. A digital modulating apparatus as set forth in claim 47, wherein one of the digital modulation codes unused in said given modulation table which has ten or less consecutive 0s between 1s and eight or less consecutive 0s at both end portions, is used as the substitutive modulation code for the original digital modulation code having logic symbols 1s of a number reverse in an even or odd number to that of the substitutive modulation code.

52. A digital modulating apparatus as set forth in claim 46, wherein said substitutive modulation code providing means replaces an original digital modulation code which is one of said digital modulation codes with a substitutive modulation code selected out of digital modulation codes unused in said given modulation table, consisting of 14 bits having at least two 0s between 1s and starting with nine or more consecutive 0s, and wherein said substitutive modulation code providing means performs the following steps:
- (1) when a code block of said digital modulation code following the original digital modulation code to be replaced starts with five or more consecutive 0s, providing as the substitutive modulation code one of the digital modulation codes unused in said given modulation table, having logic symbols 1s of a number similar in an even or odd number to that of said original digital modulation code, and converting a bit string consisting of last three bits of said original digital modulation code, a bit of the connection code, and first three bits of the code block following said original digital modulation code into a bit pattern 1001001;
- (2) when the code block of said digital modulation code following the original digital modulation code to be replaced starts with three or more consecutive 0s, providing as the substitutive modulation code one of said digital modulation codes unused in said given modulation table, having logic symbols 1s of a number reverse in an even or odd number to that of said original digital modulation code, and converting the bit string consisting of the last three bits of said original digital modulation code, the bit of the connection code, and the first three bits of the code block following said original digital modulation code into a bit pattern 1001000;
- (3) when the code block of said digital modulation code following the original digital modulation code to be replaced starts with five or more consecutive 0s, providing as the substitutive modulation code one of the digital modulation codes unused in said given modulation table, having logic symbols 1s of a number reverse in an even or odd number to that of said original digital modulation code, and converting the bit string consisting of the last three bits of said original digital modulation code, the bit of the connection code, and the first three bits of the code block following said original digital modulation code into a bit pattern 0001001; and
- (4) when said original digital modulation code ends with a 1 and the code block of said digital modulation code following the original digital modulation code to be replaced stats with a 1, providing as the substitutive modulation code one of the digital modulation codes unused in said given modulation table, having logic symbols 1s of a number similar in an even or odd number to that of said original digital modulation code, and converting the bit string consisting of the last three bits of said original digital modulation code, the bit of the connection code, and the first three bits of the code block following said original digital modulation code into a bit pattern 0000100, wherein the steps 1 to 4 use as the substitutive modulation code one of the unused digital modulation codes ending with (k−1) consecutive 0s where k is a maximum run length of 0s, the steps 1 to 3 use as the substitutive modulation code one of the unused digital modulation codes ending with k consecutive 0s, and the steps 1 and 2 use as the substitutive modulation code one of the unused digital modulation code ending with (k+1) or more consecutive 0s.

53. A digital modulating apparatus as set forth in claim 52, wherein said original digital modulation code has a run length at ending bit positions of 0s which is less than k−9.

54. A digital modulating apparatus as set forth in claim 52, wherein said substitutive modulation code has at a beginning portion thereof a run length of 0s equal to that at a beginning portion of said original digital modulation code.

55. A digital modulating apparatus as set forth in clam 52, wherein one of the digital modulation codes unused in said given modulation table which either starts with a 1 or ends with a 1, and has a run length of 0s which is greater than 10 and smaller than k, is used as the substitutive modulation code for the original digital modulation code having an odd number of 1s.

56. A digital modulating apparatus as set forth in claim 52, wherein one of the digital modulation codes unused in said given modulation table which has ten or less consecutive 0s between 1s and eight or less consecutive 0s at both end portions, is used as the substitutive modulation code for the original digital modulation code having logic symbols 1s of a number reverse in an even or odd number to that of the substitutive modulation code.

57. A digital demodulating method comprising:

a first step of performing a demodulating operation reverse to a modulating operation to demodulate a modulation code sequence based on logic symbols of the modulation code sequence, the modulating operation performing (1) a data converting step of converting data codes, in sequence, into digital modulation codes using a given modulation table, (2) a connection code insertion step of inserting a p-bit connection code between two consecutive code blocks of said digital modulation codes to form the modulation code sequence, (3) a bit pattern converting step of converting a bit pattern of a portion of said modulation code sequence into a given bit pattern so as to meet given conditions of a minimum transition interval, a maximum transition interval, and a DSV (Digital Sum Value), and (4) a substitutive modulation code providing step of providing as said given bit pattern one of bit patterns unused in said given modulation table;

a second step of converting the digital modulation codes of the modulation code sequence each consisting of 14 bits into the data code consisting of 8 bits using a first inverse modulation table; and a third step of converting the substitutive modulation code into an original bit pattern using a second inverse modulation table.

58. A digital demodulating apparatus comprising:

first means for performing a demodulating operation reverse to a modulating operation to demodulate a modulation code sequence based on logic symbols of the modulation code sequence, the modulating operation performing (1) a data converting step of converting data codes, in sequence, into digital modulation codes using a given modulation table, (2) a connection code insertion step of inserting a p-bit connection code between two consecutive code blocks of said digital modulation codes to form the modulation code sequence, (3) a bit pattern converting step of converting a bit pattern of a portion of said modulation code sequence into a given bit pattern so as to meet given conditions of a minimum transition interval, a maximum transition interval, and a DSV (Digital Sum Value), and (4) a substitutive modulation code providing step of providing as said given bit pattern one of bit patterns unused in said given modulation table;

second means for converting the digital modulation codes of the modulation code sequence each consisting of 14 bits into the data code consisting of 8 bits using a first inverse modulation table; and third means for converting the substitutive modulation code into an original bit pattern using a second inverse modulation table.

* * * * *